United States Patent
Donlan et al.

US010089176B1

(10) Patent No.: US 10,089,176 B1
(45) Date of Patent: Oct. 2, 2018

(54) INCREMENTAL UPDATES OF GRID ENCODED DATA STORAGE SYSTEMS

(71) Applicant: Amazon Technologies, Inc., Seattle, WA (US)

(72) Inventors: Bryan James Donlan, Seattle, WA (US); Paul David Franklin, Seattle, WA (US); James Caleb Kirschner, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/789,810

(22) Filed: Jul. 1, 2015

(51) Int. Cl.
*G11C 29/00* (2006.01)
*G06F 11/10* (2006.01)
*H04L 29/08* (2006.01)

(52) U.S. Cl.
CPC ...... *G06F 11/1076* (2013.01); *H04L 67/1095* (2013.01); *H04L 67/1097* (2013.01)

(58) Field of Classification Search
CPC . G06F 17/30073; G06F 11/1446; H04L 67/10
See application file for complete search history.

(56) References Cited

U.S. PATENT DOCUMENTS

| | | | |
|---|---|---|---|
| 5,729,671 A | 3/1998 | Peterson et al. |
| 6,249,836 B1 | 6/2001 | Downs et al. |
| 6,779,150 B1 | 8/2004 | Walton et al. |
| 6,862,362 B2 | 3/2005 | Gangadhar |
| 7,117,294 B1 | 10/2006 | Mi et al. |
| 7,142,150 B2 | 11/2006 | Thackray |
| 7,380,129 B2 | 5/2008 | Keohane et al. |
| 7,490,013 B2 | 2/2009 | Wells |
| 7,693,813 B1 | 4/2010 | Cao et al. |
| 7,783,600 B1 | 8/2010 | Spertus et al. |
| 7,805,706 B1 | 9/2010 | Ly et al. |
| 7,930,611 B2 | 4/2011 | Huang et al. |
| 8,261,033 B1 | 9/2012 | Slik et al. |
| 8,386,841 B1 | 2/2013 | Renade |
| 8,413,187 B1 | 4/2013 | Del Sesto et al. |
| 8,479,078 B2 | 7/2013 | Resch et al. |
| 8,504,518 B1 | 8/2013 | Ghemawat et al. |
| 8,612,219 B2 | 12/2013 | Tsuchinaga et al. |

(Continued)

FOREIGN PATENT DOCUMENTS

WO 2014047073 A1 3/2014

OTHER PUBLICATIONS

Lazier, C.L., "Adaptive Data Loss Mitigation for Redundancy Coding Systems," U.S. Appl. No. 14/741,409, filed Jun. 16, 2015.

(Continued)

*Primary Examiner* — Guy Lamarre
(74) *Attorney, Agent, or Firm* — Davis Wright Tremaine LLP

(57) ABSTRACT

Techniques for incrementally updating grid encoding data storage systems are described herein. A grid of shards with a plurality of virtual shards is created where each virtual shard is a representation of a shard in the grid of shards that is not backed by a data storage device and where each shard of the grid of shards has an index value. Data is then stored in the grid of shards by updating a shard to store the data and by also updating a second shard based on a set of shards with the same index value as the shard updated to store the data.

20 Claims, 47 Drawing Sheets

(56) References Cited

U.S. PATENT DOCUMENTS

| | | |
|---|---|---|
| 8,621,069 B1 | 12/2013 | Tompkins |
| 8,706,980 B2 | 4/2014 | Dhuse et al. |
| 8,769,049 B2 | 7/2014 | Murphy et al. |
| 8,788,855 B2 | 7/2014 | Cong et al. |
| 8,806,296 B1 | 8/2014 | Lazier |
| 8,850,288 B1 | 9/2014 | Lazier et al. |
| 8,868,825 B1 | 10/2014 | Hayes et al. |
| 8,869,001 B1 | 10/2014 | Lazier |
| 8,935,221 B1 | 1/2015 | Lazier et al. |
| 8,935,761 B2 | 1/2015 | Gladwin et al. |
| 8,938,591 B2 | 1/2015 | Mark et al. |
| 8,959,067 B1 | 2/2015 | Patiejunas et al. |
| 8,984,363 B1 | 3/2015 | Juels et al. |
| 8,984,384 B1 | 3/2015 | Juels et al. |
| 9,002,805 B1 | 4/2015 | Barber et al. |
| 9,003,144 B1 | 4/2015 | Hayes et al. |
| 9,009,491 B2 | 4/2015 | Resch |
| 9,021,297 B1 | 4/2015 | Hayes et al. |
| 9,047,214 B1 | 6/2015 | Northcott |
| 9,052,942 B1 | 6/2015 | Barber et al. |
| 9,092,441 B1 | 7/2015 | Patiejunas et al. |
| 9,110,797 B1 | 8/2015 | Lazier |
| 9,165,002 B1 | 10/2015 | Lazier |
| 9,208,018 B1 | 12/2015 | Northcott et al. |
| 9,213,485 B1 | 12/2015 | Hayes et al. |
| 9,213,709 B2 | 12/2015 | Patiejunas et al. |
| 9,218,244 B1 | 12/2015 | Hayes et al. |
| 9,223,789 B1 | 12/2015 | Seigle et al. |
| 9,225,675 B2 | 12/2015 | Patiejunas et al. |
| 9,244,761 B2 | 1/2016 | Yekhanin et al. |
| 9,250,811 B1 | 2/2016 | Patiejunas |
| 9,251,097 B1 | 2/2016 | Kumar et al. |
| 9,256,761 B1 | 2/2016 | Sahu et al. |
| 9,271,052 B2 | 2/2016 | Holden |
| 9,281,845 B1 | 3/2016 | Lazier |
| 9,298,760 B1 | 3/2016 | Li et al. |
| 9,354,683 B2 | 5/2016 | Patiejunas et al. |
| 9,378,084 B2 | 6/2016 | Calder et al. |
| 9,405,333 B1 | 8/2016 | Pine |
| 9,448,614 B2 | 9/2016 | Slik |
| 9,459,959 B1 | 10/2016 | Franklin et al. |
| 9,495,249 B1 | 11/2016 | Franklin et al. |
| 9,495,255 B2 | 11/2016 | Davis et al. |
| 9,513,820 B1 | 12/2016 | Shalev |
| 9,563,681 B1 | 2/2017 | Patiejunas et al. |
| 9,753,669 B2 | 9/2017 | Ben-Shaul et al. |
| 9,785,495 B1 | 10/2017 | Lazier et al. |
| 9,792,179 B1 | 10/2017 | Lazier |
| 9,825,625 B2 | 11/2017 | Thalheim |
| 9,825,652 B1 | 11/2017 | Lazier |
| 9,838,041 B1 | 12/2017 | Lazier |
| 9,838,042 B1 | 12/2017 | Lazier |
| 9,853,662 B1 | 12/2017 | Lazier et al. |
| 9,866,242 B1 | 1/2018 | Lazier |
| 9,904,589 B1 | 2/2018 | Donlan et al. |
| 9,923,966 B1 | 3/2018 | Franklin et al. |
| 2003/0172325 A1 | 9/2003 | Wyatt et al. |
| 2004/0040025 A1 | 2/2004 | Lehtinen |
| 2004/0054997 A1 | 3/2004 | Katragadda et al. |
| 2004/0128470 A1 | 7/2004 | Hetzler et al. |
| 2004/0230764 A1 | 11/2004 | Merchant et al. |
| 2004/0268037 A1 | 12/2004 | Buchanan et al. |
| 2006/0004675 A1 | 1/2006 | Bennett et al. |
| 2006/0080574 A1 | 4/2006 | Saito et al. |
| 2006/0136928 A1 | 6/2006 | Crawford et al. |
| 2006/0168575 A1 | 7/2006 | Bhatt et al. |
| 2006/0168581 A1 | 7/2006 | Goger et al. |
| 2007/0118657 A1 | 5/2007 | Kreitzer et al. |
| 2007/0124020 A1 | 5/2007 | Staples |
| 2007/0156842 A1 | 7/2007 | Vermeulen et al. |
| 2007/0180294 A1 | 8/2007 | Kameyama et al. |
| 2007/0245331 A1 | 10/2007 | Daynes et al. |
| 2009/0094250 A1 | 4/2009 | Dhuse et al. |
| 2009/0319078 A1 | 12/2009 | Jackson |
| 2010/0131792 A1 | 5/2010 | Herrod |
| 2010/0138764 A1 | 6/2010 | Hatambeiki et al. |
| 2010/0153941 A1 | 6/2010 | Borissov et al. |
| 2010/0306267 A1 | 12/2010 | Zamkoff et al. |
| 2010/0318999 A1 | 12/2010 | Zhao et al. |
| 2010/0332751 A1 | 12/2010 | Quigley et al. |
| 2011/0022633 A1 | 1/2011 | Bernosky et al. |
| 2011/0055661 A1 | 3/2011 | Grube et al. |
| 2011/0078277 A1 | 3/2011 | Baptist |
| 2011/0202929 A1* | 8/2011 | Schleimer ......... G06F 17/30474 |
| | | 718/106 |
| 2011/0225209 A1 | 9/2011 | Volvovski et al. |
| 2011/0264717 A1 | 10/2011 | Grube et al. |
| 2011/0289263 A1 | 11/2011 | McWilliams et al. |
| 2011/0296195 A1 | 12/2011 | Nakagawa et al. |
| 2011/0296440 A1 | 12/2011 | Laurich et al. |
| 2012/0011398 A1 | 1/2012 | Eckhardt et al. |
| 2012/0017096 A1 | 1/2012 | Snider |
| 2012/0079189 A1 | 3/2012 | Colgrove et al. |
| 2012/0079190 A1 | 3/2012 | Colgrove et al. |
| 2012/0110150 A1* | 5/2012 | Kosuru ................. H04L 41/082 |
| | | 709/221 |
| 2012/0185437 A1 | 7/2012 | Pavlov et al. |
| 2012/0243687 A1 | 9/2012 | Li et al. |
| 2012/0254089 A1 | 10/2012 | Alba et al. |
| 2012/0254175 A1 | 10/2012 | Horowitz et al. |
| 2012/0254690 A1 | 10/2012 | Resch et al. |
| 2012/0331088 A1 | 12/2012 | O'Hare et al. |
| 2013/0007511 A1 | 1/2013 | Gaertner et al. |
| 2013/0029641 A1 | 1/2013 | Hickie |
| 2013/0073600 A1 | 3/2013 | Jenkins et al. |
| 2013/0109371 A1 | 5/2013 | Brogan et al. |
| 2013/0191527 A1 | 7/2013 | Ashok et al. |
| 2013/0238932 A1 | 9/2013 | Resch |
| 2013/0297964 A1 | 11/2013 | Hegdal et al. |
| 2013/0326583 A1 | 12/2013 | Freihold et al. |
| 2014/0006458 A1* | 1/2014 | Hsieh ................. G06F 17/30292 |
| | | 707/803 |
| 2014/0007214 A1 | 1/2014 | Qureshi et al. |
| 2014/0046906 A1 | 2/2014 | Patiejunas et al. |
| 2014/0046908 A1 | 2/2014 | Patiejunas et al. |
| 2014/0046909 A1 | 2/2014 | Patiejunas et al. |
| 2014/0047040 A1 | 2/2014 | Patiejunas et al. |
| 2014/0047261 A1 | 2/2014 | Patiejunas et al. |
| 2014/0108421 A1* | 4/2014 | Isaacson ........... G06F 17/30575 |
| | | 707/747 |
| 2014/0122572 A1* | 5/2014 | Finkelstein .......... H04L 67/1014 |
| | | 709/203 |
| 2014/0149794 A1* | 5/2014 | Shetty ................. H04L 67/1095 |
| | | 714/20 |
| 2014/0149986 A1 | 5/2014 | S M et al. |
| 2014/0153481 A1 | 6/2014 | Draznin et al. |
| 2014/0156632 A1 | 6/2014 | Yu et al. |
| 2014/0189388 A1 | 7/2014 | Lynar et al. |
| 2014/0201541 A1 | 7/2014 | Paul et al. |
| 2014/0304356 A1 | 10/2014 | Allen, Sr. et al. |
| 2014/0310571 A1 | 10/2014 | Fetterly et al. |
| 2014/0344446 A1 | 11/2014 | Rjeili et al. |
| 2014/0351632 A1 | 11/2014 | Grube et al. |
| 2014/0372383 A1 | 12/2014 | Sipek |
| 2014/0380126 A1 | 12/2014 | Yekhanin et al. |
| 2015/0149870 A1 | 5/2015 | Kozat |
| 2015/0169716 A1 | 6/2015 | Franklin et al. |
| 2015/0278324 A1 | 10/2015 | Wong et al. |
| 2015/0324745 A1 | 11/2015 | Goodall et al. |
| 2015/0331635 A1 | 11/2015 | Ben-Shaul et al. |
| 2015/0355974 A1 | 12/2015 | Hayes et al. |
| 2015/0356005 A1 | 12/2015 | Hayes et al. |
| 2016/0011816 A1 | 1/2016 | Aizman |
| 2016/0034295 A1 | 2/2016 | Cochran |
| 2016/0041868 A1 | 2/2016 | Davis et al. |
| 2016/0041869 A1 | 2/2016 | Davis et al. |
| 2016/0041878 A1 | 2/2016 | Davis et al. |
| 2016/0041887 A1 | 2/2016 | Davis et al. |
| 2016/0048399 A1 | 2/2016 | Shaw |
| 2016/0062623 A1 | 3/2016 | Howard et al. |
| 2016/0085797 A1 | 3/2016 | Patiejunas et al. |
| 2016/0092248 A1 | 3/2016 | Shani et al. |
| 2016/0179824 A1 | 6/2016 | Donlan et al. |
| 2016/0216991 A1 | 7/2016 | Ansari et al. |

(56) References Cited

U.S. PATENT DOCUMENTS

| | | |
|---|---|---|
| 2016/0335310 A1 | 11/2016 | Lahiri et al. |
| 2017/0024281 A1 | 1/2017 | Franklin et al. |
| 2017/0060687 A1 | 3/2017 | Franklin et al. |
| 2017/0222814 A1 | 8/2017 | Oberhauser et al. |
| 2017/0250801 A1 | 8/2017 | Chen et al. |
| 2017/0331896 A1 | 11/2017 | Holloway et al. |

OTHER PUBLICATIONS

Amazon, "Batch Cloud Data Transfer Services—Amazon Import/Export Snowball Appliance," Jun. 17, 2016, retrieved Oct. 8, 2016, https://web.archive.org/web/20160617044144/http://aws.amazon.com/importexport/, 6 pages.

Barr, "AWS Import/Export: Ship Us That Disk!," Amazon Web Services Blog, May 21, 2009, retrieved Mar. 14, 2017, https://aws.amazon.com/blogs/aws/send-us-that-data/, 7 pages.

Dang, "Recommendation for Applications Using Approved Hash Algorithms," National Institute of Standards and Technology (NIST) Special Publication 800-107 Revision 1, Aug. 2010, retrieved Nov. 24, 2015, http://csrc.nist.gov/publications/nistpubs/800-107-rev1/sp800-107-rev1.pdf, 25 pages.

International Search Report and Written Opinion dated Aug. 25, 2016, International Patent Application No. PCT/US2016/040510, filed Jun. 30, 2016.

Storer et al., "POTSHARDS—A Secure, Recoverable, Long-Term Archival Storage System," ACM Transactions on Storage, Published Jun. 2009, vol. 5, No. 2, Article 5, pp. 5:1 to 5:35.

Zyga, "Light-up Cereal Boxes Powered by Shelvers on Display at CES," Phys.org, Jan. 11, 2011, retrieved May 19, 2015, http://phys.org/news/201101lightupoerealpoweredshelvesces.html, 13 pages.

U.S. Appl. No. 14/789,778, filed Jul. 1, 2015.
U.S. Appl. No. 14/789,783, filed Jul. 1, 2015.
U.S. Appl. No. 14/789,789, filed Jul. 1, 2015.
U.S. Appl. No. 14/789,799, filed Jul. 1, 2015.
U.S. Appl. No. 14/741,409, filed Jun. 16, 2015.
U.S. Appl. No. 14/789,815, filed Jul. 1, 2015.
U.S. Appl. No. 14/789,825, filed Jul. 1, 2015.
U.S. Appl. No. 14/860,706, filed Sep. 21, 2015.
U.S. Appl. No. 14/789,837, filed Jul. 1, 2015.
U.S. Appl. No. 14/973,712, filed Dec. 17, 2015.
U.S. Appl. No. 14/973,716, filed Dec. 17, 2015.
U.S. Appl. No. 14/973,708, filed Dec. 17, 2015.

"New! xTablet T7000 Rugged Mini Tablet PC," MobileDemand, copyright 2012 [web archive Mar. 12, 2012], https://web.archive.org/web/20120312010139/http://www.ruggedtabletpc.com/products/xtablet-t7000-rugged-mini-tablet-pc/, 3 pages.

Binns, "Elasticsearch Failure and Recovery," TechRabbit, Oct. 31, 2014 [retrieved Nov. 17, 2017], http://tech.taskrabbit.com/blog/2014/10/31/es-failure-recovery/, four pages.

Franco, "Understanding Bitcoin: Cryptography, Engineering and Economics," Wiley, Nov. 24, 2014, 167 pages.

He et al., "Elastic Application Container: A Lightweight Approach for Cloud Resource Provisioning," 26th IEEE International Conference on Advanced Information Networking and Applications, Mar. 26, 2012, pp. 15-22.

International Organization for Standardization/International Electrotechnical Commission, "Information technology—Trusted Platform Module—Part 1: Overview," International Standard, ISO/IEC 11889-1(E), May 15, 2009, 20 pages.

International Organization for Standardization/International Electrotechnical Commission, "Information technology—Trusted Platform Module—Part 2: Design principles," International Standard, ISO/IEC 11889-2(E), May 15, 2009, 152 pages.

International Organization for Standardization/International Electrotechnical Commission, "Information technology—Trusted Platform Module—Part 3: Structures," International Standard, ISO/IEC 11889-3:2009(E), 204 pages.

International Organization for Standardization/International Electrotechnical Commission, "Information technology—Trusted Platform Module—Part 4: Commands," International Standard, ISO/IEC 11889-4:2009(E), 254 pages.

International Search Report and Written Opinion in International Patent Application No. PCT/US2015/050513, dated Feb. 16, 2016, 22 pages.

International Search Report and Written Opinion dated Feb. 4, 2016, International Patent Application No. PCT/US2015/059983, 12 pages.

International Search Report and Written Opinion dated Nov. 22, 2017, International Patent Application No. PCT/US2017/054319, filed Sep. 29, 2017, 14 pages.

Kim, "How Sharding Works," Medium, Dec. 5, 2014 [retrieved Nov. 17, 2017], https://medium.com/@jeeyoungk/how-sharding-works-b4dec46b3f6, 12 pages.

Maccarthaigh, "Shuffle Sharding: Massive and Magical Fault Isolation," AWS Architecture Blog, Apr. 14, 2014 [retrieved Nov. 27, 2017], https://aws.amazon.com/blogs/architecture/shuffle-sharding-massive-and-magical-fault-isolation/, six pages.

Pikkarainen et al., "The impact of agile practices on communication in software development," Empirical Software Engineering 13(3):303-37, Jun. 1, 2008.

Ramamritham, "Allocation and scheduling of precedence-related periodic tasks," IEEE Transactions on Parallel and Distributed Systems 6(4):412-420, Apr. 1995.

Soltesz et al., "Container-based operating system virtualization: a scalable, high-performance alternative to hypervisors," ACM SIGOPS Operating Systems Review 41(3):275-287, Mar. 2007.

Swan, "Blockchain: Blueprint for a New Economy," O'Reilly Media, Inc., Jan. 22, 2015, 144 pages.

Thiele et al., "Embedded Software in Network Processors—Models and Algorithms," Lecture Notes in Computer Science 2211:416-34, Oct. 8, 2001.

Trusted Computing Group, "TPM Main, Part 1 Design Principles," Specification Version 1.2, Level 2 Revision 103, Jul. 9, 2007, 182 pages.

Trusted Computing Group, "TPM Main, Part 1 Design Principles," Specification Version 1.2, Revision 116, Mar. 1, 2011, 184 pages.

Trusted Computing Group, "TPM Main, Part 2 TPM Structures," Specification Version 1.2, Level 2 Revision 103, Jul. 9, 2007, 198 pages.

Trusted Computing Group, "TPM Main, Part 2 TPM Structures," Specification Version 1.2, Revision 116, Mar. 1, 2011, 201 pages.

Trusted Computing Group, "TPM Main, Part 3 Commands," Specification Version 1.2, Level 2 Revision 103, Jul. 9, 2007, 330 pages.

Trusted Computing Group, "TPM Main, Part 3 Commands," Specification Version 1.2, Revision 116, Mar. 1, 2011, 339 pages.

Van et al., "SLA-aware Virtual Resource Management for Cloud Infrastructures," IEEE Ninth International Conference on Computer and Information Technology, Oct. 11, 2009, pp. 357-362.

Wikipedia, "IEEE 802.11," Wikipedia, the Free Encyclopedia, page last modified Feb. 7, 2017, retrieved Feb. 13, 2017, https://en.wikipedia.org/wiki/IEEE_802.11, 9 pages.

Wikipedia, "IEEE 802.16," Wikipedia, the Free Encyclopedia, page last modified Nov. 21, 2016, retrieved Feb. 13, 2017, https://en.wikipedia.org/wiki/IEEE_802.16, 8 pages.

Wikipedia, "IEEE 802.21," Wikipedia, the Free Encyclopedia, page last modified Aug. 4, 2016, retrieved Feb. 13, 2017, https://en.wikipedia.org/wiki/IEEE_802.21, 3 pages.

Xavier et al., "Performance evaluation of container-based virtualization for high performance computing environments," Parallel, Distributed and Network-Based Processing (PDP), 2013 21st Euromicro International Conference, Feb. 2013, pp. 233-240.

Zhao et al., "Experimental study of virtual machine migration in support of reservation of cluster resources," Proceedings of the 2nd international workshop on Virtualization technology in distributed computing, Nov. 2007, pp. 1-8.

Zheng et al., "Grid-partition index: a hybrid method for nearest-neighbor queries in wireless location-based services," The VLDB Journal—The International Journal on Very Large Data Bases 15(1):21-39, online publication Jul. 22, 2005, print publication Jan. 1, 2006.

(56) References Cited

OTHER PUBLICATIONS

Third-Party Submission Under 37 CFR 1.290 dated Apr. 24, 2018, U.S. Appl. No. 15/283,017, filed Sep. 30, 2016, 10 pages.

* cited by examiner

FIG. 31

INCREMENTAL UPDATES OF GRID ENCODED DATA STORAGE SYSTEMS

CROSS-REFERENCE TO RELATED APPLICATIONS

This application incorporates by reference for all purposes the full disclosure of U.S. patent application Ser. No. 14/789,778, filed concurrently herewith, entitled "INCREMENTAL MEDIA SIZE EXTENSION FOR GRID ENCODED DATA STORAGE SYSTEMS," U.S. patent application Ser. No. 14/789,783, filed concurrently herewith, entitled "GRID ENCODED DATA STORAGE SYSTEMS FOR EFFICIENT DATA REPAIR," U.S. patent application Ser. No. 14/789,789, filed concurrently herewith, entitled "CROSS-DATACENTER EXTENSION OF GRID ENCODED DATA STORAGE SYSTEMS," U.S. patent application Ser. No. 14/789,799, filed concurrently herewith, entitled "CROSS-DATACENTER VALIDATION OF GRID ENCODED DATA STORAGE SYSTEMS," U.S. patent application Ser. No. 14/789,815, filed concurrently herewith, entitled "NON-PARITY IN GRID ENCODED DATA STORAGE SYSTEMS," U.S. patent application Ser. No. 14/789,825, filed concurrently herewith, entitled "REBUNDLING GRID ENCODED DATA STORAGE SYSTEMS," and U.S. patent application Ser. No. 14/789,837, filed concurrently herewith, entitled "DETERMINING DATA REDUNDANCY IN GRID ENCODED DATA STORAGE SYSTEMS."

BACKGROUND

Modern computer systems make extensive use of network computing and network data storage systems. Such use has proliferated in recent years, particularly in distributed or virtualized computer systems where multiple computer systems may share the performance of the tasks associated with the computer system. Such computer systems frequently utilize distributed data storage in multiple locations to store shared data items so that such data items may be made available to a plurality of consumers. The resources for network computing and network data storage are often provided by computing resource providers who leverage large-scale networks of computers, servers and storage drives to enable customers to host and execute a variety of applications and web services. The usage of network computing and network data storage allows customers to efficiently and to adaptively satisfy their varying computing needs, whereby the computing and data storage resources that may be required by the customers are added or removed from a large pool provided by a computing resource provider as needed.

The proliferation of network computing and network data storage, as well as the attendant increase in the number of entities dependent on network computing and network data storage, has increased the importance of balancing both data availability and data integrity on such network computing and network data storage systems. For example, data archival systems and services may use various types of error correcting and error tolerance schemes to ensure data integrity and the expense of data availability leading to a degraded customer experience due to delays in retrieving the data from the data archive.

BRIEF DESCRIPTION OF THE DRAWINGS

Various embodiments in accordance with the present disclosure will be described with reference to the drawings, in which:

FIG. 31 illustrates an example diagram where operations are illustrated that are used to validate shards in a grid encoded data storage system in accordance with an embodiment;

DETAILED DESCRIPTION

Figure 1:
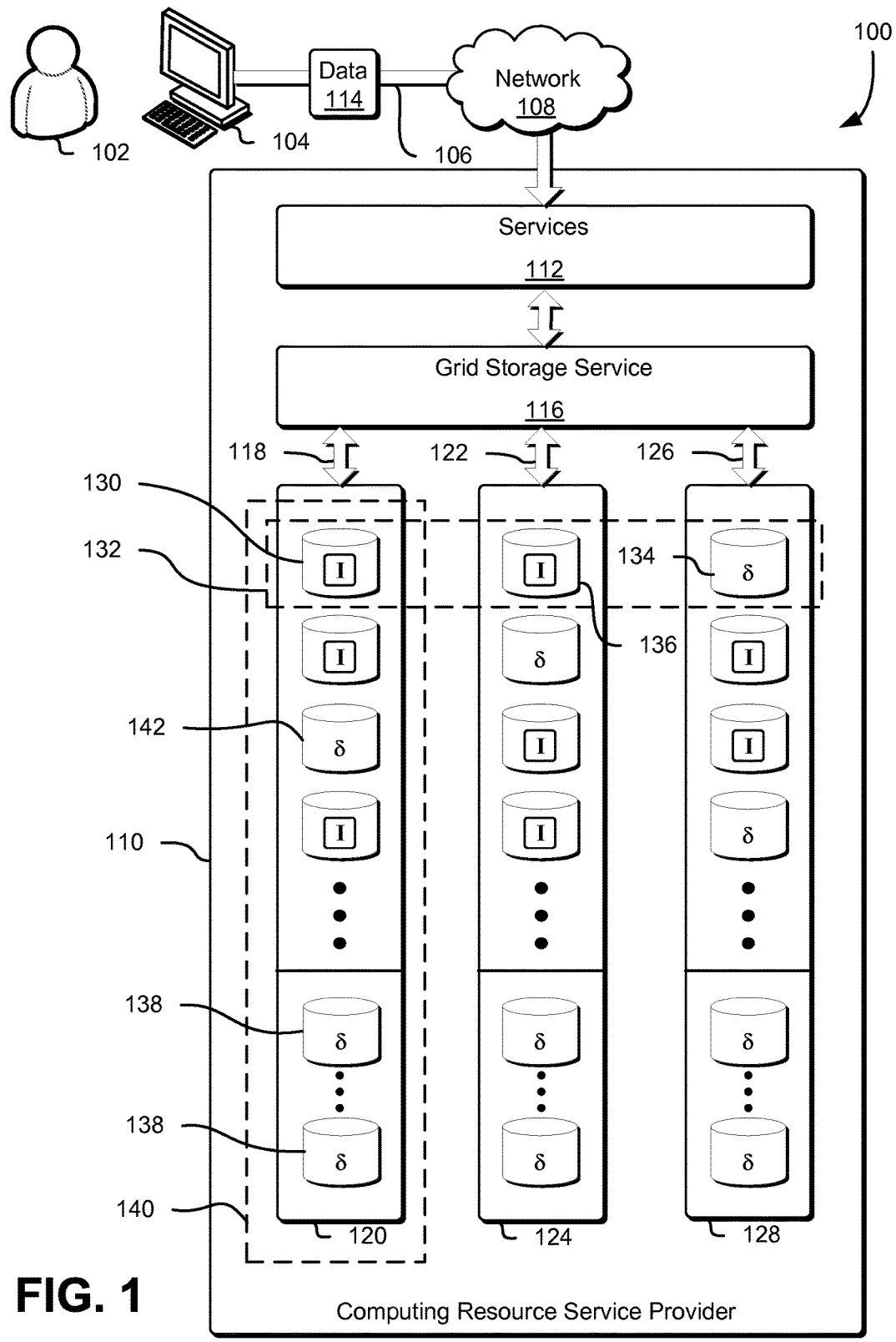
FIG. 1 illustrates an example environment where a grid encoded data storage system may be used to store data in accordance with an embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include methods, systems, and processes for storing original data of data archives on data storage systems using grid encoding techniques. Grid encoding techniques may be applied to data archives of a computing resource service provider by implementing the storage techniques described herein to increase, for example, availability, redundancy, and durability while minimizing the number of extra storage volume required. In many grid encoding techniques, the stretch factor (i.e., the number of storage volumes required store a volume's worth of data) can approach theoretical minimums as is detailed further herein. Application of such grid encoding techniques allows the storage of original data of the individual archives and redundant storage in other archives, while providing ways to recover from extensive loss of many storage devices and even the recovery of data after the loss of entire data storage facilities.

Data items, which may also be referred to herein as "data archives," "data objects," or more simply as "data," may be received from customers of a computing resource service provider for storage using a grid storage service. Data archives may be received from an archival storage service. Data archives may also be received from other services provided by the computing resource service provider including, but not limited to, redundant storage services, block storage services, virtual machine services, or other such services.

Using a grid encoding technique, data items stored within the grid may be grouped into a collection of shards where each shard represents a logical distribution of the data items stored in the grid. A shard, as used herein, is a logical representation of a set of data stored in the grid and while, in some embodiments, a grid of shards is a partitioning of the data stored in the grid (i.e., each shard is a disjoint set of data items), in other embodiments, shards contain data items that are also stored in other shards. Shards may have an associated set data and/or metadata associated with the shard and/or the grid (e.g., the row and column index of the shard within the grid). Unless otherwise stated or made clear from context, the data items that are represented by the shard and stored in the grid are referred to herein as "shard data" and the data and/or metadata associated with the shard and/or the grid are referred to herein as "shard metadata."

Each shard may have an associated data storage device and/or an associated data storage volume. A collection of shards may include one or more data shards (e.g., shards associated with data in the data archives), one or more derived shards (e.g., shards associated with grid encoded data associated with the data in the data archives), and/or one more null shards (e.g., shards that are empty and/or are not associated with any data). As used herein, the term "shard" may be used to refer to the data storage abstraction of a shard (i.e., the logical storage device), the associated data storage device of the shard (i.e., the physical storage device), and/or the associated data storage volume of the shard. The shards may be stored using a collection of data storage devices including, but not limited to, tape drives, tapes, disk drives (including both solid state drives and spinning drives), removable media, computer memory, flash drives, various magnetic media, and/or other such storage devices. Each data archive may be stored on one or more data storage devices of the collection of data storage devices, including both homogenous and heterogeneous collections of data storage devices such as, for example, sets of tape drives, sets of disk drives, or sets containing both tape drives and disk drives.

A grid of shards may include a plurality of data shards and one or more derived shards. A grid of shards may also include only derived shards, provided those derived shards are consistent with the redundancy encoding scheme of the grid of shards. The derived shards may include a set of corresponding derived shards for each dimension of the grid. For example, in a two-dimensional grid of shards, the corresponding derived shards may include one or more horizontally-derived shards, and one or more vertically-derived shards. In a grid of shards, the quantity of derived shards is at least equal to a minimum number of shards required to implement a grid encoding scheme associated with the collection of shards in each dimension. In a first example, a collection of shards may contain two data shards containing data and one derived shard as required to implement parity encoding in the horizontal dimension and may also include three "rows" with a fourth row of vertically-derived shards as required to implement a parity encoding in the vertical dimension. Such a grid would include six data shards (two in each of the first three rows), three horizontally-derived shards (one in each of the first three rows), and three-vertically-derived shards (in the fourth row). As used herein, a derived shard required in association with a parity encoding, which may be referred to as a parity shard, may be configured to store the "exclusive or" (denoted "XOR" or "s") of the data stored in the other (e.g., data and/or derived) shards.

In an illustrative example, a first simple sixteen-bit data shard may contain "0010 1011 0110 1011" and a second simple sixteen-bit data shard may contain "0100 1101 0100 1011." The XOR of these two simple sixteen-bit data shards is "0110 0110 0010 0000" and this XOR value (e.g., the value obtained from XORing the two simple sixteen-bit data shards) may then be stored in a parity shard. As described herein, a parity encoding is a linear redundancy encoding scheme based on XOR operations. With two data shards and a parity shard, one of the three values may be lost, and the lost value can be reconstructed from the XOR of the remaining two values. For example, if the first data shard is designated "A," the second data shard is designated "B," and the parity shard is designated "C," then A⊕B=C, A⊕C=B, and B⊕C=A (i.e., any of the shards can be reconstructed from the other two). Storing the "exclusive or" of the data shards ensures that even parity is maintained over the three shards because, if A⊕B=C, then A⊕B⊕C=0. Single parity shards may also be used with larger quantities of data shards to the same effect, allowing the reconstruction of any single lost data value. An additional property of a shard is that a portion of a shard can be reconstructed from corresponding portions of the other shard. In the illustrative example above, each of the four-bit groups of data in the sixteen bit parity shard may be interpreted as a four-bit parity shard for the corresponding four-bit values in data shard "A" and data shard "B."

Similar redundancy encoding techniques may be used in other dimensions of the grid or, in some embodiments, more complex redundancy encoding techniques are used. In a more complex example, four data shards may be combined with two corresponding derived shards (for a total of six shards in the collection of shards) to allow the reconstruction of up to two lost shards (also referred to herein as "damaged shards") where the lost shards may be data shards, they may be derived shards, or they may be one of each. Reconstruction of shards in such an example may require redundancy codes such as, for example, an online code, a Luby transform code, a Reed-Solomon code, a Cauchy Reed-Solomon code, a regenerating code, a maximum distance separable code, a repetition code, a cyclic code, a Hamming code, a Reed-Muller code, a Goppa code, a BCH code, a Golay code, an expander code, a linear block code, a linear erasure code, and/or some other redundancy code.

In some embodiments, the grid is encoded with a linear block code such as those described herein. A linear block code allows vertically-derived shards such as those described herein to be repaired using the horizontal redundancy encoding scheme of the grid. In some embodiments, the grid is encoded with maximum distance separable codes such as those described herein. A maximum distance separable code allows shards to be derived from any sufficiently large subset of the set of shards in the bundle to be used to reproduce any of the other shards. So, for example, in a 6:4 encoding (e.g., four data shards and two derived shards) with a maximum distance separable code, any four of the shards could be used to reproduce a lost and/or damaged shard of the bundle (i.e., either four data shards, three data shards and one derived shard, or two data shards and two derived shards).

A collection of shards may have any arbitrary number of null shards added to the collection of shards without affecting the redundancy code associated with the collection of shards. For example, because a parity encoding is based on the parity of the data shards, and because a null shard (i.e., a shard with all zeros or an empty shard) does not affect that parity, adding a null shard to that set maintains that parity and, inductively, adding an arbitrary number of null shards to the collection of shards also does not affect that parity. The addition of null shards to collections of shards with more complex redundancy codes also does not affect the more complex redundancy code associated with the collection of shards (e.g., Reed-Solomon codes or Cauchy codes) because the application of such codes to additional null shards simply adds null terms to the associated redundancy encoding calculations. This property of a grid holds when, for example, the grid encoding scheme includes one or more linear block codes as described above. Such linear block codes (e.g., parity, Reed-Solomon) may express the encoding operation as a matrix multiplication of the vector of inputs (e.g., the shards in the grid) with a linear encoding matrix (also referred to herein as a "generator matrix").

Each shard of a collection of shards may also be padded with any arbitrary corresponding number of zero values (i.e., the arbitrary number of zero values corresponding to each shard) without affecting the redundancy encoding associated with the collection of shards when a linear block code is used. It should be noted that when a linear block code is used to do erasure encoding in a grid, the input data stream (i.e., the data objects) is parsed into a stream of symbols (also referred to herein as "slicing"). Symbols at the same offset are then grouped together and the grouped symbols are encoded (using, for example, the linear block code) into a set of output code words. The code can then be made systematic by fixing some set of the code words, decoding them to obtain the input symbols, and then deriving the remaining code words. In some embodiments, the vertical and horizontal linear erasure codes used for a grid encoding scheme must be linear in the same field (as described below) to support such encoding and decoding.

Linear block coding allows appending zeros because such appending is equivalent to fixing a set of code words to be zero, decoding those zero code words to also be a set of zero symbols, and encoding again to obtain a set of zero code words for the remaining code word positions. The padding of a shard with an amount of data (e.g., zero values) may be illustrated using the previously described example of a first simple sixteen-bit data shard that contains "0010 1011 0110 1011" and a second simple sixteen-bit data shard that contains "0100 1101 0100 1011." The XOR of these two simple sixteen-bit data shards is "0110 0110 0010 0000" as described above. Padding each of the shards with "0000 0000" does not change the redundancy encoding calculation since "0010 1011 0110 1011 0000 0000"⊕"0100 1101 0100 1011 0000 0000" is "0110 0110 0010 0000 0000 0000" (i.e., the result is similarly padded with "0000 0000"). Other properties associated with padding shards with an arbitrary number of zero (or "null") values are described below.

FIG. 1 illustrates an example environment 100 where a grid encoded data storage system may be used to store data in accordance with an embodiment. A user 102 may connect 106 to one or more services 112 through a computer system client device 104. The services 112 may be provided by a computing resource service provider 110. In some embodiments, the computing resource service provider 110 may provide a distributed, virtualized, and/or datacenter environment within which one or more applications, processes, services, virtual machines, and/or other such computer system entities may be executed. In some embodiments, the user 102 may be a person, or may be a process running on one or more remote computer systems, or may be some other computer system entity, user, or process.

The command or commands to connect to the computer system instance may originate from an outside computer system and/or server, or may originate from an entity, user or process on a remote network location, or may originate from an entity, user or process within the computing resource service provider, or may originate from a user of the computer system client device 104, or may originate as a result of an automatic process, or may originate as a result of a combination of these and/or other such origin entities. In some embodiments, the command or commands to initiate the connection 106 to the computing resource service provider 110 may be sent to the services 112, without the intervention of the user 102. The command or commands to initiate the connection 106 to the services 112 may originate from the same origin as the command or commands to connect to the computing resource service provider 110, or may originate from another computer system and/or server, or may originate from a different entity, user, or process on the same or a different remote network location, or may originate from a different entity, user, or process within the computing resource service provider, or may originate from a different user of a computer system client device 104, or may originate as a result of a combination of these and/or other such same and/or different entities.

The user 102 may request connection to the computing resource service provider 110 via one or more connections 106 and, in some embodiments, via one or more networks 108 and/or entities associated therewith, such as servers connected to the network, either directly or indirectly. The computer system client device 104 that may request access to the services 112 may include any device that is capable of connecting with a computer system via a network, including at least servers, laptops, mobile devices such as smartphones or tablets, other smart devices such as smart watches, smart televisions, set-top boxes, video game consoles and other such network-enabled smart devices, distributed computer systems and components thereof, abstracted components such as guest computer systems or virtual machines, and/or other types of computing devices and/or components. The network may include, for example, a local network, an internal network, a public network such as the Internet, or other networks such as those listed or described below. The network may also operate in accordance with various protocols such as those listed or described below.

The computing resource service provider 110 may provide access to one or more host machines, as well as provide access to one or more virtual machine (VM) instances as may be operating thereon. The services 112 provided by the computing resource service provider 110 may also be implemented as and/or may utilize one or more VM instances as may be operating on the host machines. For example, the computing resource service provider 110 may provide a variety of services to the user 102 and the user 102 may communicate with the computing resource service provider 110 via an interface such as a web services interface or any other type of interface. While the example environment illustrated in FIG. 1 shows a single connection or interface for the services 112 of the computing resource service provider 110, each of the services may have its own interface and, generally, subsets of the services may have corresponding interfaces in addition to or as an alternative to the single interface.

The computing resource service provider 110 may provide various services 112 to its users or customers. The services provided by the computing resource service provider 110 may include, but may not be limited to, virtual computer system services, block-level data storage services, cryptography services, on-demand data storage services, notification services, authentication services, policy management services, or other services. Not all embodiments described may include all of these services, and additional services may be provided in addition to or as an alternative to the services explicitly described. As described above, each of the services 112 may include one or more web service interfaces that enable the user 102 to submit appropriately configured API requests to the various services through web service requests. In addition, each of the services 112 may include one or more service interfaces that enable the services to access each other (e.g., to enable a virtual machine instance provided by the virtual computer system service to store data in or retrieve data from an on-demand data storage service and/or to access one or more block-level data storage devices provided by a block-level data storage service).

The user 102 and/or the device 104 may provide data 114 to the computing resource service provider 110 using the connection 106 and/or the network 108. The data 114 may be provided to the services 112, which may in turn provide the data 114 to a grid storage service 116 for storage, which may be one of the services provided by the computing resource service provider 110. The services 112 may perform operations to, for example, compress, encode, encrypt, edit, or otherwise alter the data. For example, one of the services 112 may be a virtual computer system service that may first store the data 114 locally during the execution of a virtual computer system instance provided by the virtual computer system service, and then may provide the data (in, for example, an edited or otherwise altered form) to the grid storage service 116. The services 112 may also generate the data 114 directly and/or may generate additional data before providing the data to the grid storage service 116. In some embodiments, the data 114 is provided directly to the grid storage service 116 via the connection 106 and/or the network 108.

The grid storage service 116 may be one of a plurality of data storage services provided by the computing resource service provider 110. The grid storage service 116 may be a service operating within a computer system environment, and running on computing system hardware provided by the computing resource service provider 110. The grid storage service 116 may also be executing on a virtual computing system, may be running as a distributed service on a plurality of computer systems, and/or may be running as multiple instances on a plurality of computer systems and/or in a plurality of geographic locations. In embodiments where the grid storage service operates as a plurality of instances, the grid storage service 116 may be managed by, for example, a service manager configured to manage computing system resources and/or execution. As used herein, unless otherwise stated or clear from context, the term "service" may be understood to be a computer system program, process, client, server, service, application, module, operating system entity, controlling domain, communication node or collection of these and/or other such computer system entities. A "service" may be a client and/or a server and in some embodiments may be configured to send and/or receive communications, data, requests, and/or other such requests from other services within the computer system.

As described above, the grid storage service 116 may instantiate, operate in conjunction with, or be a component of one or more other services provided by the computing resource service provider 110. In a first example of such interaction with other services provided by computing resource service provider 110, the grid storage service may be configured to receive data from a block-level data storage service as a result of determining that the data stored in the block-level data storage should be stored with greater durability or redundancy. As used herein, a block-level data storage service may comprise one or more computing resources that collectively operate to store data for a customer or user such as the user 102, using block-level storage devices, and/or virtualizations thereof. The block-level storage devices of the block-level data storage service may, for instance, be operationally attached to virtual computer systems provided by a virtual computer system service to serve as logical units (e.g., virtual drives) for the computer systems. A block-level storage device may enable the persistent storage of data used/generated by a corresponding virtual computer system where the virtual computer system service may only provide ephemeral data storage. Such data may then be moved from the block-level storage service to the grid storage service 116 for more permanent, redundant, or durable storage using the grid encoding techniques described herein.

In a second example of how a grid storage service 116 may interact with other services provided by computing resource service provider 110, the grid storage service 116 may be configured to receive data from an on-demand data storage service as a result of determining data redundancy, data durability, or data availability is an issue. As used herein, an on-demand data storage service may be a collection of computing resources configured to synchronously process requests to store and/or access data. The on-demand data storage service may operate using computing resources (e.g., databases) that enable the on-demand data storage service to locate and retrieve data quickly, to allow data to be provided in responses to requests for the data. For example, the on-demand data storage service may maintain stored data in a manner such that, when a request for a data object is retrieved, the data object can be provided (or streaming of the data object can be initiated) in a response to the request. As noted, data stored in the on-demand data storage service may be organized into data objects. The on-demand data storage service may store numerous data objects of varying sizes. The on-demand data storage service may operate as a key value store that associates data objects with identifiers of the data objects that may be used by the customer or user such as the user 102 to retrieve or perform other operations in connection with the data objects stored by the on-demand data storage service. Data stored in an on-demand data storage service, as well as the data objects themselves, may be moved from the on-demand data storage service to the grid storage service 116 for more permanent, redundant, or durable storage using the grid encoding techniques described herein.

In a third example of how a grid storage service 116 may interact with other services provided by computing resource service provider 110, the grid storage service 116 may be configured to receive data from an archival data storage service again as a result of determinations regarding data redundancy, data durability, or data availability. As used herein, an archival storage service may comprise a collection of computing resources that collectively operate to provide storage for data archiving and backup of customer data. The data may comprise one or more data files that may be combined to form an archive. The archival storage service may be configured to persistently store data that may be infrequently accessed and for which long retrieval times are acceptable to a customer utilizing the archival storage service. A customer may interact with the archival storage service (for example, through appropriately configured API calls made to the archival storage service) to generate one or more archives, upload and retrieve the one or more archives, or monitor the generation, upload or retrieval of the one or more archives. Data stored in an archival data storage service, as well as the data archives themselves, may be moved from the archival data storage service to the grid storage service 116 for more permanent, redundant, or durable storage using the grid encoding techniques described herein. In an embodiment, an archival storage system is implemented using the grid encoded techniques described herein such that, as data is received in the archival data storage service, the data is grid encoded and stored in a grid of shards.

As used herein, a "shard" is a partition of a data set, where the data set can be partitioned using a redundancy code (also referred to herein as an "erasure code"), associated with a redundancy encoding scheme. The partitioned data set represented by the shards in the grid of shards is the data after the data set has been encoded in the grid of shards rather than the underlying or original data of the data set. Some of the shards may be specific portions of the data set and some of the shards may be generated by applying the redundancy code (or erasure code) to specific portions of the data set.

For example, a redundancy encoding scheme such as "3:2 parity" or "6:4 Reed-Solomon," both of which are described below, has a redundancy code (or erasure code) associated with the redundancy encoding scheme. In the example of "3:2 parity," the redundancy code is a parity code. In the example of "6:4 Reed-Solomon," the redundancy code is a Reed-Solomon code. Using the parity redundancy encoding scheme (also referred to herein as a "parity redundancy code"), a derived shard (e.g., a horizontally-derived shard) may be generated from a plurality of data shards. Together the shards form a partition of the data set where the data shards are the specific portions of the data set and the derived shard is generated by applying the parity code to the data shards. It should be noted that, as used herein, the terms "redundancy code" and "redundancy encoding scheme" may be used interchangeably and, unless explicitly stated or made clear from context, may be understood to refer to the redundancy encoding scheme that includes the redundancy code.

The grid storage service 116 may store data such as the data 114 using grid encoding techniques such as those described herein. In the example illustrated in FIG. 1, the grid storage service 116 stores data such as the data 114 in a plurality of storage devices corresponding to a grid of shards, which is described in more detail below. The plurality of storage devices may include magnetic tape drives and/or the associated magnetic tapes, magnetic disks, optical disks, flash memory, other computer system memory, memory resistors, or other storage devices. The plurality of storage devices may be located in one or more geographical locations such as, for example, one or more datacenters that are located in physically separate locations.

In the example illustrated in FIG. 1, the grid storage service 116 uses a first connection 118 to a first datacenter 120, a second connection 122 to a second datacenter, and a third connection 126 to a third datacenter 128 to store data. Although not illustrated in FIG. 1, the first connection 118, the second connection 122, and/or the third connection 126 may be over a public or private network such as the network 108 described herein.

Data stored in the plurality of storage locations may be redundantly stored using grid encoding techniques such as those described herein. For example, the grid storage service 116 may store data such as the data 114 in a first data storage device 130 in the first datacenter 120. It should be noted that a data storage device such as the first data storage device 130 may also be referred to herein as a "data storage location," a "data shard," a "shard," a "storage location," or a "storage device." When a data storage device is referred to herein as a "data shard" or more simply as a "shard," it may be understood to refer to a data storage device that corresponds to, or is associated with the shard as described below and may also be understood to refer to the data storage location (i.e., the location of the storage device). As an illustrative example of such usage, a data storage device that is, for example, a magnetic tape, which is located in a datacenter (the data storage location), and which is associated with data shard such as those described below, may be referred to simply as a shard or as a data shard. As used herein and in some examples and descriptions, distinctions between devices, shards, and locations will be explicitly stated unless otherwise made clear from context.

When data such as the data 114 is stored by the grid storage service 116 in the first data storage device 130 in the first datacenter 120, several additional operations are performed by the grid storage service 116 to maintain the grid of shards. As used herein maintaining the grid of shards refers to maintaining one or more mathematical properties associated with the grid of shard. For example, a grid of shards may have a horizontal redundancy encoding scheme (e.g., for the rows of the grid) and a vertical redundancy encoding scheme (e.g., for the columns of the grid). The horizontal redundancy encoding scheme defines one or more mathematical properties associated with the grid of shards including, but limited to, the mathematical relationship between the data shards in a row and the horizontally-derived shards in the row. If a data shard is updated, the mathematical relationship between the data shards in the row and the horizontally-derived shards in the row must be maintained (i.e., the horizontally-derived shards must be immediately updated). If the mathematical relationship between the shards in the row is not maintained, the grid may not have sufficient durability and/or redundancy to repair the loss of a shard in that row. Other mathematical relationships between shards, shard data, and grid metadata associated with shards must also be maintained to maintain the grid of shards.

In order to maintain the grid of shards, data in a second data storage device 134 may be updated as a result of the new data. In the example illustrated in FIG. 1, the first data storage device 130 corresponds to a data shard (also referred to herein as an "identity shard"). A data shard (and the corresponding storage device) is denoted herein with a capital letter "I" in a box. In the example illustrated in FIG. 1, the second data storage device 134 corresponds to a derived shard. Derived shards (and their corresponding storage devices) are denoted herein with a lower case "δ" ("delta"). There are different types of derived shards, as described below and, just as with data shards, the storage devices and storage locations associated with and/or corresponding to derived shards may be referred to herein as "derived shards."

The data in the second data storage device 134 may be updated using an erasure code (also referred to herein as a redundancy code) such as those described herein because, as illustrated in FIG. 1, the first data storage device 130, the second data storage device 134, and a third data storage device 136 form a bundle 132 (denoted by the dashed line). As illustrated in FIG. 1, the bundle 132 is a set of data storage devices and/or their corresponding shards, which forms a logical grouping based on the redundancy code. The logical grouping based on the redundancy code is a grouping where, as changes are made to one or more shards in the grouping, the other shards in the group (e.g., the derived shards) are updated to maintain the grid of shards as described herein. The bundle 132 may be referred to herein as a "horizontal" bundle and the derived shard of the second data storage device 134 is referred to herein as a "horizontally-derived shard." In the example illustrated in FIG. 1, the bundle 132 includes two data shards and one derived shard.

In a grid encoded data storage system, data in data storage shard such as the third data storage device 136 is not updated or altered as a result of the updated data in the first data storage device 130. The two data shards (in the storage location corresponding to the first data storage device 130 and the location corresponding to the third data storage device 136) may remain independent of each other in that changes to one or the other may cause updates to the derived shard of the second data storage device 134, but such changes may not cause updates to the other data shards in the bundle. Such a bundle (with two data shards and one derived shard) is referred to as a "three-two" bundle (or "3:2") in that, the bundle contains a total of three shards, and two of those shards are data shards (meaning the third shard is a derived shard). For example, 3:2 bundle has a stretch factor of 1.5, because for data volume of the bundle, 1.5 volumes are required. In a 3:2 bundle, two volumes are used for data and one for parity. So, for example, using 4 TB (terabyte) volumes, a 3:2 bundle can store 8 TB of data (two data volumes) on three 4 TB volumes (i.e., 12 TB total), resulting in the 1.5 stretch factor (twelve divided by eight). In another example, with a 4:3 bundle, the stretch factor is 1.33. Different bundle types and encodings are described in greater detail below.

In grid encoding, the several additional operations that are performed by the grid storage service 116 to maintain the grid of shards also includes updating one or more corresponding derived shards in other dimensions in addition to the horizontal. In the example illustrated in FIG. 1, in addition to updating the corresponding derived shard in the second data storage device 134 as a result of the data change to the data shard in the first data storage device 130, one or more vertically-derived shards stored in data storage locations 138 may also be updated. Vertically-derived shards, which form the basis of the distinction between grid-encoding techniques and other redundancy encoding techniques, are shards that are used to perform a vertical bundle such as the vertical bundle 140 illustrated in FIG. 1. As can be seen in the example illustrated in FIG. 1, the vertical bundle 140 contains data shards, horizontally-derived shards (e.g., the horizontally-derived shard stored in data storage location 142), and vertically-derived shards in data storage locations 138. When data is updated in the data shard in the first data storage device 130, the other data shards and horizontally-derived shards of the vertical bundle 140 may not be altered and only the vertically-derived shards may be altered.

Other shards may be updated as a result of the data change to the data stored in the first data storage device 130. For example, as a result of the changes to the derived shard in the second storage device 134, one or more other vertically-derived shards a bundle formed by shards associated with the third datacenter 128 may also be updated. Such additional updates are described in detail below. Additionally, while the grid is illustrated herein with two dimensions (e.g., horizontal and vertical), the grid may include additional dimensions which may, in some embodiments, be virtual (or logical) partitions of the grid.

Figure 2:
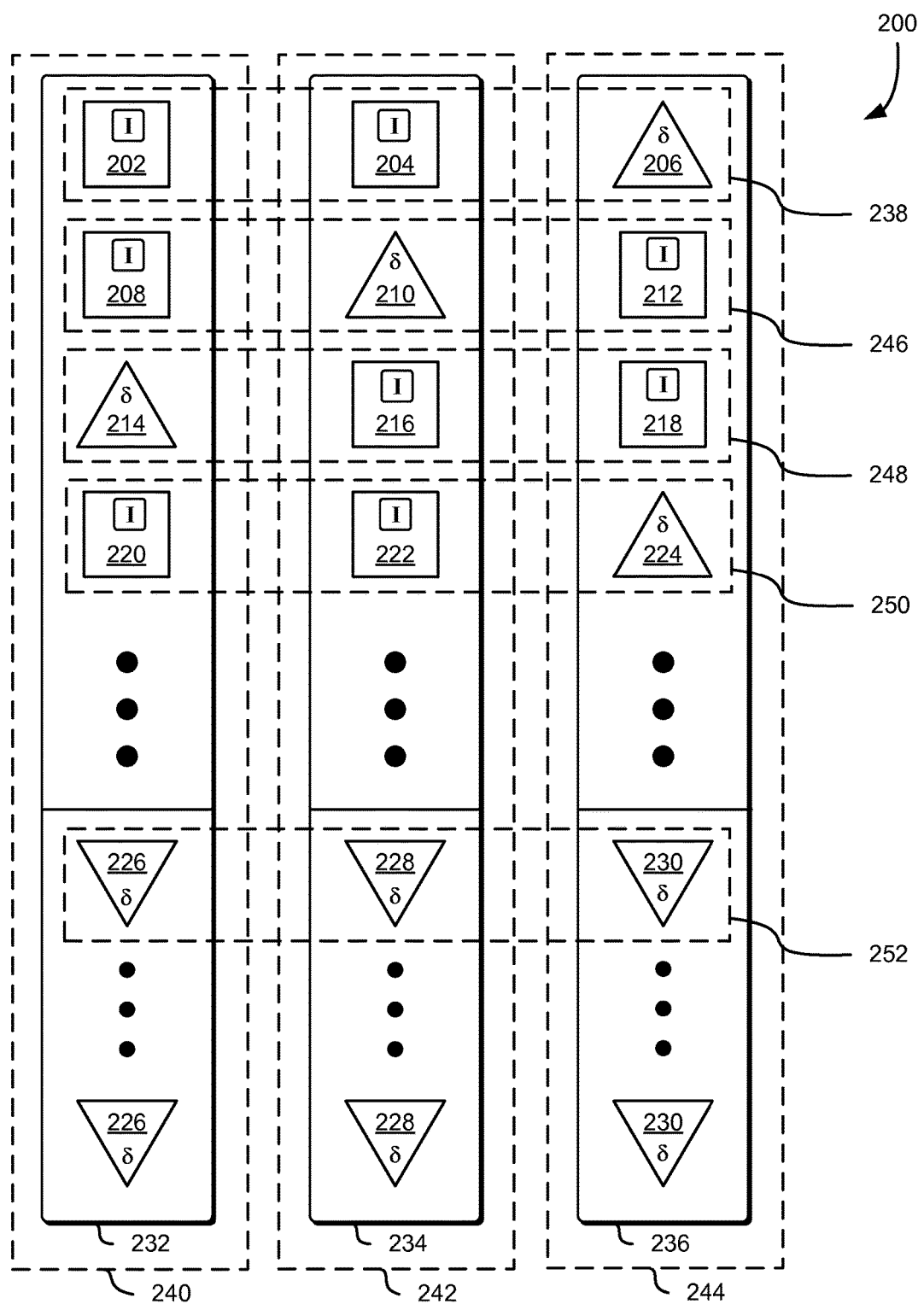
FIG. 2 illustrates an example diagram of the structure of a grid encoded data storage system in accordance with an embodiment.

FIG. 2 illustrates an example diagram 200 of the structure of a grid encoded data storage system as described in connection with FIG. 1 and in accordance with an embodiment. As a result of changes or updates to the contents of the grid of shards, changes may occur in multiple shards as described in connection with FIG. 1. Examples of operations that may change the data in the grid of shards include, but are not limited to, adding data to a data shard, removing data from a data shard, repairing one or more lost or unusable shards, adding storage capacity to a storage device associated with a shard, adding columns to the grid of shards (e.g., by adding datacenters), removing columns from the grid of shards (e.g., by removing datacenters), adding or removing rows from the grid of shards, regenerating the grid of shards, creating a new grid of shards (either in a new set of storage devices or within an existing set of storage devices), changing the encoding of the rows or columns of a grid of shards, adding or removing dimensions from the grid of shards (e.g., adding a second dimension to a one-dimensional grid or adding a third dimension to a two-dimensional grid), or combinations of these and/or other such operations that change, alter, or update the grid of shards. In an embodiment, multiple columns can be added to a datacenter. For example, two vertical bundles (with two corresponding columns) may be added to a datacenter during a single update operation. In another embodiment, a single column can be added to an existing datacenter (also resulting in two corresponding columns).

In the examples illustrated in FIG. 2, an update operation (i.e., an update to a data shard in the grid of shards) is used as an illustrative example of the types of operations that can be performed on a grid of shards. For example, a repair of a shard has many of the same dependencies as those that occur as the result of an update, although those dependencies and the resulting order of operations may occur in a different order. In an illustrative example, the update of a data shard involves a partial sum write to the data shard and then an update to derived shards based on one or more redundancy encoding techniques as described herein while a repair of a shard may first require one or more reads from data shards and derived shards and calculations based on the one or more redundancy encoding techniques before updating the lost or damaged shard.

Other operations associated with the repair of a shard include, but may not be limited to, determining whether a shard requires repair, determining the extent of the repair required (e.g., whether a partial repair may restore the lost or damaged shard), regenerating the inaccessible data, writing the repaired shard to a new storage device, updating grid metadata associated with the shard (e.g., to indicate the new storage device), or other such repair operations. Operations associated with the repair of a shard may also be used to generate a new shard. For example, when a new shard is added to a horizontal bundle of shards, the new shard may be initialized with zero values, or with a predetermined arbitrary data value, or may not be initialized at all (e.g., it may be added in an uninitialized state). The shard may then be initialized as, for example, a derived shard by performing one or more repair operations on the shard, thereby generating the shard data. The operations to repair a shard may be the same as the operations to generate a shard and also may be the same as the operations to update a shard (e.g., the operations to repair a shard may be the same as the operations to update a shard). The operations to repair a shard may also be partially the same as the operations to generate a shard and/or also may be partially the same as the operations to update a shard (e.g., the operations to repair a shard may include some of the same operations to update a shard, and may have additional operations to complete the repair that are not the same as the operations to do the update).

In a first example of how changes may be made to a grid of shards and how those changes are propagated through the grid, the data in data shard 202 in a first datacenter 232 can be altered (using, for example, one of the data alteration operations described herein). As illustrated herein, data shards are denoted as square shards with an upper case "I" inside a smaller square. Because the data in data shard 202 is part of the horizontal bundle 238, data in the horizontally-derived shard 206 in the third datacenter 236 (also part of the horizontal bundle 238) may be updated based on, for example, a parity encoding of the shards, as described below. As illustrated herein, horizontally-derived shards are denoted as upright triangles (with a vertex of the triangle pointing to the top of the page) with a lower-case "δ" (delta) inside the triangle. It should be noted that the other data shard in the horizontal bundle 238 (data shard 204, in a second datacenter 234) may not be updated or altered based on the changes to the data shard 202.

Additionally, because the data shard 202 is part of the vertical bundle 240, data in the vertically-derived shards 226 may be updated based on, for example, a Reed-Solomon encoding of the shards as described below. As illustrated herein, vertically-derived shards are denoted as inverted triangles (with a vertex of the triangle pointing to the bottom of the page) with a lower-case "δ" (delta) inside the triangle. Because the redundancy encoding used for the vertical bundle may be more complex, there may be a plurality of vertically-derived shards in the vertical bundle. As illustrated in FIG. 2, the vertical bundle 242 corresponds to the first datacenter 232, the vertical bundle 242 corresponds to the second datacenter 234, and the vertical bundle 244 corresponds to the third datacenter 236 so that, each vertical bundle is in a single datacenter and each horizontal bundle is a plurality of datacenters. As may be contemplated, the arrangement of horizontal bundles with respect to datacenters and the arrangement of vertical bundles with respect to datacenters illustrated herein are merely illustrative examples and, as such, other arrangements of horizontal bundles with respect to datacenters and/or arrangements of vertical bundles with respect to datacenters may be considered as within the scope of this disclosure.

Just as with the horizontal bundle 238, when the data shard 202 is updated, the vertically-derived shards 226 in the vertical bundle 240 updated, but the other shards in the vertical bundle that are not vertically-derived shards may not be updated. For example, data shard 208, horizontally-derived shard 214, data shard 220, and other shards in the bundle may not be updated as a result of the update to data shard 202. For example, horizontally-derived shard 214 may be updated when one or more of the shards in the horizontal bundle 248 is updated (i.e., data shard 216 and/or data shard 218), but may not be updated when data shard 202, data shard 208, data shard 220, or any of the vertically-derived shards 226 are updated. Horizontally-derived shards are updated as a result of changes in the horizontal bundle, but not as result of changes in the vertical bundle.

Continuing with the update to the data shard 202, a third update must be made to maintain the grid of shards. This third update occurs as a result of the update to the horizontally-derived shard 206 of the horizontal bundle 238. The horizontally-derived shard 206 is a part of the vertical bundle 244. Thus, when the horizontally-derived shard 206 is updated, data in the vertically-derived shards 230 of the vertical bundle 244 may be updated as well. It should be noted that, in some embodiments, each horizontal bundle has the same redundancy encoding and each vertical bundle has the same redundancy encoding. So if, for example, the vertical bundle 240 uses a Reed-Solomon encoding, then the vertical bundle 242 and the vertical bundle 244 would also use the same Reed-Solomon encoding.

Thus, as a result of an update to the data shard 202, the horizontally-derived shard 206 may be updated because it is the same horizontal bundle as the data shard 202, the vertically-derived shards 226 may be updated because they are in the same vertical bundle as the data shard 202, and the vertically-derived shards 230 may be updated because they are in the same vertical bundle as the horizontally-derived shard 206. It should be noted that these update operations may occur in a sequence such as the sequence described or may occur in parallel (e.g., updating the vertically-derived shards 226 and the vertically-derived shards 230 simultaneously).

As illustrated in FIG. 2, a second horizontal bundle 246 with data shard 208, horizontally-derived shard 210, and data shard 212 may also receive updates to, for example, data shard 212. Such an update may, as described in connection with horizontal bundle 238, cause an update to the horizontally-derived shard 210, to vertically-derived shards 230, and to vertically-derived shards 228. Similarly, a third horizontal bundle 248 with horizontally-derived shard 214, data shard 216, and data shard 218 may also receive updates which would cause an update to the horizontally-derived shard 214, to vertically-derived shards 226, and either vertically-derived shards 228 or to vertically-derived shards 230, depending on which data shard of data shard 216 and data shard 218 received the update.

FIG. 2 illustrates one organizing principle of the grid of shards where the horizontally-derived shards may be distributed throughout the datacenters (also referred to herein as "balancing"). The first horizontal bundle 238 has the horizontally-derived shard 206 in the third datacenter 236 (and in the third vertical bundle 244). The second horizontal bundle 246 has the horizontally-derived shard 210 in the second datacenter 234 (and in the second vertical bundle 242). The third horizontal bundle 248 has the horizontally-derived shard 214 in the first datacenter 232 (and in the first vertical bundle 240). The fourth horizontal bundle 250 has a first data shard 220 in the first datacenter 232 (and the first vertical bundle 240), a second data shard 222 in the second datacenter 234 (and the second vertical bundle 242), and the horizontally-derived shard 224 in the third datacenter 236 (and the third vertical bundle 244), repeating the pattern of the first horizontal bundle 238. This balancing of the horizontally-derived shards aids in performance and reliability by reducing the impact of the loss of a datacenter as described below. Balancing horizontally-derived shards allows the data shards and the derived shards to be distributed evenly across datacenters. Balancing may improve the redundancy and durability of a grid of shards by distributing shards across datacenters, thereby making the grid of shards more tolerant of datacenter loss (e.g., due to power failure, network failure, or some catastrophic event). Balancing may also improve the efficiency of a grid of shards because, for example, data shards may be slower to access than derived shards and balancing may provide for better bandwidth and/or throughput during repair operations.

FIG. 2 also illustrates a second organizing principle of the grids of shards in that there are horizontal bundles of the vertically-derived shards that are formed based on the redundancy encoding techniques (also referred to herein as "redundancy encoding schemes") selected for the horizontal and vertical bundles. For example, horizontal bundle 252 forms a bundle with the same redundancy encoding as one of the horizontal bundles in the upper part of the grid such as horizontal bundle 238. There is no explicit horizontally-derived shard of this bundle in that each of vertically-derived shards (in this example, one of the vertically-derived shards 226, one of the vertically-derived shards 228, and one of the vertically-derived shards 230) are mathematically able to be used as a horizontally-derived shard of the other two. This property of the grid is described in greater detail below.

Figure 3:
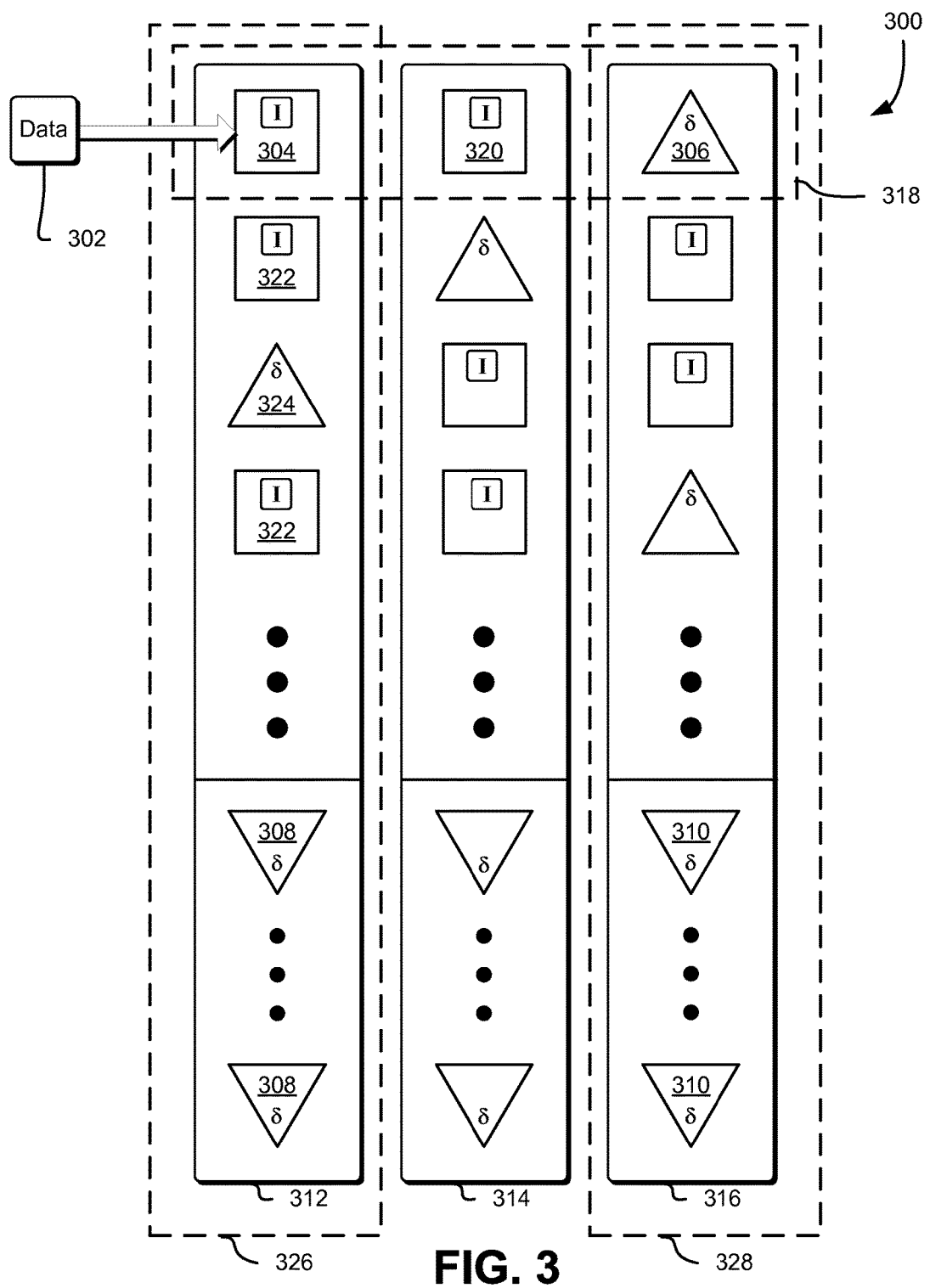
FIG. 3 illustrates an example diagram showing an update to data stored in a grid encoded data storage system in accordance with an embodiment.

FIG. 3 illustrates an example diagram 300 showing an update to data stored in a grid encoded data storage system as described in connection with FIG. 1 and in accordance with an embodiment. In the example illustrated in FIG. 3, each identity shard is part of a first set of one or more identity shards, which may be bundled with one or more derived shards in a first group or bundle (i.e., in one dimension or direction) and each identity shard is also part of at least a second set of one or more identity shards, which may be bundled with one or more other derived shards in a second bundle or group (i.e., in a second dimension or direction). As is illustrated in FIG. 3, a grid encoding technique is often implemented as a two-dimensional grid, with each shard being part of two bundles (i.e., both "horizontal" and "vertical" bundles). However, a grid encoding technique may also be implemented as a three-dimensional grid, with each shard being part of three bundles, or a four-dimensional grid, with each shard being part of four bundles, or as a larger-dimensional grid.

In the example illustrated in FIG. 3, data 302 is provided for storage using a redundancy encoding technique with both horizontal derived shards and vertical derived shards. In the example illustrated in FIG. 3, a first datacenter 312 may contain data shards (denoted as a square shard with the letter "I"), horizontal derived shards (denoted as an upright triangular shard with the Greek letter "δ" or delta), and vertical derived shards (denoted as an inverted triangle with the Greek letter "δ") all of which may be stored on durable storage volumes within the first datacenter 312. A second datacenter 314, which may be geographically and/or logically separate from the first datacenter 312, may also contain data shards, horizontal derived shards, and/or vertical derived shards. A third datacenter 316, which may be geographically and/or logically separate from the first datacenter 312 and from the second datacenter 314, may also contain data shards, horizontal derived shards, and/or vertical derived shards. As illustrated in FIG. 3, each of the three datacenters may be a single vertical bundle. For example, datacenter 312 corresponds to the vertical bundle 326 and datacenter 316 corresponds to vertical bundle 328 (no vertical bundle is illustrated for datacenter 314). In an embodiment, each of the datacenters can include multiple vertical bundles. As may be contemplated, the number of datacenters illustrated in FIG. 3 and/or the composition of the datacenters illustrated in FIG. 3 are merely illustrative examples and other numbers and/or compositions of datacenters may be considered as within the scope of the present disclosure. The datacenters may be co-located or may be located in one or more separate datacenter locations (i.e., the geographical and/or logical location of the datacenter).

In the example illustrated in FIG. 3, the data 302 may be copied to a data shard 304 and, as a result of the change to the data in the data shard 304, a horizontal derived shard 306 associated with the data shard 304 may be updated so that the horizontal derived shard 306 may be used to reconstruct the data shard 304 in the event of a loss of the data shard 304. In the example illustrated in FIG. 3, the three shards enclosed by the dotted line (e.g., the data shard 304, the data shard 320, and the horizontal derived shard 306) together make a horizontal bundle 318. In this example, the data shard 320 is not affected by the changes to the data shard 304 but the horizontal derived shard 306 may need to be updated as a result of the changes to the data shard 304.

Also as a result of the change to the data in the data shard 304, one or more vertical derived shards 308 related to the data shard 304 may also be updated so that the vertical derived shards 308 may be used to reconstruct the data shard 304 in the event of a loss of the data shard 304 and the horizontal derived shard 306. In the example illustrated in FIG. 3, the shards in datacenter 312 form a vertical bundle. In this example, the other data shards 322 in the vertical bundle and/or the horizontal derived shards 324 in the vertical bundle are not affected by the changes to the data shard 304 but the vertical derived shards 308 may need to be updated as a result of the changes to the data shard 304. Finally, as a result of the change to the horizontal derived shard 306, one or more vertical derived shards 310 related to the horizontal derived shard 306 in the vertical bundle in datacenter 316 may also be updated so that the vertical derived shards 310 may be used to reconstruct the horizontal derived shard 306 in the event of a loss of the horizontal derived shard 306 and the data shard 304.

Figure 4:
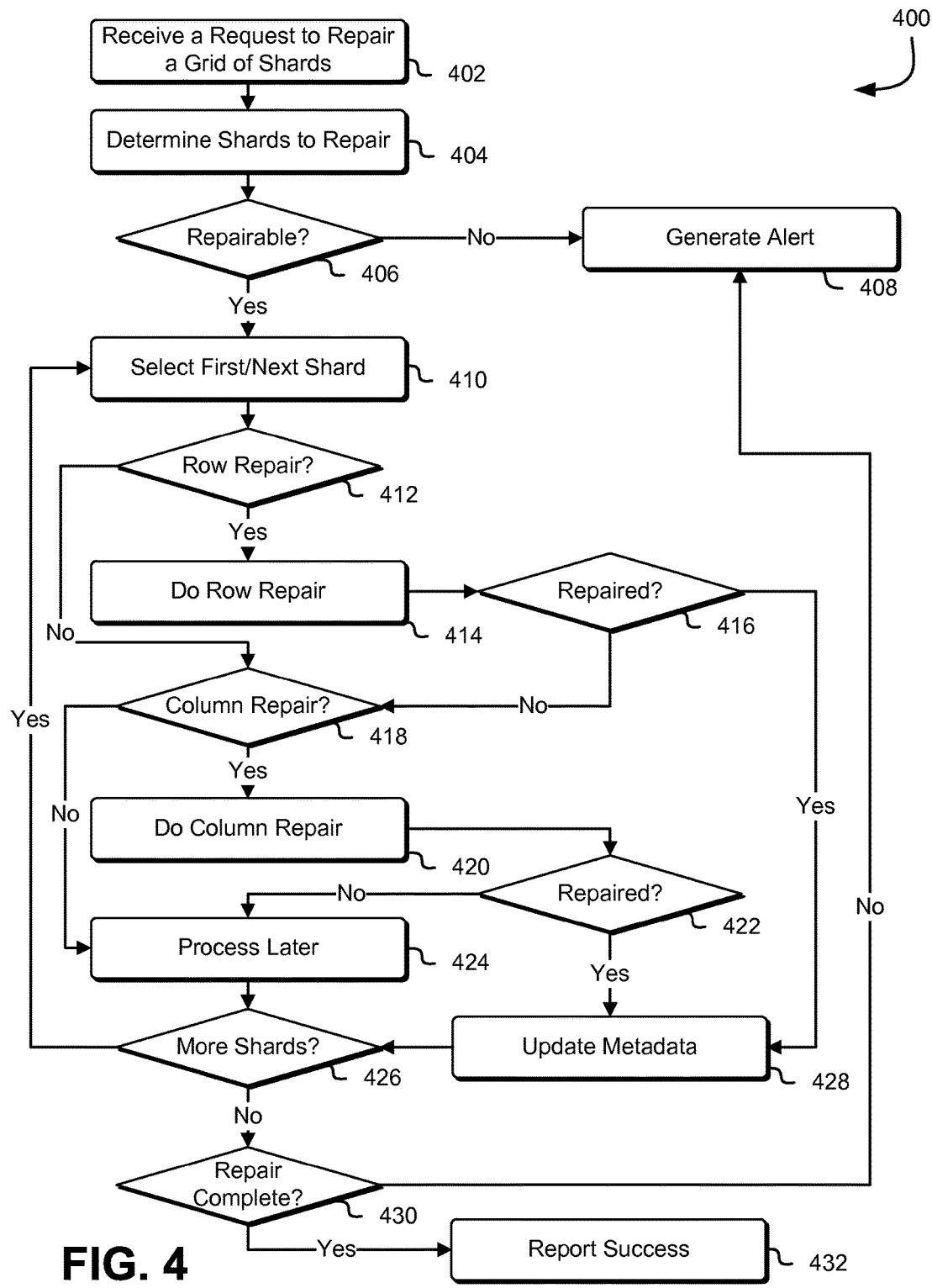
FIG. 4 illustrates an example process for repairing a grid encoded data storage system in accordance with an embodiment.

FIG. 4 illustrates an example process 400 for repairing a grid encoded data storage system as described in connection with FIG. 1 and in accordance with an embodiment. A grid storage service such as the grid storage service 116 described in connection with FIG. 1 may perform the example process 400 illustrated in FIG. 4. A grid storage service may first receive a request to repair 402 a grid of shards. The request to repair may be a request to repair a single shard because, for example, the data in a data shard has been lost or corrupted, the storage device associated with the shard needs to be replaced, or a derived shard needs to be updated. The request to repair may also be a request to repair multiple shards because, for example, they are a set of vertically-derived shards or a number of updates have occurred. The request may also be a request to recover from the loss of a complete datacenter as described below.

The grid storage service may determine 404 which shards of the grid of shards to repair and, based on that determination, may determine whether the grid of shards is repairable 406. The grid storage service may perform actions such as the action to determine 404 the shards to repair and the action to determine whether the grid of shards is repairable 406 (as well as the other actions described herein) by performing one or more operations and/or executing one or more executable instructions using a computer system associated with the grid storage service and provided by a computing resource service provider such as the computing resource service provider 110 described in connection with FIG. 1.

A grid of shards may not be repairable because, for example, too many shards have been lost, or because too many rows have been lost, or because too many columns have been lost. A grid of shards is both durable and redundant and thus, is tolerant of the loss of a large portion of the shards in the grid of shards. However, there are conditions where too many shards have been lost and the grid is not repairable. For example, if one complete datacenter is lost and too many shards in a second datacenter are also lost, the grid may not be repairable. In the case of a grid of shards not being repairable 406, the grid storage service may generate an alert 408 and, in some embodiments, perform operations to partially restore the grid from backup storage before completing the repair.

If it is determined that the grid of shards is repairable 406, the grid storage service may first select a shard to repair 410 and determine 412 whether the shard can be repaired from the shards in the same corresponding row (i.e., the shards in the same horizontal bundle). It should be noted that while the example process 400 indicates an order of operations for the process, many of the operations illustrated can be performed in a different order or in parallel. For example, it is not necessarily to determine 412 whether the shard can be repaired from the shards in the same corresponding row before the grid storage service may determine 418 whether the shards can be repaired from the shards in the same corresponding column as described below. These determinations can occur in either order or in parallel. Similarly, multiple shards can be repaired at the same time based at least in part on, for example, where they are stored or which other shards they are related to (i.e., horizontally or vertically). As such, other orders of the operations of example process 400 described in connection with FIG. 4 may be considered as within the scope of this disclosure.

Continuing with the repair, if it is determined that the shard can be repaired from the shards in the same corresponding row, a row repair 414 will be attempted. As described below, a shard can be repaired from the shards in the same corresponding row if there are sufficient available shards (also referred to herein as "undamaged" shards) to perform the repair based on the redundancy encoding technique associated with the horizontal bundle. For example, a horizontal bundle with three shards where two of the shards are data shards and one of which is a parity shard can be repaired from the shards in the same corresponding row (or horizontal bundle) if only one shard is unavailable because such a redundancy encoding technique allows a shard to be repaired if two of the three shards in the bundle are available (i.e., either the two data shards or one data shard and one derived shard).

If the row repair 414 is successful and the shard is repaired 416, then the grid storage service may update the grid metadata 428 and determine 426 whether there are more shards to repair. If, on the other hand, the grid storage service is not able to repair the shard from the shards in the same corresponding row, the grid storage service may next determine 418 whether the shard can be repaired from the shards in the same corresponding column. A shard can be repaired from the shards in the same corresponding column if there are sufficient available shards (also referred to herein as "undamaged" shards) to perform the repair based on the redundancy encoding technique associated with the vertical bundle. For example, a vertical bundle with six shards where four of the shards are data shards and two of which are derived shards based on, for example, a Reed-Solomon code, can be repaired from the shards in the same corresponding column (or vertical bundle) if less than three shards are unavailable. This is because such a redundancy encoding technique that uses a maximum distance separable code (e.g., a Reed-Solomon code) allows a shard to be repaired if four of the six shards in the bundle are available (i.e., either the four data shards, three data shards and one derived shard, or two data shards and two derived shards).

If the grid storage service does determine 418 that the shard can be repaired from shards in the same corresponding column, the grid storage service may attempt the column repair 420 and, if the column repair 420 is successful 422, the grid storage service may update the grid metadata 428 and determine 426 whether there are more shards to repair. If the data storage is not able to complete the column repair, then the data storage may return the shard to the list of shards to process later 424. Shards that may not be able to be initially repaired may be processed later 424 for repair because, as more shards are repaired, it may become possible to repair formerly unrepairable shards. For example, a horizontally-derived shard may be part of a horizontal bundle with two other data shards and all three of the shards may need repair. Such a horizontally-derived shard is not repairable when, for example, the horizontal bundle has two data shards and a horizontally-derived parity shard. However, the horizontally-derived shard may be processed later 424 for repair after, for example, the two data shards in the horizontal bundle are repaired using a column repair.

The grid storage service may continue processing shards for repair as long as there are shards to repair. When all shards that can be repaired have been repaired, the grid storage service may finally determine whether the repair is complete 430 (i.e., that all shards have been repaired). If it is the case that the repair is complete 430, the grid storage service may report that the repair has completed successfully. If it is not the case that the repair is complete 430, then the grid may not be repairable. As such, the grid storage service may generate an alert 408 and may also perform operations to partially restore the grid from backup storage before attempting to complete the repair.

Figure 5:
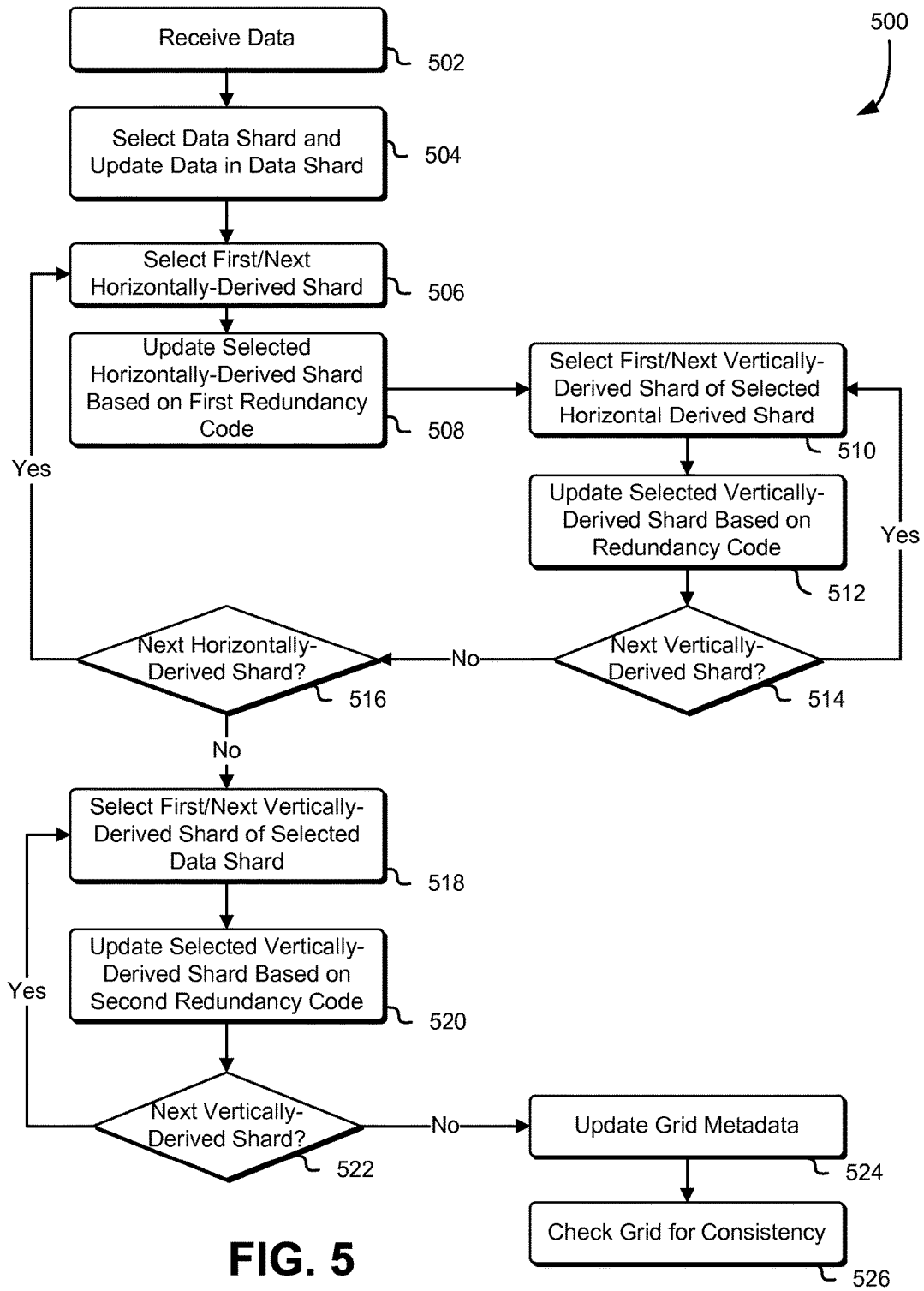
FIG. 5 illustrates an example process for updating data in a grid encoded data storage system in accordance with an embodiment.

FIG. 5 illustrates an example process 500 for updating data in a grid encoded data storage system as described in connection with FIG. 1 and in accordance with an embodiment. A grid storage service such as the grid storage service 116 described in connection with FIG. 1 may perform the example process 500 illustrated in FIG. 5. It should be noted that, just as with the example process 400 illustrated in FIG. 4, many of the operations illustrated in example process 500 can be performed in a different order than the order described herein or can be performed in parallel. For example, it is not necessarily to start with horizontally-derived shards nor is it necessary to update the grid metadata at the end of the update. As such, other orders of the operations of example process 500 described in connection with FIG. 5 may be considered as within the scope of this disclosure.

The grid storage service may first receive 502 data to be stored in the grid of shards and then may select 504 a data shard where the data may be stored and the selected data shard may be updated using the data. The data shard may be selected based on proximity to the user (i.e., because of the corresponding datacenter location of the storage device associated with the data shard), proximity to a data source, availability of data storage associated with the data shard, grid optimization criteria (e.g., grid balancing), costs associated with storage, or other criteria. The selected data shard may be updated by replacing data stored in the shard or by incrementally adding to the data in the data shard using, for example, a partial sum write to the shard.

After the selected data shard is selected and updated, the grid storage service may continue with the update by selecting 506 a horizontally-derived shard of the same horizontal bundle as the selected data shard and updating 508 that horizontally-derived shard using a first redundancy encoding technique. The grid storage service may then continue the update by selecting 510 a vertically-derived shard in the same vertical bundle as that horizontally-derived shard, updating 512 that vertically-derived shard using a second redundancy encoding technique, and continue updating vertically-derived shards while there are more vertically-derived shards 514 in the vertical bundle of the horizontally-derived shard. The grid storage service may continue performing the steps of selecting 506 horizontally-derived shards, updating 508 those horizontally-derived shards, selecting 510 vertically-derived shards of the horizontally-derived shard, and updating those vertically-derived shards of the horizontally-derived shard while there are more vertically-derived shards 514 for as long as there are more horizontally-derived shards 516 of the selected data shard.

The grid storage service may then continue the update by selecting 518 a vertically-derived shard of the same vertical bundle as the selected data shard and updating 520 that vertically-derived shard based on the second redundancy code. After all vertically-derived shards of the same vertical bundle as the selected data shard have been updated, the grid storage service may update any grid metadata 524 (e.g., metadata associated with verification or validation of the grid, metadata associated with the size of a shard (also referred to herein as the "data size" of the shard), metadata associated with a maximum size of a shard (also referred to as the "maximum data amount" of the shard, or other metadata) and may perform one or more verification or validation steps to check the grid for consistency 526 as described below.

Figure 6:
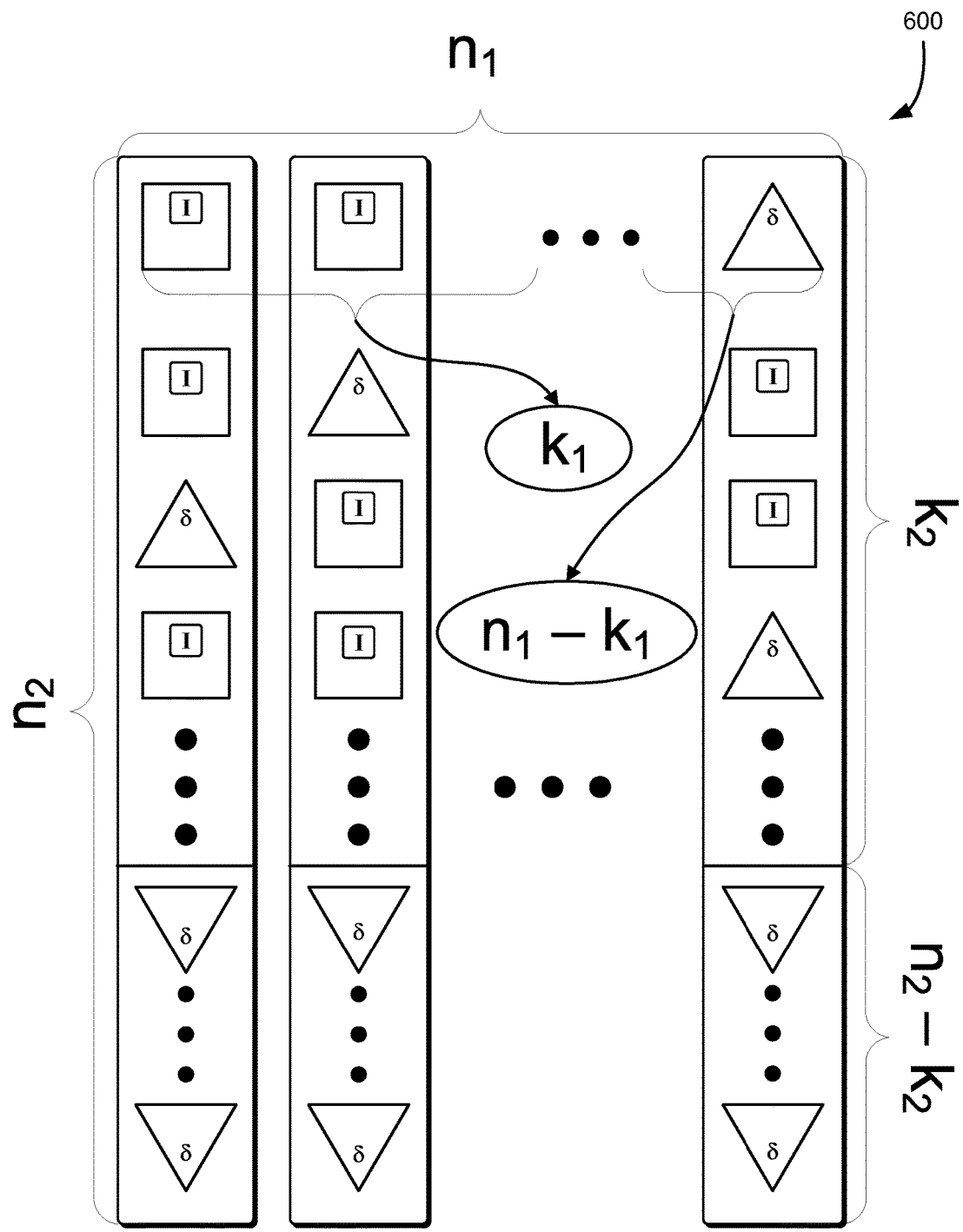
FIG. 6 illustrates an example diagram showing the composition of a grid encoded data storage system in accordance with an embodiment.

FIG. 6 illustrates an example diagram 600 showing the composition of a grid encoded data storage system as described in connection with FIG. 1 and in accordance with an embodiment. Each horizontal bundle of the example grid illustrated in FIG. 6 has $n_1$ shards, with $k_1$ data shards and $n_1-k_1$ horizontally-derived shards. Such a horizontal bundle is described herein as having an "$n_1:k_1$" encoding. For example, a grid where each horizontal bundle has three shards ($n_1=3$) where two of the shards are data shards ($k_1=2$) has a "3:2" encoding. Similarly, each vertical bundle of the example grid illustrated in FIG. 6 has $n_2$ shards, with $k_2$ data shards and $n_2-k_2$ vertically-derived shards. Such a vertical bundle is also described herein as having an "$n_2:k_2$" encoding. A grid where each vertical bundle has, for example, six shards ($n_2=6$) where four of the shards are data shards ($k_2=4$)

has a "6:4" encoding. The grid illustrated in FIG. 6 has an "$n_1$:$k_1$ by $n_2$:$k_2$" grid encoding (alternatively referred to herein as an "$n_1$:$k_1 \times n_2$:$k_2$" grid encoding).

Figure 7:
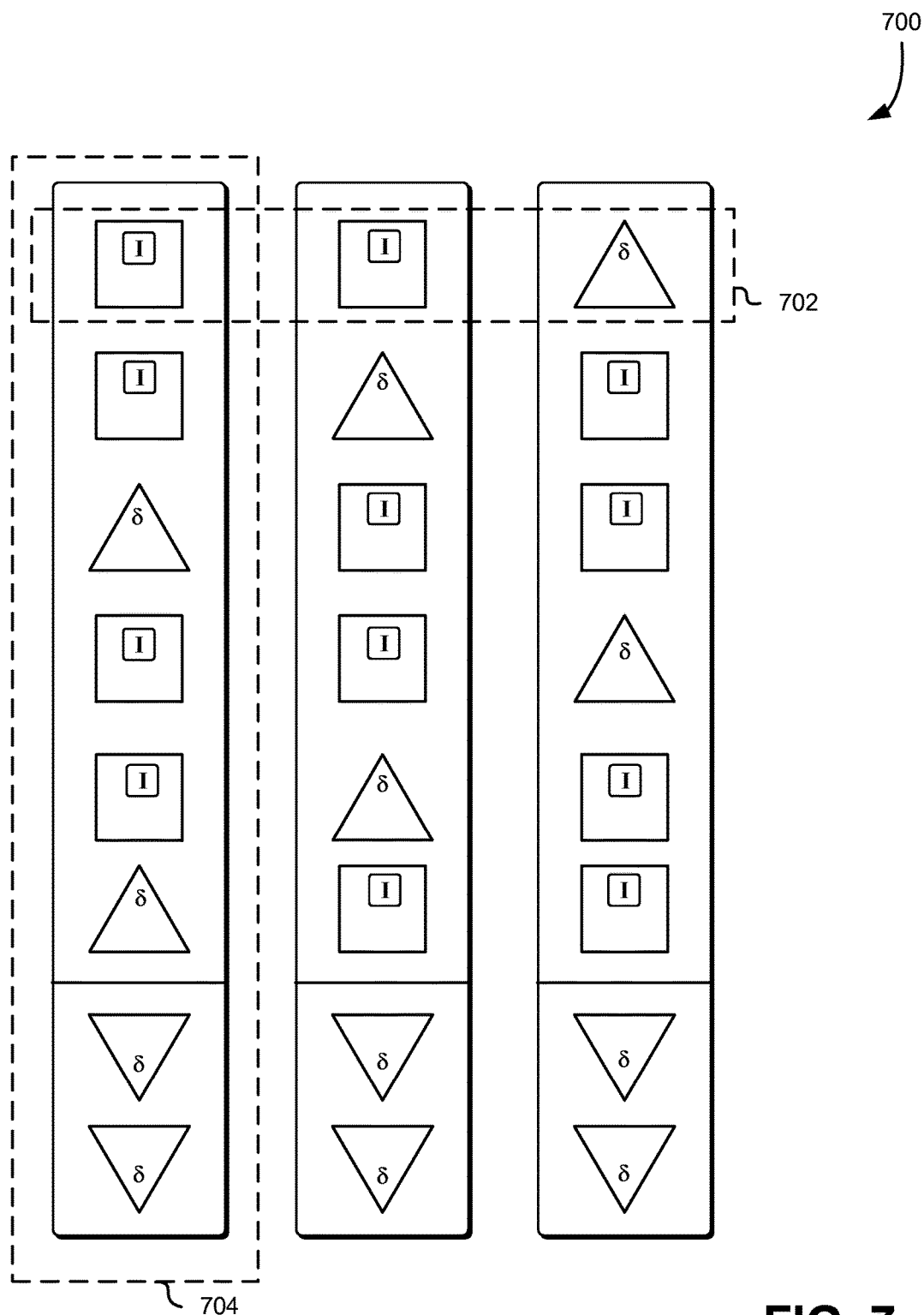
FIG. 7 illustrates an example diagram showing a collection of shards of a grid encoded data storage system in accordance with an embodiment.

FIG. 7 illustrates an example diagram 700 showing a collection of shards of a grid encoded data storage system as described in connection with FIG. 1 and in accordance with an embodiment. FIG. 7 illustrates a specific example of the "$n_1$:$k_1$ by $n_2$:$k_2$" grid encoding described in connection with FIG. 6. In this example, each horizontal bundle such as the horizontal bundle 702 has three shards, two of which are data shards and the third of which is a horizontally-derived shard that is derived using, for example, a parity redundancy encoding scheme and/or the associated parity redundancy code, and each vertical bundle such as the vertical bundle 704 has eight shards, six of which are data shards and two of which are vertically-derived shards that are derived using a Reed-Solomon redundancy encoding scheme and/or the associated Reed-Solomon redundancy code. Such a grid has a "3:2 by 8:6" grid encoding. As may be contemplated, the grid encoding illustrated in FIG. 7 is merely an example grid encoding used for illustrative purposes and other grid encodings including, but not limited to, other numbers of shards, other numbers of data shards, other numbers of derived shards, and other redundancy encoding techniques may be considered as within the scope of this disclosure.

Figure 8:
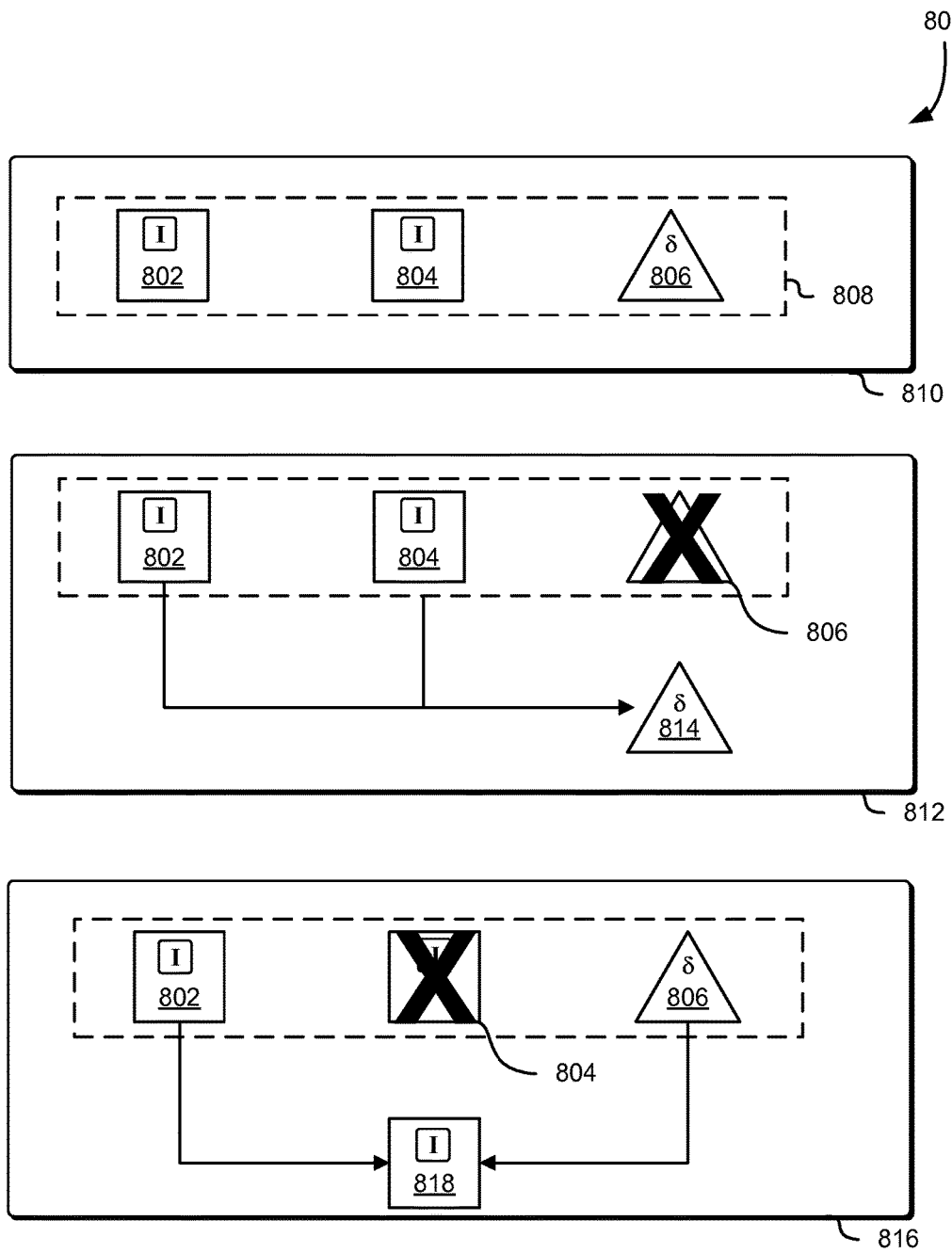
FIG. 8 illustrates an example diagram showing the recovery of shards in a grid encoded data storage system in accordance with an embodiment.

FIG. 8 illustrates an example diagram 800 showing the recovery of shards in a grid encoded data storage system as described in connection with FIG. 1 and in accordance with an embodiment. The recovery of a shard (also referred to herein as the "repair" of a shard) may be based on one or more redundancy encoding techniques such as those described herein. The example illustrated in FIG. 8 shows a first set of shards 810 that has a first data shard 802, a second data shard 804, and a derived shard 806 in a bundle of shards 808. The example illustrates a "3:2" encoding where the derived shard 806 as a horizontally-derived shard (i.e., because it is an upright triangle), but the recovery techniques described in connection with FIG. 8 apply to other encodings, other bundles (e.g., vertical bundles), and other dimensionalities of the grid (e.g., the third dimension of a three-dimensional grid).

A first repair is illustrated in FIG. 8 by the second set of shards 812 where the derived shard 806 is damaged and/or unavailable. If two shards are sufficient to repair a third in the bundle (e.g., using a parity redundancy encoding technique), the derived shard 806 may be repaired using the redundancy encoding technique associated with the bundle (along with data shard 802 and data shard 804) to produce a new derived shard 814, which may then replace the damaged and/or unavailable derived shard 806.

A second repair is illustrated in FIG. 8 by the third set of shards 816 where one of the data shards 804 is damaged and/or unavailable. Again, if two shards are sufficient to repair a third in the bundle, the data shard 804 may be repaired using the using the redundancy encoding technique associated with the bundle (along with data shard 802 and derived shard 806) to produce a new data shard 818, which may then replace the damaged and/or unavailable data shard 804.

Figure 9:
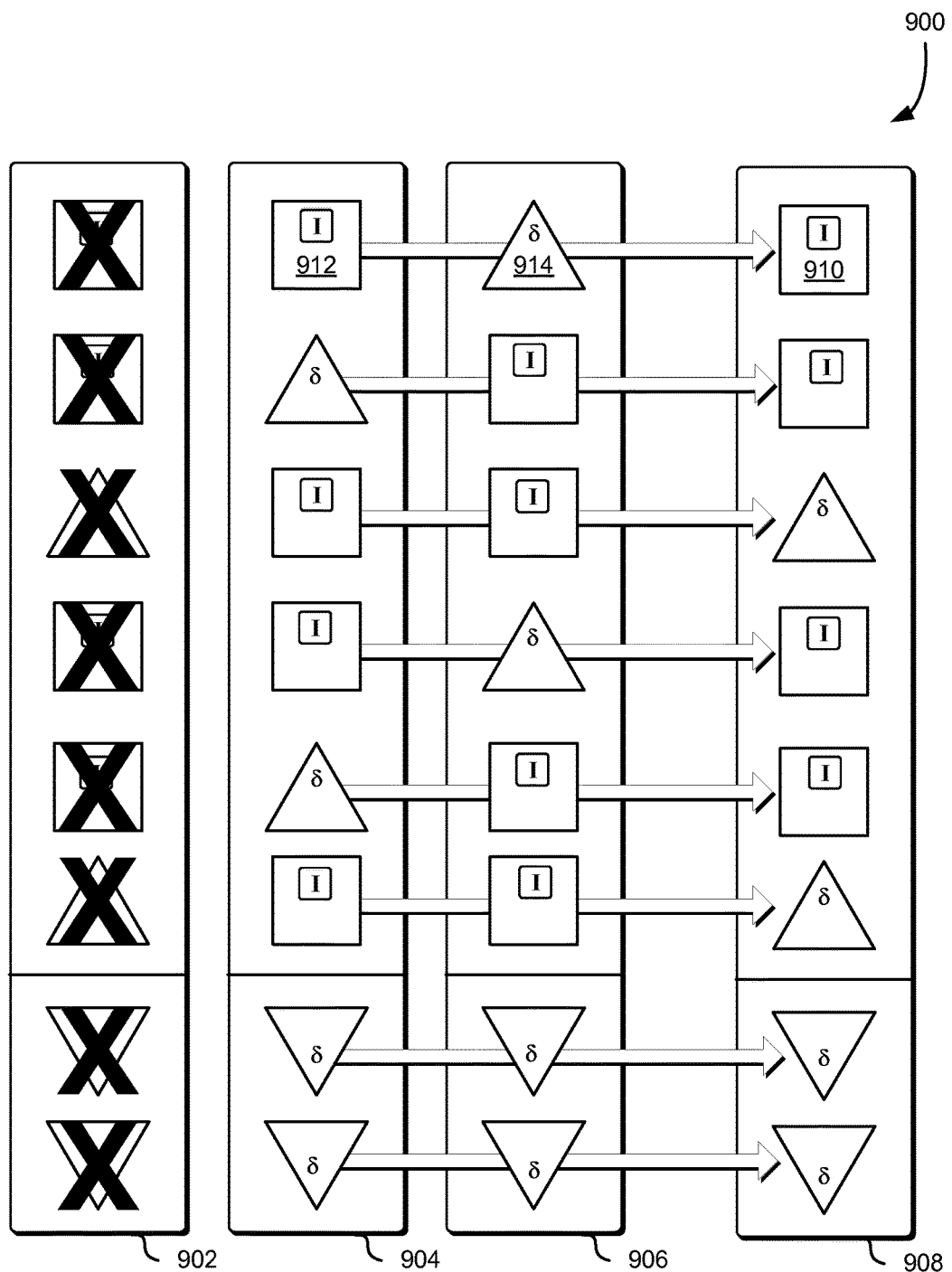
FIG. 9 illustrates an example diagram showing the recovery of a datacenter of a grid encoded data storage system in accordance with an embodiment.

FIG. 9 illustrates an example diagram 900 showing the recovery of a datacenter of a grid encoded data storage system as described in connection with FIG. 1 and in accordance with an embodiment. In the example illustrated in FIG. 9, the entire datacenter 902 is damaged and/or unavailable and none of the shards in the datacenter 902 can be used to maintain the grid. A datacenter may become unavailable if, for example, there is a power outage or a natural disaster. A datacenter may also become unavailable due to maintenance issues (e.g., replacing hardware associated with the datacenter), a decision to relocate the datacenter, or due to some other less catastrophic reason.

A new datacenter 908 can be produced from the grid using the horizontal bundles of the shards from the datacenter 904 and from the datacenter 906. For example, using the techniques described herein in connection with FIG. 8, a replacement data shard 910, which is a replacement for the data shard in the datacenter 902, can be generated using the redundancy encoding technique associated with the horizontal bundle containing data shard 912 in the datacenter 904 and the derived shard 914 in the datacenter 906. Similarly, each of the other shards in the datacenter 908 can be reproduced from corresponding shards in datacenter 904 and datacenter 906 using the redundancy encoding scheme associated with the horizontal bundles. Additionally, only a sufficient number of the shards in the datacenter 908 may need to be regenerated using the redundancy encoding scheme associated with the horizontal bundles. After a sufficient number of shards in the datacenter 908 have been regenerated using the horizontal bundles, the remaining shards in the datacenter 908 may be regenerated using the vertical bundle corresponding to datacenter 908.

Figure 10:
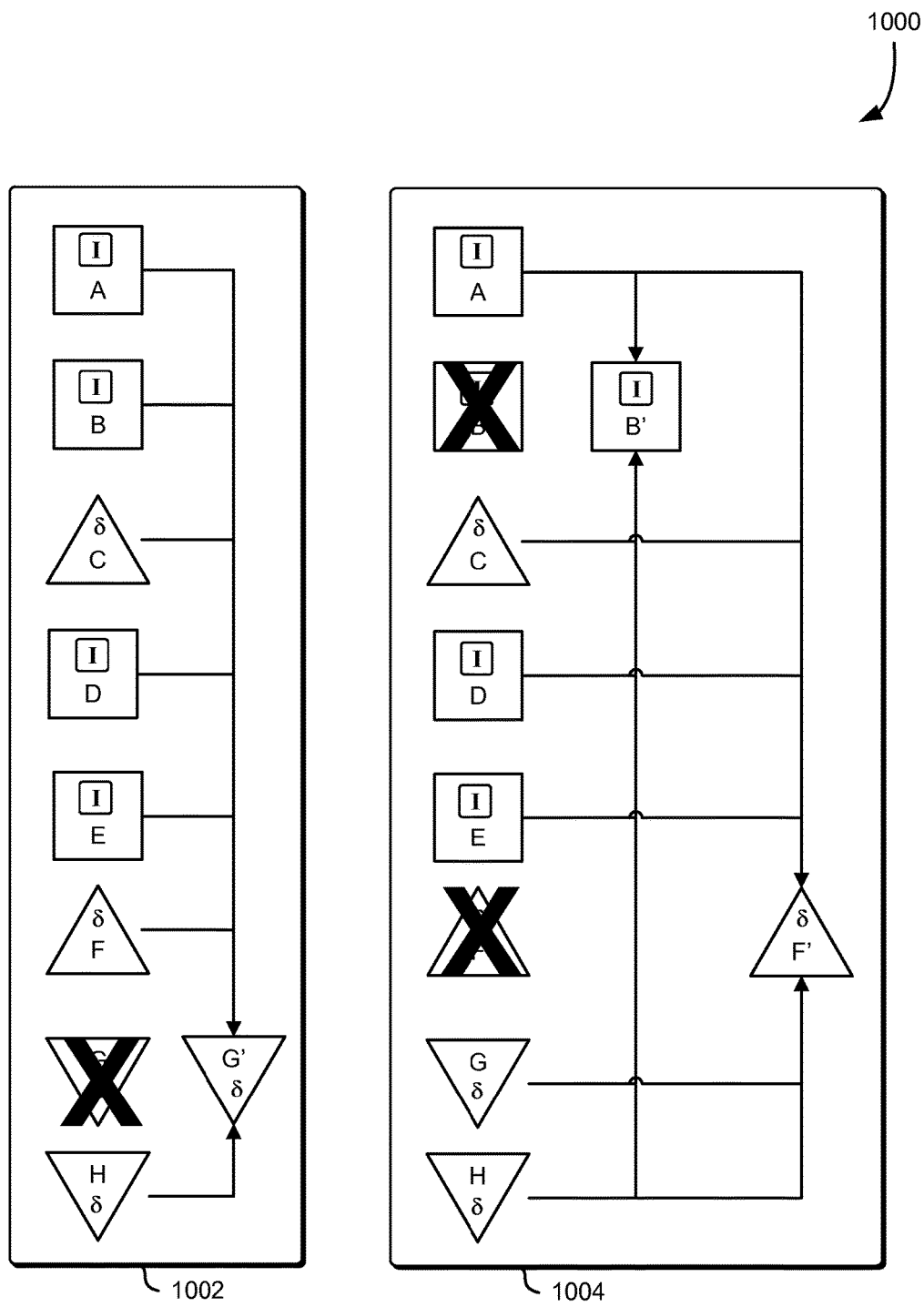
FIG. 10 illustrates an example diagram showing the recovery of shards in a grid encoded data storage system in accordance with an embodiment.

FIG. 10 illustrates an example diagram 1000 showing the recovery of shards in a grid encoded data storage system as described in connection with FIG. 1 and in accordance with an embodiment. In the first set of shards 1002, one of the derived shards (denoted by the letter "G") is damaged and/or unavailable. The derived shard "G" may be repaired by using the redundancy encoding technique associated with the bundle and the other shards in the bundle to produce the replacement derived shard "G'" (or "G-prime"). If, as is illustrated in FIG. 10, the bundle of the first set of shards is an "8:6" encoding, the replacement shard "G-prime" may be produced using any six of the seven shards "A," "B," "C," "D," "E," "F," or "H." It should be noted that while the example illustrates an "8:6" encoding where the derived shards are vertically-derived shards (i.e., because they are inverted triangles), the recovery techniques described in connection with FIG. 10 apply to other encodings, other bundles (e.g., horizontal bundles), and other dimensionalities of the grid (e.g., the third dimension of a three-dimensional grid).

A more complex repair example is illustrated by the second set of shards 1004, where two of the shards in the bundle (e.g., shard "B" and shard "F") are damaged and/or unavailable. In the first repair, the data shard "B" may be repaired using the redundancy encoding technique associated with the bundle and the six other undamaged shards in the bundle (e.g., the shards "A," "C," "D," "E," "G," and "H") to produce the replacement derived shard "B'" (or "B-prime"). In the second repair, the derived shard "F," which is a derived shard of a different bundle but is a data shard in this bundle, may be repaired using the redundancy encoding technique associated with the bundle and the six other undamaged shards in the bundle (e.g., the shards "A," "C," "D," "E," "G," and "H") to produce the replacement derived shard "F'" (or "F-prime"). The first repair and the second repair may be performed sequentially (i.e., by doing the first repair and then the second repair) or may be performed at the same time.

In an embodiment, it is more efficient to perform the first repair and the second repair simultaneously because accessing the storage devices associated with the shards can be very expensive in terms of time or resource cost. The repair of shard "B" requires reading shards "A," "C," "D," "E,"

"G," and "H" in order to perform calculations associated with the redundancy encoding technique to make the repair and the repair of shard "F" requires reading the same six shards. Therefore it may be more efficient to read the six shards once, make both repairs, and then update the two repaired shards and may be considerably more efficient in an embodiment where accessing the storage devices is expensive in terms of time or resource cost.

Figure 11:
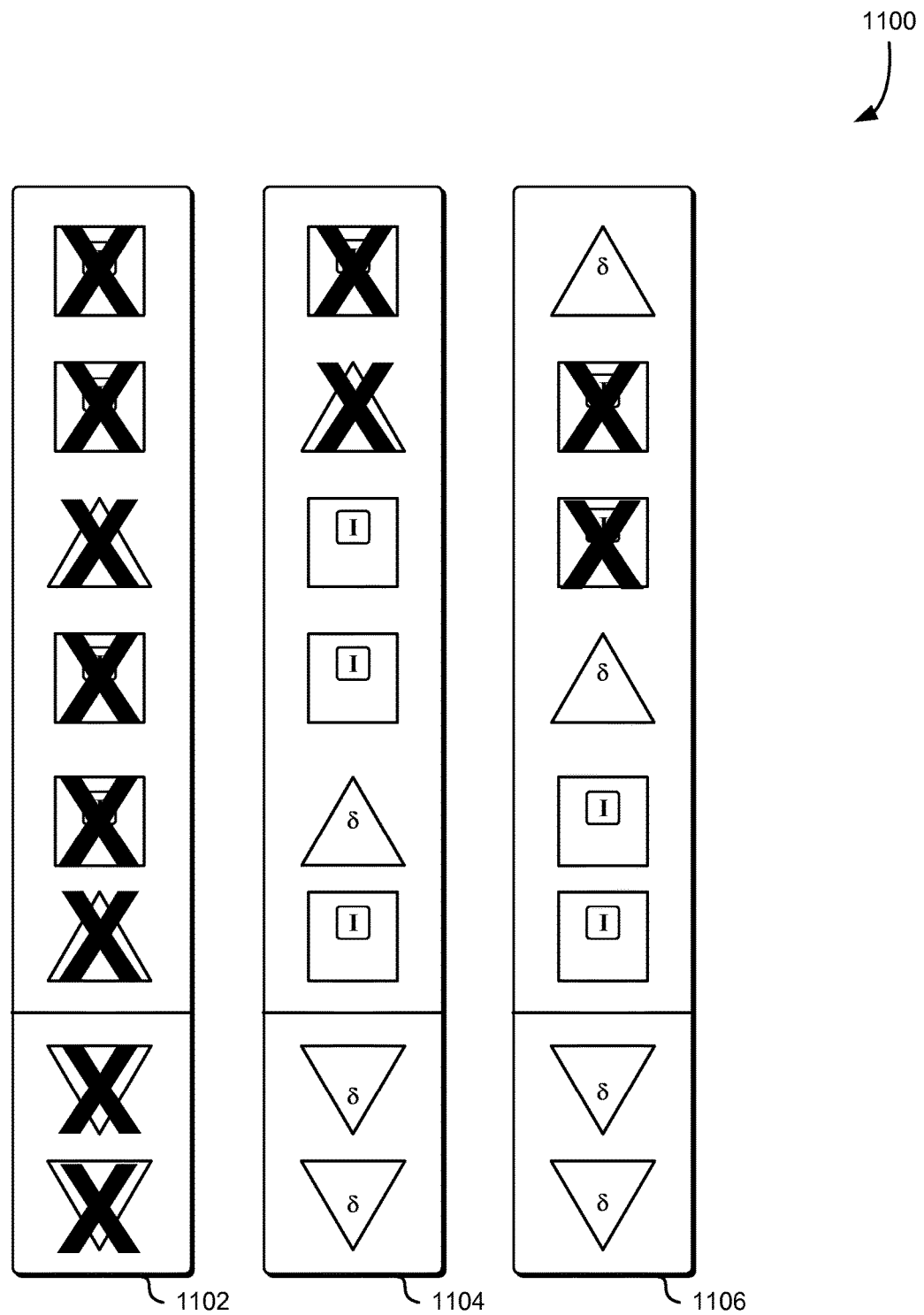
FIGS. 11 to 14 illustrate a first example of a repair of a loss of a plurality of shards from a grid encoded data storage system in accordance with an embodiment.
Figure 12:
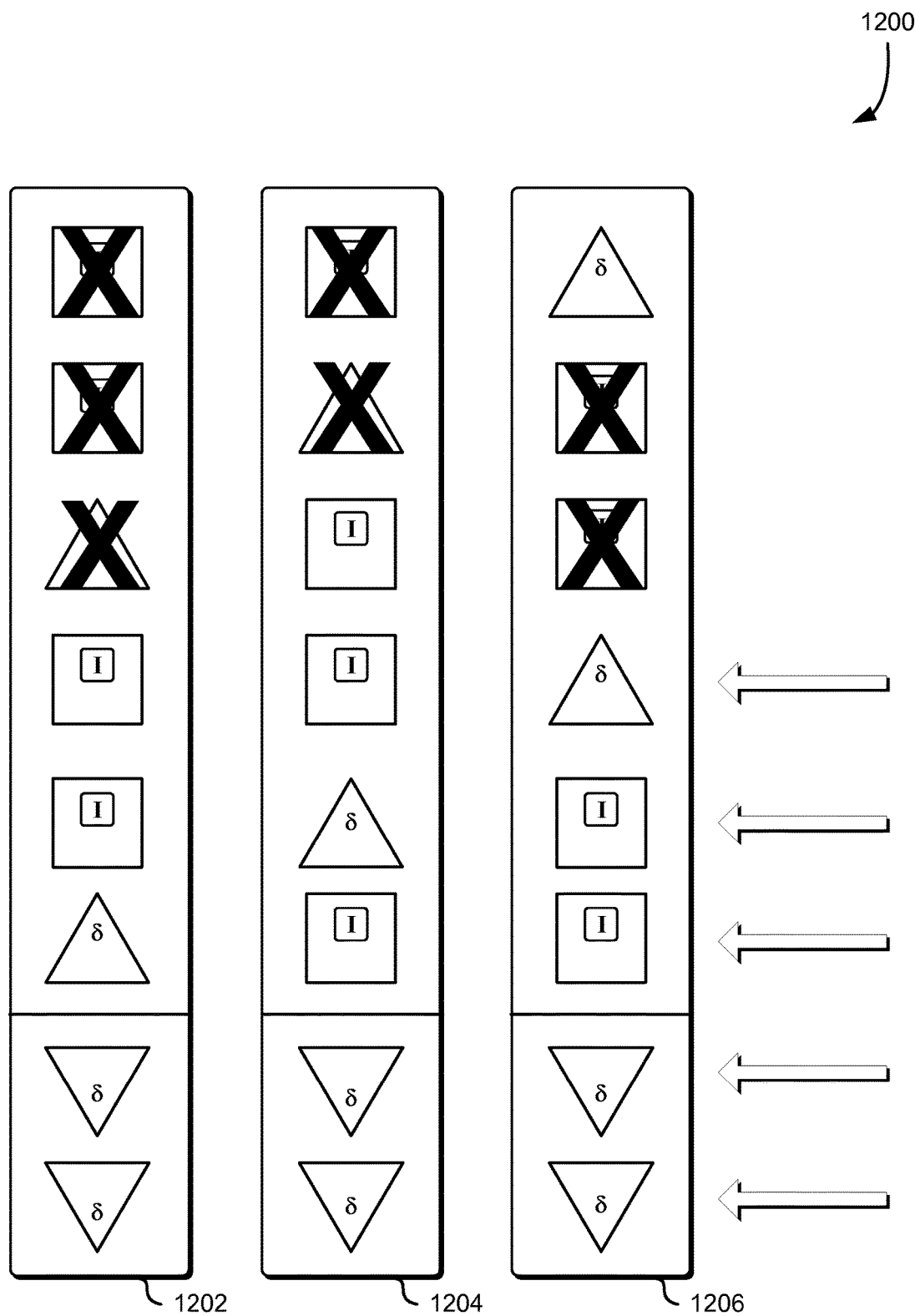

FIGS. 11 to 14 illustrate a first example of a repair of a loss of a plurality of shards from a grid encoded data storage system as described in connection with FIG. 1 and in accordance with an embodiment. FIG. 11 illustrates an example diagram 1100 of a grid with a number of damaged and/or unavailable shards in addition to a damaged and/or unavailable datacenter 1102. FIG. 12 illustrates the first part 1200 of a repair that begins with a horizontal repair. A horizontal repair is a repair of a shard using the horizontal bundle of shards associated with the shard (e.g., the shards in the same row) using the horizontal redundancy encoding scheme associated with that horizontal bundle. For example, a horizontal repair may be performed on a bundle of three shards with a 3:2 parity encoding provided that there are at least two shards in the bundle that do not require repair. So, if there are two shards (e.g., two data shards or one data shard and one horizontally-derived shard) that do not require repair, a horizontal repair of the third shard can be performed using the two shards that do not require repair.

Figure 13:
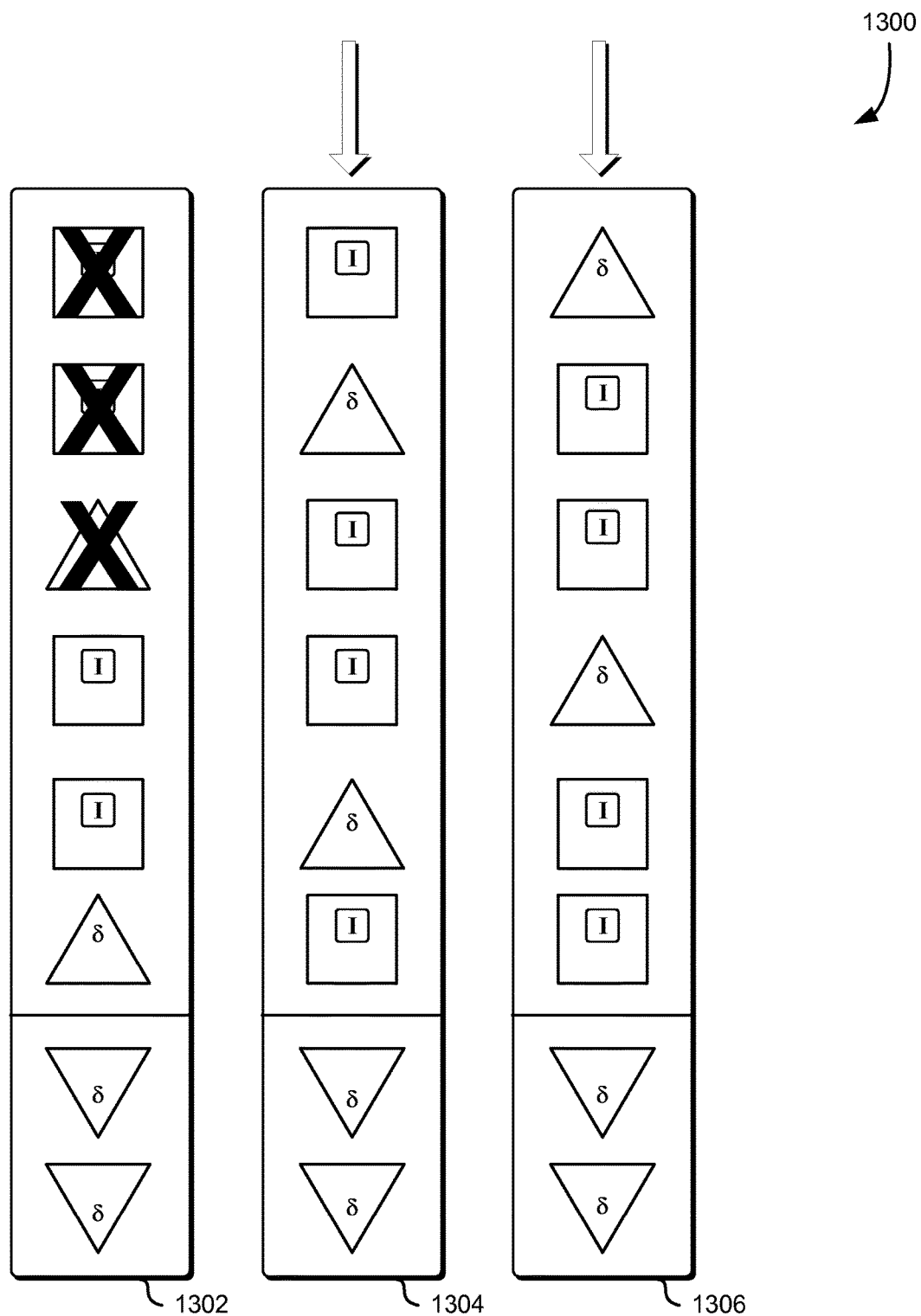
Figure 14:
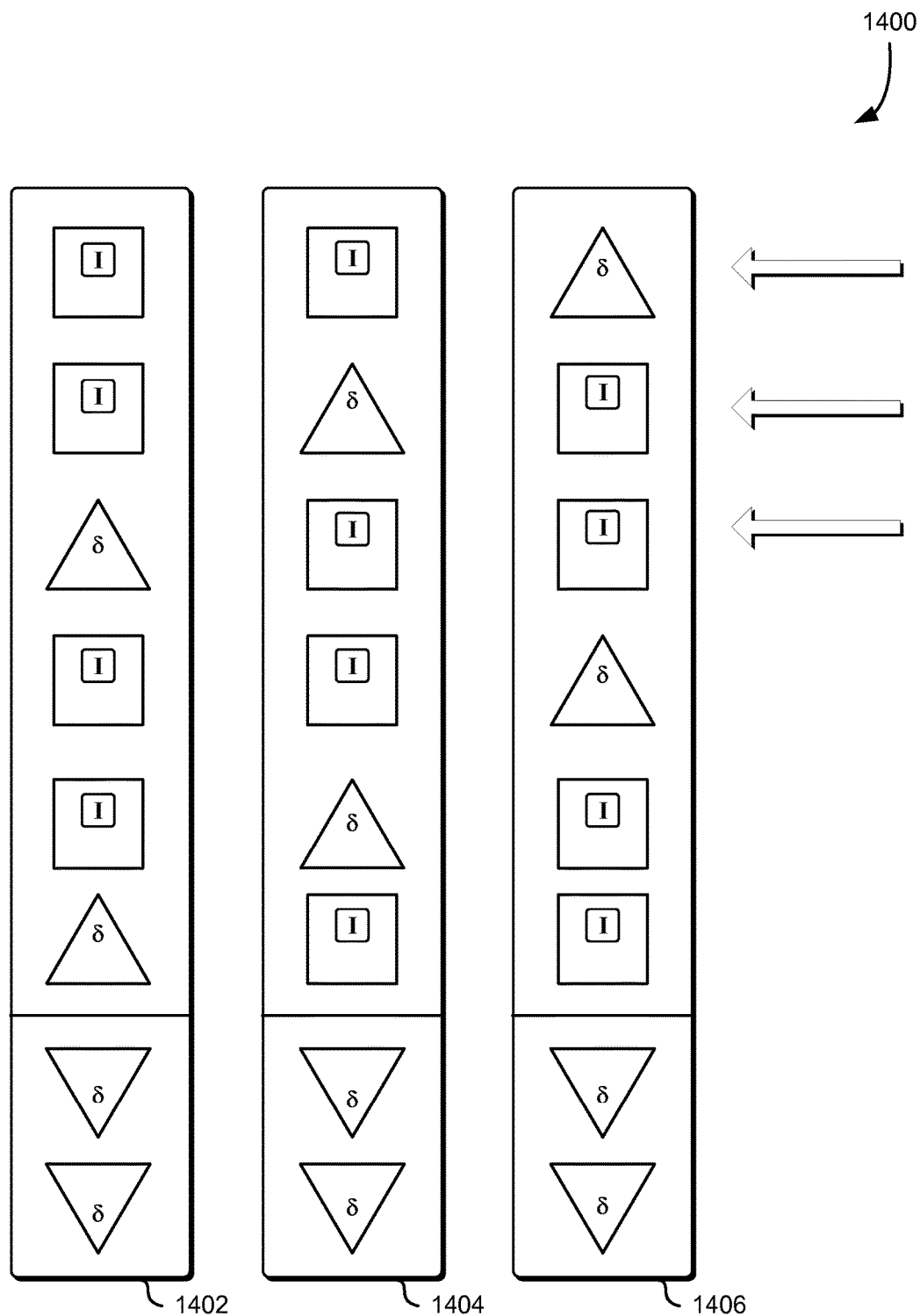

FIG. 13 illustrates the second part 1300 of that repair. FIG. 14 illustrates the third part 1400 of that repair. In FIG. 11, a datacenter 1102 is damaged and/or unavailable and additional shards in a second datacenter 1104 and a third datacenter 1106 are also damaged and/or unavailable. As described above, the order of the repair operations illustrated in FIGS. 11 to 14 can occur in many different orders and/or can occur in parallel (i.e., with multiple steps executing simultaneously). Additionally, partial steps may be performed in that, for example, some portion of the damaged and/or unavailable shards of a column or columns may be repaired and the results of those partial repairs may be stored in temporary storage, then one or more rows may be repaired using those partial repair results in temporary storage, and finally the remainder of the damaged and/or unavailable shards of the column or columns may be repaired. As described above, the order in which repair operations may be performed may vary greatly according to the type and location of the damaged and/or unavailable shards that require repair. In the examples illustrated in FIGS. 11 to 14, the datacenters have corresponding numbers. For example, the datacenter 1102 illustrated in FIG. 11 is the same as datacenter 1202 illustrated in FIG. 12, is the same as datacenter 1302 illustrated in FIG. 13, and is the same as datacenter 1402 illustrated in FIG. 14.

FIG. 12 illustrates a first part 1200 of the repair illustrated in FIGS. 11 to 14. The first part 1200 of the repair starts with the horizontal repair of shards in the datacenter 1202 whose rows have two undamaged shards (the rows indicated by the arrows), one in datacenter 1204, and another in datacenter 1206. In FIG. 12, the rows that still have damaged shards after the first part 1200 of the repair each have two damaged shards and so cannot be repaired using the horizontal repair. As described above, a horizontal repair is a repair of a shard using the horizontal bundle of shards associated with the shard (e.g., the shards in the same row) using the horizontal redundancy encoding scheme associated with that horizontal bundle. In the example illustrated in FIG. 12, a horizontal repair may be performed on a bundle of three shards with a 3:2 parity encoding provided that there are at least two shards in the bundle that do not require repair. So, with two shards that do not require repair, a horizontal repair of the third shard can be performed using the two shards that do not require repair.

For example, in the fourth row of the grid of shards, a data shard in the datacenter 1204 and a derived shard in the datacenter 1206 may be used to repair the data shard in the datacenter 1202. Similarly, in the fifth row of the grid of shards, a derived shard in the datacenter 1204 and a data shard in the datacenter 1206 may be used to repair the data shard in the datacenter 1202. The vertically-derived shards (i.e., the shards below the horizontal line in the datacenters in FIG. 12) also form horizontal bundles so, for example, in the last row of the grid of shards, a first vertically-derived shard in the datacenter 1204 and a second vertically-derived shard in the datacenter 1206 may be used to repair the vertically-derived shard in the datacenter 1202. It should be noted that the horizontal repair of the shards in datacenter 1202 indicated by the arrows can, in some embodiments, be performed simultaneously and/or in parallel.

FIG. 13 illustrates a second part 1300 of the repair illustrated in FIGS. 11 to 14. The second part 1300 of the repair continues with the vertical repair of the two damaged and/or unavailable shards in the datacenter 1304 using the six undamaged shards in the vertical bundle corresponding to the datacenter 1304 and the vertical repair of the two damaged and/or unavailable shards in the datacenter 1306 using the six undamaged shards in the vertical bundle corresponding to the datacenter 1306.

As described above, a vertical repair is a repair of a shard using the vertical bundle of shards associated with the shard (e.g., the shards in the same column) using the vertical redundancy encoding scheme associated with that vertical bundle. In the example illustrated in FIG. 13, a vertical repair may be performed on a bundle of eight shards with an 8:2 Reed-Solomon encoding provided that there are at least six shards in the bundle that do not require repair. So, with six shards that do not require repair, a vertical repair of either the seventh or eighth shard can be performed using the six shards that do not require repair. As with the horizontal repairs described in connection with FIG. 12, the vertical repairs of the columns indicated by the two arrows in FIG. 13 may be performed simultaneously and/or in parallel.

FIG. 14 illustrates a third part 1400 of the repair illustrated in FIGS. 11 to 14. The third part 1400 of the repair continues with the final repair of the remaining three damaged and/or unavailable shards in the datacenter 1402 indicated by the arrows using the undamaged shards from the horizontal bundles as described above. In the example illustrated in FIG. 14, the horizontal repair (as described above) is used to repair the remaining damaged shards. For example, in the first row of the grid of shards, a data shard in the datacenter 1404 and a derived shard in the datacenter 1406 may be used to repair the data shard in the datacenter 1402. Similarly, in the second row of the grid of shards, a derived shard in the datacenter 1404 and a data shard in the datacenter 1406 may be used to repair the data shard in the datacenter 1402. Again, as with the repairs described in connection with FIGS. 11 to 13, the horizontal repairs of the rows indicated by the three arrows in FIG. 14 may be performed simultaneously and/or in parallel.

Figure 15:
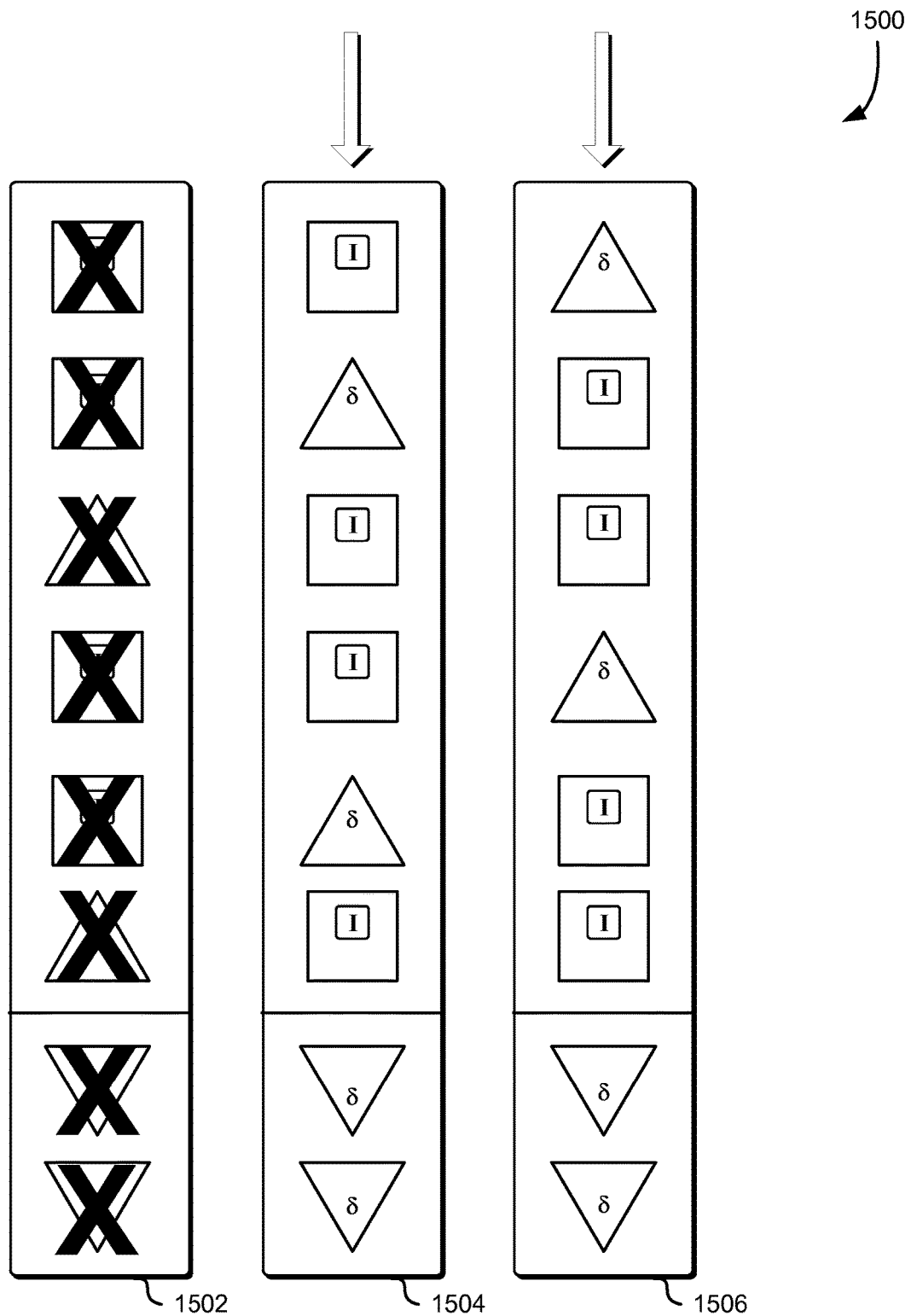
FIGS. 15 and 16 illustrate a second example of repair of a loss of a plurality of shards from a grid encoded data storage system in accordance with an embodiment.
Figure 16:
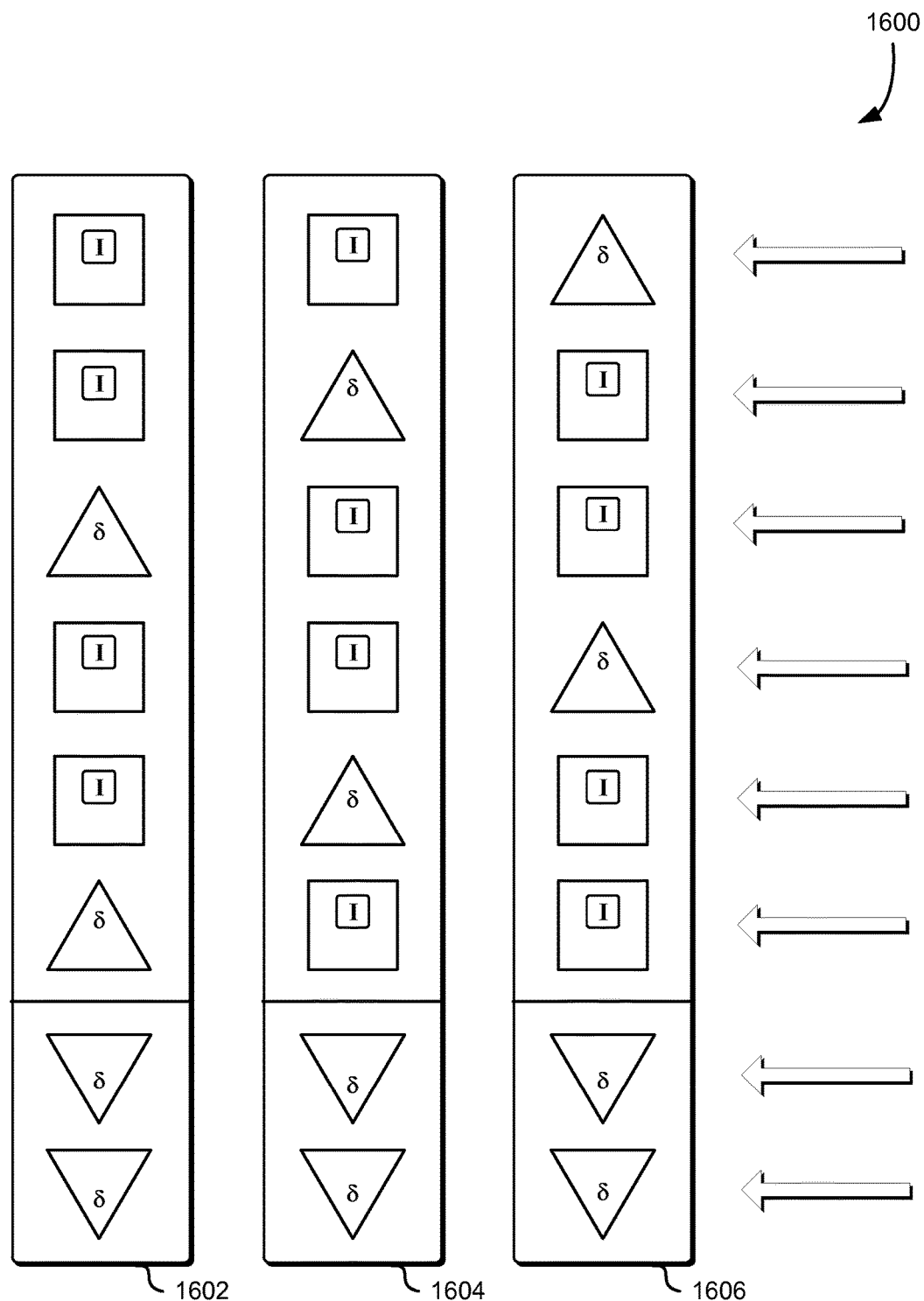

FIGS. 15 and 16 illustrate a second example of a repair of a loss of a plurality of shards from a grid encoded data storage system as described in connection with FIG. 1 and in accordance with an embodiment. As with the examples illustrated in FIGS. 11 to 14, the datacenters illustrated in FIGS. 15 and 16 have corresponding numbers that also correspond with the datacenters illustrated in FIG. 11. For example, the datacenter 1102 illustrated in FIG. 11 is the same as datacenter 1502 illustrated in FIG. 15 and is the same as datacenter 1602 illustrated in FIG. 16.

Starting with the same example diagram 1100 if the grid with a number of lost shards and a lost datacenter 1102 illustrated in FIG. 11, FIG. 15 illustrates the first part 1500 of a repair that begins with a vertical repair and FIG. 16 illustrates the second part 1600 of that repair. FIGS. 15 and 16 illustrate the principle that the repairs may be performed in any number of orders and may still achieve the same result. For example, in FIG. 15, the vertical repairs of datacenter 1504 and datacenter 1506 indicated by the two arrows are the same as the vertical repairs of datacenter 1304 and datacenter 1306 described in connection with FIG. 13. Similarly, the horizontal repairs illustrated in FIG. 16 (as indicated by the arrows) of the shards in datacenter 1602 using the undamaged shards in datacenter 1604 (i.e., datacenter 1504 and datacenter 1104)

Figure 17:
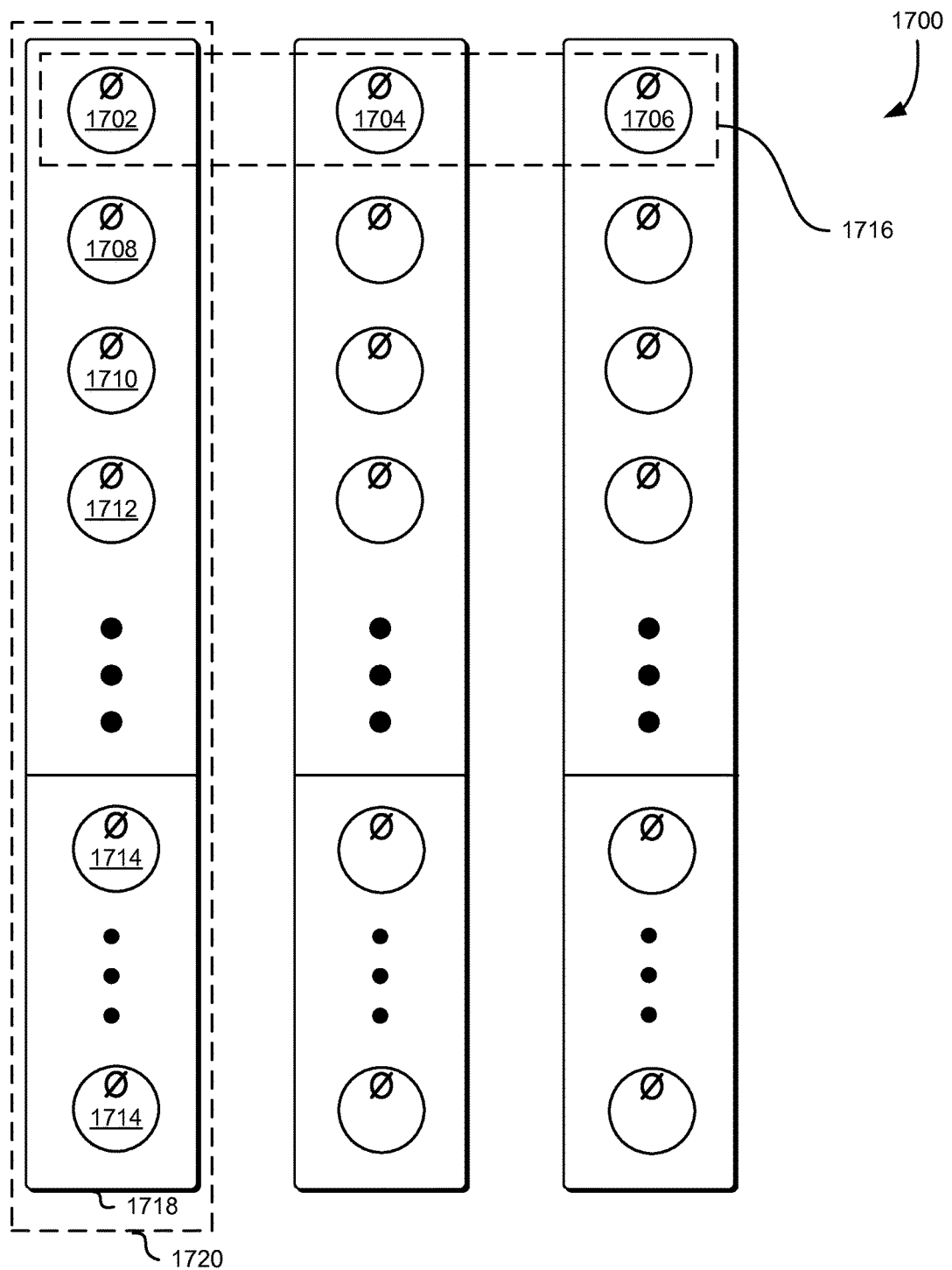
FIG. 17 illustrates an example diagram showing null shards in a grid encoded data storage system in accordance with an embodiment.

FIG. 17 illustrates an example diagram 1700 showing null shards in a grid encoded data storage system as described in connection with FIG. 1 and in accordance with an embodiment. As used herein, null shards are shards which do not contain shard data. Null shards may be represented in a number of different ways depending on the grid encoding used in the grid encoded storage system. In some embodiments, a null shard contains no data and is abstractly or logically represented in grid metadata. In such embodiments, the grid metadata maintains the null shard in a pre-initialized state until such time as the shard is needed to store data. At that time, the grid storage service may allocate data storage corresponding to the null shard and, using that allocated data storage, may convert the null shard to a data shard or to a derived shard.

In some embodiments, a null shard contains a number of null values (also referred to herein as "zero values") that correspond to a data size of the shard associated with the grid of shards. Each shard in a grid of shards must have the same size (or data size) for the redundancy encoding techniques to operate correctly. This is because redundancy encoding techniques operate using slicing techniques based on data offsets. A shard that has a different data size (i.e., that has a different total storage capacity) could not be effectively used with such slicing techniques because the data offsets would not be correct. In an embodiment where the null shard contains a number of null values, each data offset would have the same null value. In some such embodiments, the null values are stored in data storage associated with the null shard. In other such embodiments, the null values are abstractly or logically represented in grid metadata and not actually stored. In such embodiments, the grid metadata maintains a virtual list of nulls for the null shard.

It should be noted that the null values (or zero values) referred to herein may not necessarily be a typical integer zero value although, in some embodiments, the zero values do correspond to integer zero values. It should also be noted that the null values (or zero values) are not typical "nulls" or "null pointer" values (i.e., as used in computer programming) although, in some embodiments, they can be integer zero values. As used herein, a null value of a redundancy encoding technique is the zero value of the finite field associated with the redundancy encoding technique. A field is an algebraic structure that includes addition, subtraction, multiplication, and division operations and that also conforms to certain other mathematical principles (e.g., closure, associativity, commutativity, inverses, identity elements, and so on). One common example of a field is the field of real numbers because the addition of any two real numbers is a real number, the subtraction of any two real numbers is a real number, the multiplication of any two real numbers is a real number, and the division of any two real numbers is a real number. Note that integers are not a field because, for example, one divided by two is not an integer (although integers can be made a field by redefining the division operation).

A finite field (also referred to herein as a "Galois field") is a field with a finite number of elements. One example of a finite field is a set of integers modulo a prime number. For example, the set of integers modulo three (i.e., {0, 1, 2}) form a field based on definition of the various operations within this field and this field is a finite field because there are only three elements. A Galois field (typically denoted GF(n) where "n" is the order of the field) is a finite field that has a number of elements equal to a prime number raised to a positive integer. Typical Galois fields include GF(16), which is 2 (a prime) raised to the $4^{th}$ power, GF(64), which is 2 raised to the $6^{th}$ power, and GF(65536), which is 2 raised to the $16^{th}$ power. Algebraic operations in finite fields are typically represented in terms of single variable polynomials over the finite field (e.g., for GF(65536), the polynomial $x^{16}-x$ factors into linear factors over the field of order 16. Galois fields are described in greater detail below.

As an example of the zero value of the finite field associated with a redundancy encoding technique, a Reed-Solomon encoding technique is a redundancy encoding technique based on single variable polynomials over finite fields. Because it is a finite field, a zero value must exist within the field (i.e., the identity value in addition and the value that, when multiplied by any other element of the field always yields that value). When a zero value is associated with a null shard, it is the zero value of the finite field.

In the example illustrated in FIG. 17, the grid only contains null shards (denoted by a circle with a crossed zero value herein) but the null shards conform to the grid encoding rules. For example, the null shard 1702, the null shard 1704, and the null shard 1706 form a horizontal bundle 1716. Similarly, the null shard 1702, the null shard 1708, the null shard 1710, the null shard 1712, and the null shards 1714 of datacenter 1718 form a vertical bundle 1720. Additional details on the horizontal and vertical bundles of null shards are described below.

Figure 18:
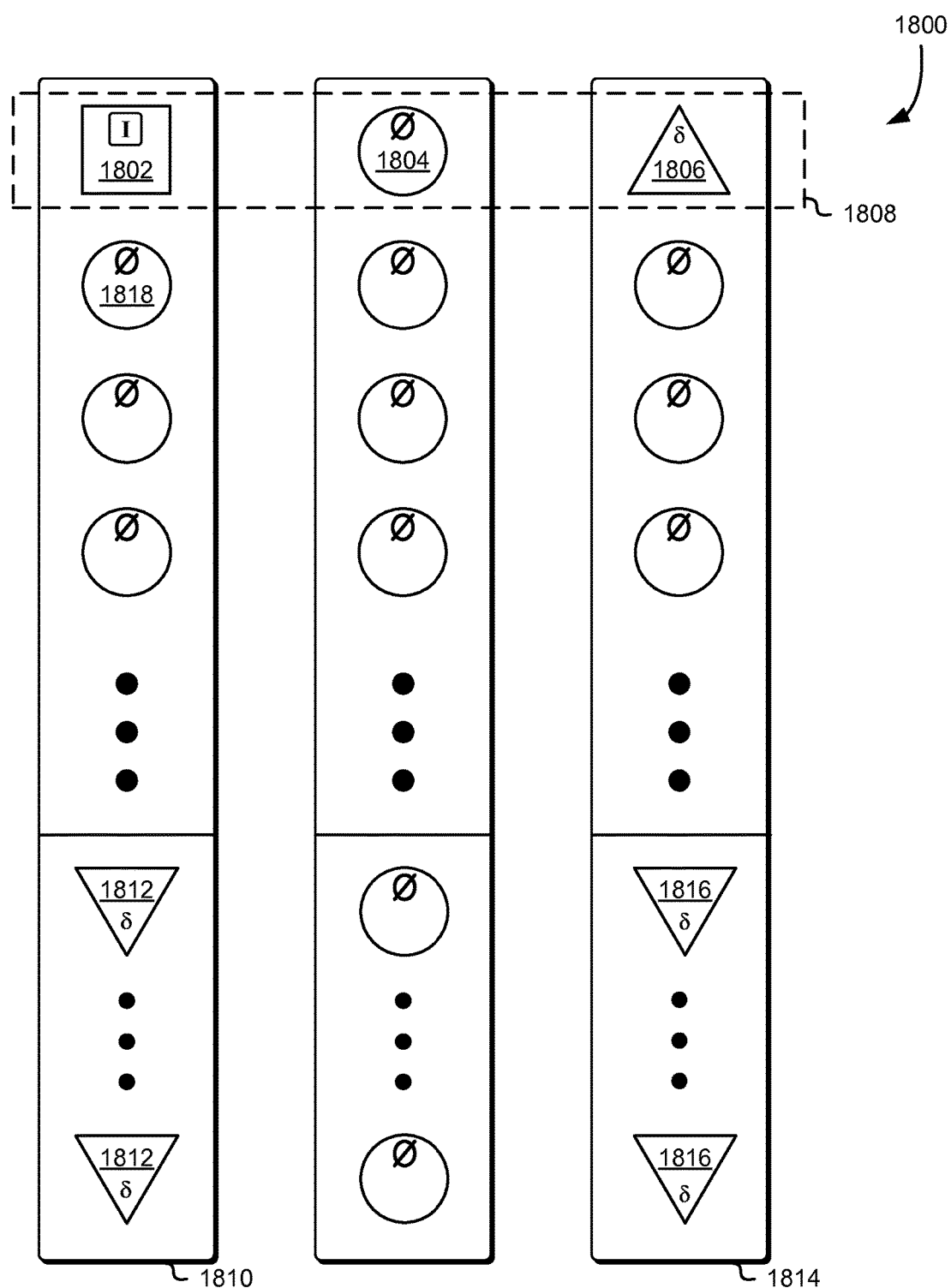
FIG. 18 illustrates an example diagram showing the addition of data to a grid encoded data storage system in accordance with an embodiment.

FIG. 18 illustrates an example diagram 1800 showing the addition of data to a grid encoded data storage system as described in connection with FIG. 1 and in accordance with an embodiment. The addition of data to a null shard of a grid of shards illustrated in FIG. 18 is functionally the same as the addition of data to a data shard in a grid of shards illustrated in FIG. 3 with the exception that the null shards may first need to be converted to appropriately configured non-null shards in grid metadata and may also need to have storage devices associated with the converted null shards (i.e., the null shards converted to non-null shards).

In the example illustrated in FIG. 18, a null shard that is part of a bundle 1808 may be converted to a data shard 1802 and data may be added to that data shard 1802 by, for example, updating the data shard as described above. A null shard may be converted to a data shard (or a derived shard) according to how the null shard is represented. When a null shard is represented in metadata as, for example, a virtual shard, the virtual shard may be converted to a non-virtual shard (i.e., a non-null shard) by locating a storage device, allocating space to store the shard data, and associating the storage device with the shard, thereby making it a non-virtual shard. Virtual shards may be, for example, virtual null shards, virtual data shards (i.e., virtual shards specifying a predetermined data value), or virtual derived shards (i.e., virtual shards specifying a predetermined derived value). When the null shard is represented by a set of stored zero values, the conversion may include changing the status of the shard in grid metadata and beginning to overwrite the zero values.

In the example illustrated in FIG. 18, another null shard that is part of the bundle 1808 may be converted to a horizontally-derived shard 1806 and updated based on the data shard 1802 and the null shard 1804. It should be noted that the null shard 1804 does not need to be converted to a data shard in order for the horizontally-derived shard 1806 to be derived. Additionally, either of the two remaining null shards in the horizontal bundle 1808 may be converted to the horizontally-derived shard. For example, it may be preferable to convert the null shard 1804 to a horizontally-derived shard to balance the data and derived shards in a particular datacenter as described above.

As a result of the update to the data shard 1802, one or more null shards of the vertical bundle corresponding to the first datacenter 1810 may be converted to vertically-derived shards 1812 and updated based on the updated data shard 1802 and one or more null shards of the vertical bundle corresponding to the second datacenter 1814 may be converted to vertically-derived shards 1816 and updated based on the updated horizontally-derived shard 1806. Again, it may not be necessary to perform any operations associated with the other null shards in the vertical bundle associated with the datacenter 1810 or with the other null shards in the vertical bundle associated with the datacenter 1814.

In the example illustrated in FIG. 18, the update to the data in data shard 1802 may require the conversion of several shards from null shards to non-null shards. If, for example, there are five vertically-derived shards in each vertical bundle, the first data update to data shard 1802 may require converting twelve shards (one data shard 1802, one derived shard 1806, five vertically-derived shards 1812, and five vertically-derived shards 1816). Updating this many shards may be expensive in terms of time and/or resources. However, the grid may be incrementally updated and this expense amortized in that, for example, if the next data update was to a data shard corresponding to null shard 1804, only six shards would need to be converted (one data shard and five vertically-derived shards) and, if the update after that was to a data shard corresponding to null shard 1818, only two shards would need to be converted (one data shard and one horizontally-derived shard).

Figure 19:
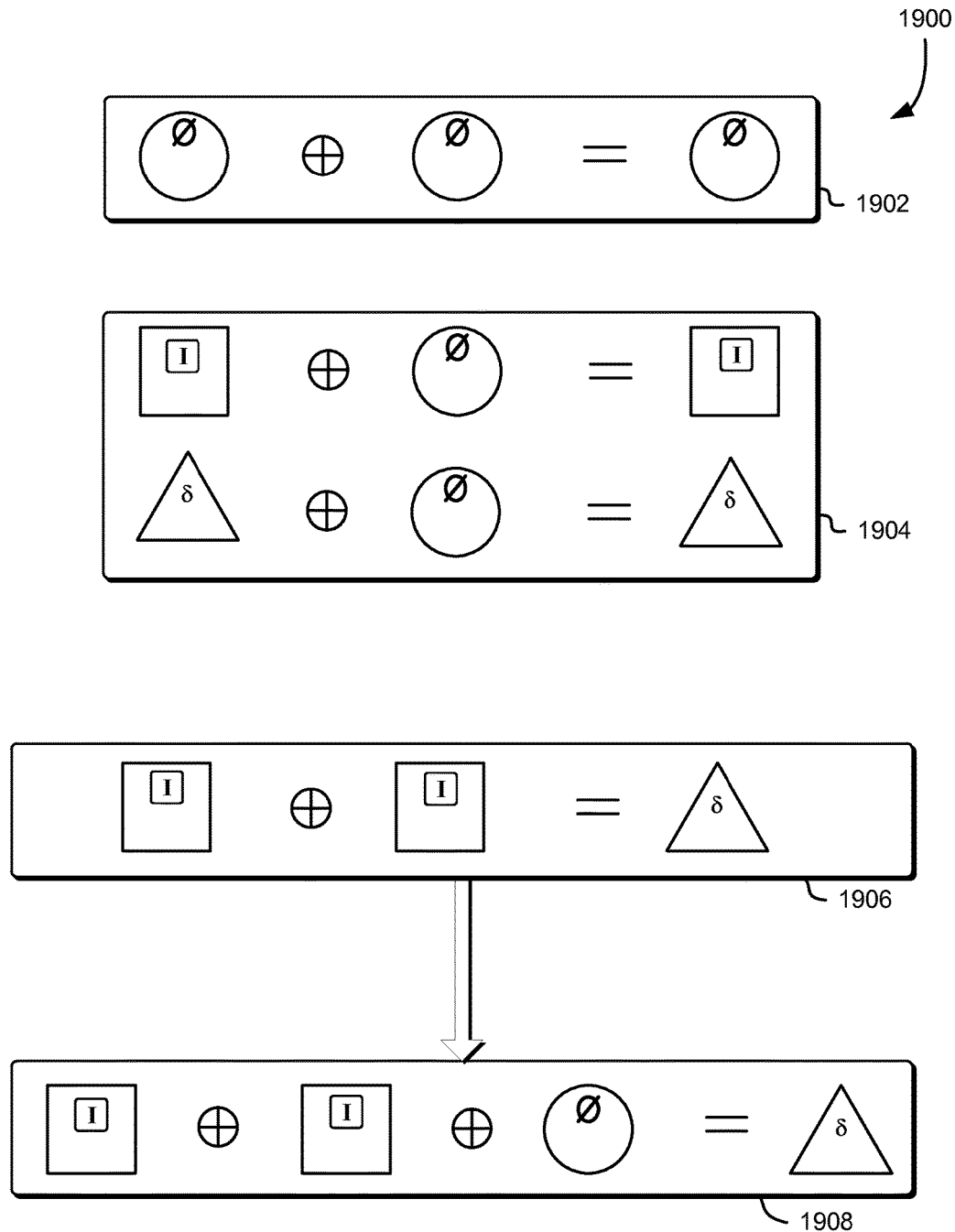
FIG. 19 illustrates an example diagram showing operations associated with a grid encoded data storage system in accordance with an embodiment.

FIG. 19 illustrates an example diagram 1900 showing operations associated with a grid encoded data storage system as described in connection with FIG. 1 and in accordance with an embodiment. The examples illustrated in FIG. 19 hold for any linear redundancy code such as, for example, parity, Reed-Solomon, or other such codes. The operation illustrated in FIG. 19 is an addition operation over the finite field, which in the case of the redundancy codes described herein, is an "exclusive or" (also referred to herein as "XOR") operation, which is illustrated herein as "⊕". The operands of the XOR operations are binary values that represent the coefficient of a polynomial over the finite field. For example, in the Galois field GF(65536), a first polynomial over the finite field may be, for example, $x^{15}+x^{12}+x^7+x^3+x$. This first polynomial may be represented by the binary value "1001 0000 1000 1010" (with spaces added for clarity) where each "1" represents a non-zero coefficient (note that in this field, the coefficients can only be "1" or "0"). A second polynomial over the finite field may be, for example, $x^{13}+x^{11}+x^{10}+x^7+x^4+x^3+x^2+x^1+x+1$. This second polynomial may be represented by the binary value "0010 1100 1001 1111." The addition of these two values (which is defined as XOR in this finite field) is "1011 1100 0001 0101," which corresponds to the polynomial $x^{15}+x^{13}+x^{12}+x^{11}+x^{10}+x^4+x^2+1$. In this field, the zero value is simply 0, which is "0000 0000 0000 0000."

The first example operation 1902 shows that a null shard XORed with another null shard gives a null shard. This is illustrated by the fact that any number of zeros XORed with the same number of zeros, gives that number of zeros. That is, "0000 0000 0000 0000"⊕"0000 0000 0000 0000" is "0000 0000 0000 0000" for any corresponding number of zero values. The second example operation 1904 shows that any shard (e.g., a data shard or a derived shard) XORed with a null shard gives that same shard. This is illustrated by the fact that any value XORed with a zero value yields that same value. The third example operation shows that, if a shard XORed with another shard yields a derived shard as is shown in step 1906, then XORing a null shard to those shards does not change the resulting value. This property of a redundancy code is described in more detail below.

Figure 20:
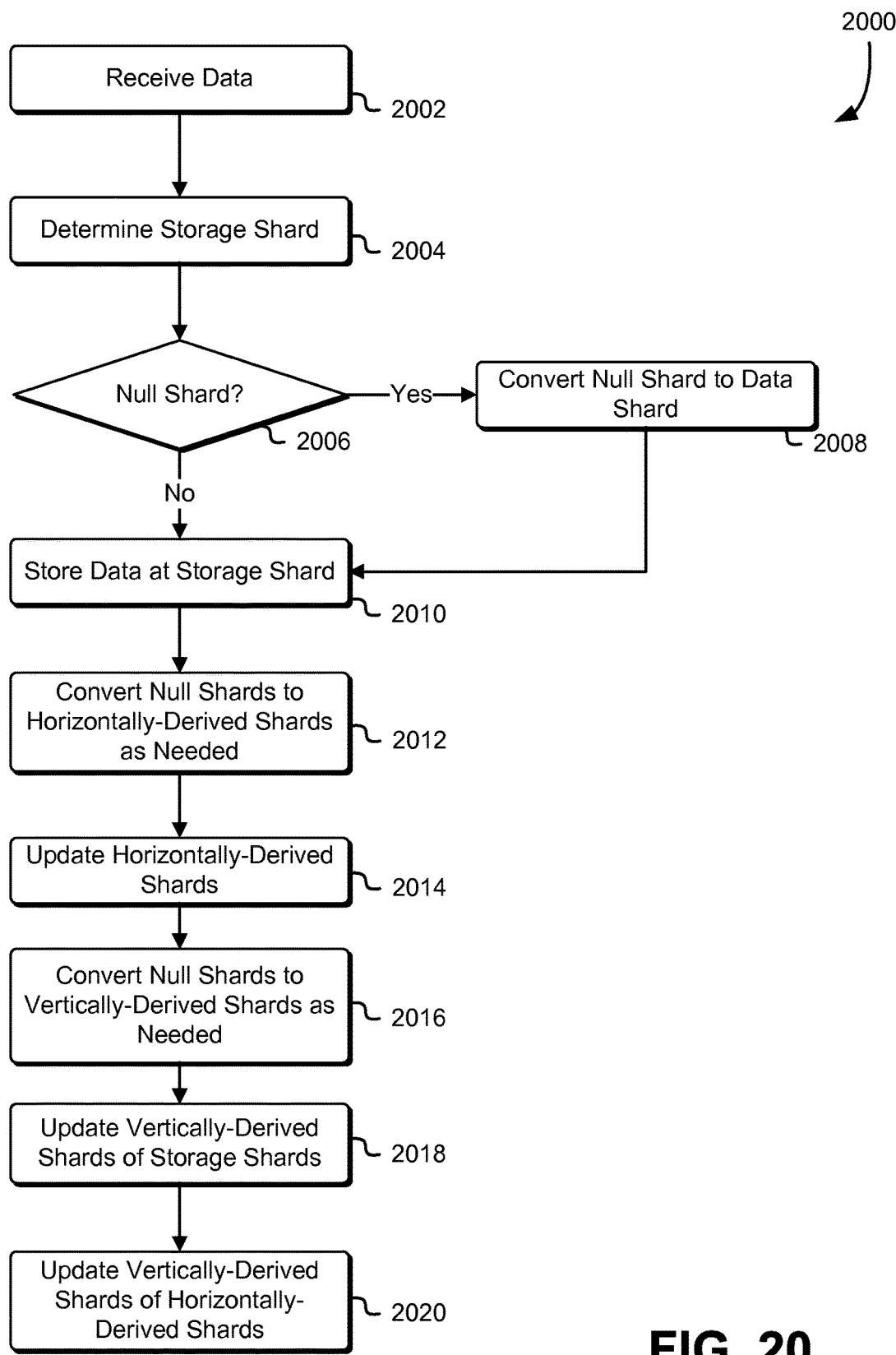
FIG. 20 illustrates an example process for performing an incremental update of a grid encoded data storage system in accordance with an embodiment.

FIG. 20 illustrates an example process 2000 for performing an incremental update of a grid encoded data storage system as described in connection with FIG. 1 and in accordance with an embodiment. A grid storage service such as the grid storage service 116 described in connection with FIG. 1 may perform the example process 2000 illustrated in FIG. 20. A grid storage service may first receive data 2002 for storage in a grid of shards and may determine 2004 the storage shard or shards where the data will be stored. It should be noted that, while the process illustrated in FIG. 20 is described with respect to receiving data for storage, the process may also be performed in response to a repair request such as those described herein. In an embodiment where the process illustrated in FIG. 20 is performed in response to a repair the step to determine 2004 the data storage shard or shards would be a step to determine the shard or shards to repair. In some embodiments, the null shards that will be converted to data storage shards are predetermined when the grid is constructed. In some other embodiments, the null shards that will be converted to data storage shards are dynamically determined as needed, based on, for example, balancing grid storage, geographical location of the shard and/or the customer, or other such considerations.

If the determined shard or shards are null shards 2006, the grid storage service may next perform one or more operations to convert 2008 the null shard or shards to data shards as described above before storing the data 2010 in the shard or shards. The grid storage service may then determine whether any of the null shards in the row of the data shard need to be converted to horizontally-derived shards. For example, in a "3:2" parity encoding, there should be two data shards and one parity shard in each row. At the first data addition to that row, there may be three null shards in that row. In such an example, one of the null shards would be converted to a horizontally-derived shard. Conversely, on the second data addition to that row, there may be one data shard, one null shard, and one horizontally-derived shard, which had been converted from a null shard during the first data addition. In this example, it would not be necessary to convert any null shards to horizontally-derived shards. As with the data storage shard or shards, the null shards that may be converted to horizontally-derived shards may be predetermined and/or may be dynamically determined during the performance of the example process 2000 described herein.

After converting any null shards to horizontally-derived shards 2012 if needed, the grid storage service may then update one or more horizontally-derived shards of the row 2014, which is described herein in connection with FIGS. 4 and 5. The grid storage service may next determine whether any of the null shards in the same corresponding column as the data shard need to be converted to vertically-derived shards and/or whether any null shards in the same corresponding column as the horizontally-derived shards need to be converted to vertically-derived shards. As with the horizontally-derived shards, the first update to a data shard or a horizontally-derived shard in a column may require the conversion of one or more null shards in that column to vertically-derived shards, but second or subsequent updates to data shards or horizontally-derived shards in that column may not require the conversion of null shards in that column to vertically-derived shards (e.g., because all of the null shards that needed to be converted to vertically-derived shards had already been converted to vertically-derived shards). As with the data storage shard or shards and the horizontally-derived shards, the null shards that may be converted to vertically-derived shards may be predetermined and/or may be dynamically determined during the performance of the example process 2000 described herein.

After converting any null shards to vertically-derived shards 2016 as needed, including any null shards that may be converted in the same corresponding column as the data shard or shards as well as any null shards that may be converted in the same corresponding column as the horizontally-derived shards, the grid storage service may update 2018 any vertically-derived shards in the same corresponding column as the data storage shard or shards (as described herein in connection with FIGS. 4 and 5) and may update 2020 any vertically-derived shards in the same corresponding column as the updated horizontally-derived shard or shards (also as described herein in connection with FIGS. 4 and 5).

Figure 21:
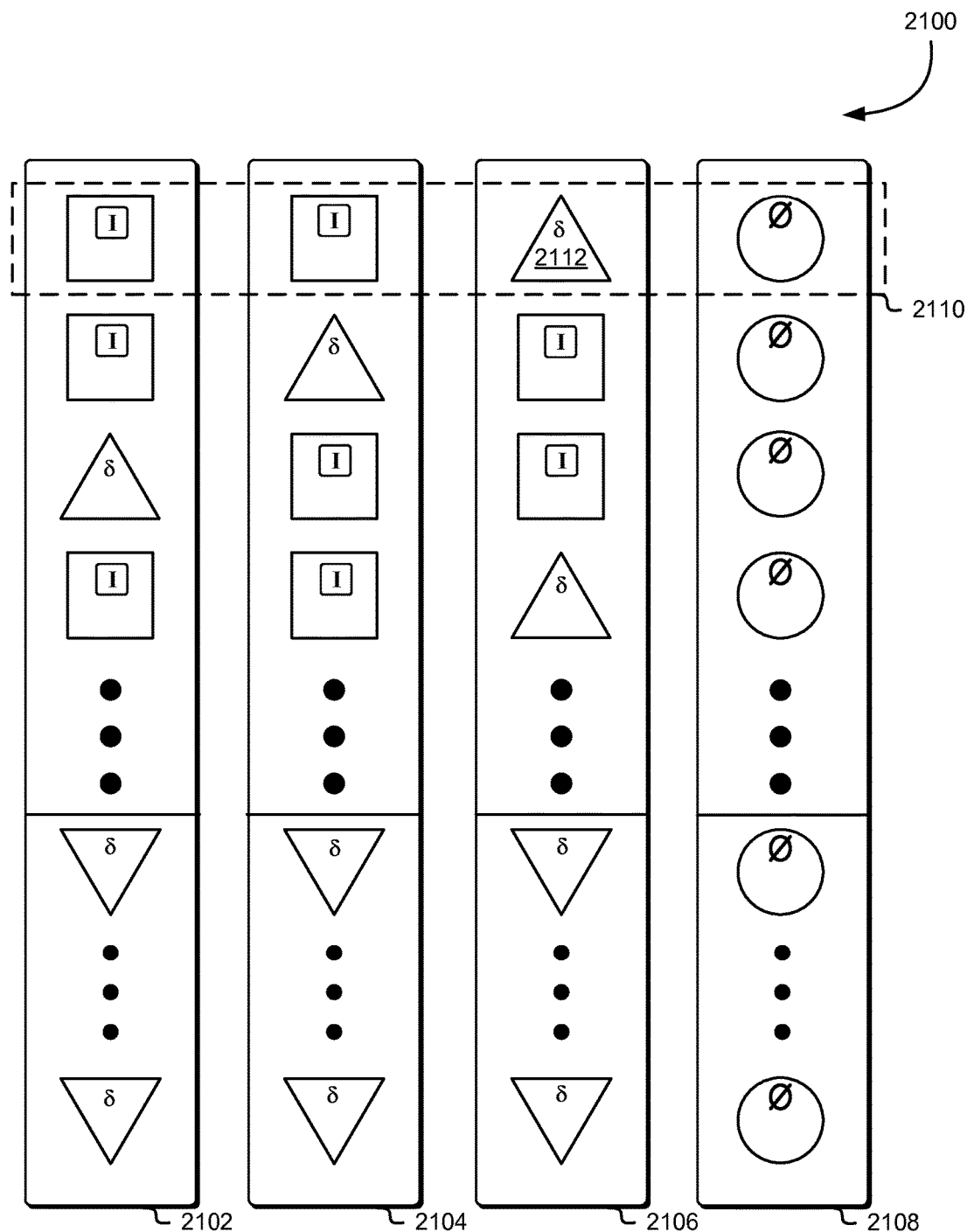
FIG. 21 illustrates an example diagram showing the addition of a datacenter to a grid encoded data storage system in accordance with an embodiment.

FIG. 21 illustrates an example diagram 2100 showing the addition of a datacenter to a grid encoded data storage system as described in connection with FIG. 1 and in accordance with an embodiment. In the example illustrated in FIG. 21, a fourth datacenter 2108 is added to a first datacenter 2102, a second datacenter 2104, and a third datacenter 2106. In the example illustrated in FIG. 21, each of the four datacenters corresponds to a vertical bundle and the fourth datacenter 2108 is added as an empty datacenter (i.e., with all null shards) with the same redundancy encoding technique as the other three datacenters in that it has the same number of shards, the same number of vertically-derived shards, and the same redundancy code as the other three datacenters. The four datacenters may be in geographically separate locations or may be in shared locations. The four datacenters may also be "virtual" datacenters in that they may be logical designations of a grid of shards with separate and/or shared storage devices as well as separate and/or shared geographical locations.

The addition of the datacenter 2108 adds a new null shard to horizontal bundle 2110. As described above, the addition of a null shard to a bundle may not alter the mathematical calculation of the horizontally-derived shard 2112 in the bundle 2110. However, because the redundancy encoding technique used in association with the horizontal bundle 2110 may be based on the number of shards in the bundle, the derived shard 2112 may need to be recalculated. In an embodiment, derived shards such as derived shard 2112 are not recalculated if, for example, the horizontal redundancy code is selected such that the addition of the new shard to the bundle does not alter the result of the encoding.

For example, the horizontal bundle 2110 may include two data shards and one horizontally-derived parity shard (e.g., a "3:2" parity encoding) before the addition of the null shard in the fourth datacenter 2108. The horizontally-derived shard of such a bundle may be calculated by computing the parity of the two data shards. The horizontal bundle 2110 may include two data shards, one horizontally-derived shard 2112, and one null shard after the addition of the fourth datacenter 2108. A derived shard derived using 3:2 parity (e.g., with two data shards and one parity shard) may not need to be recalculated with 4:3 parity (e.g., with two data shards, one null shard, and one parity shard) because the derived shard value may be the same.

Conversely, if the null shard in the fourth datacenter 2108 will later be converted to a data shard, the horizontally-derived shard 2112 may need to be calculated based on the "4:3" parity encoding with the new data shard in the fourth datacenter 2108. Additionally, if the null shard in the fourth datacenter 2108 will later be converted to a horizontally-derived shard (resulting in a "4:2" encoding or, with the conversion of the horizontally-derived shard 2112 to a data shard, a "4:3" parity encoding), the calculation for each of the one or more horizontally-derived shards in the horizontal bundle 2110 may also need to be redone. Additionally, each of the other horizontally-derived shards in the grid may also need to be updated and/or regenerated based on the new horizontal bundle redundancy encoding technique. In some embodiments, all of the horizontally-derived shards will be discarded and a full repair of the grid performed using the new horizontal bundle redundancy encoding technique as a result of adding the fourth datacenter 2108.

Figure 22:
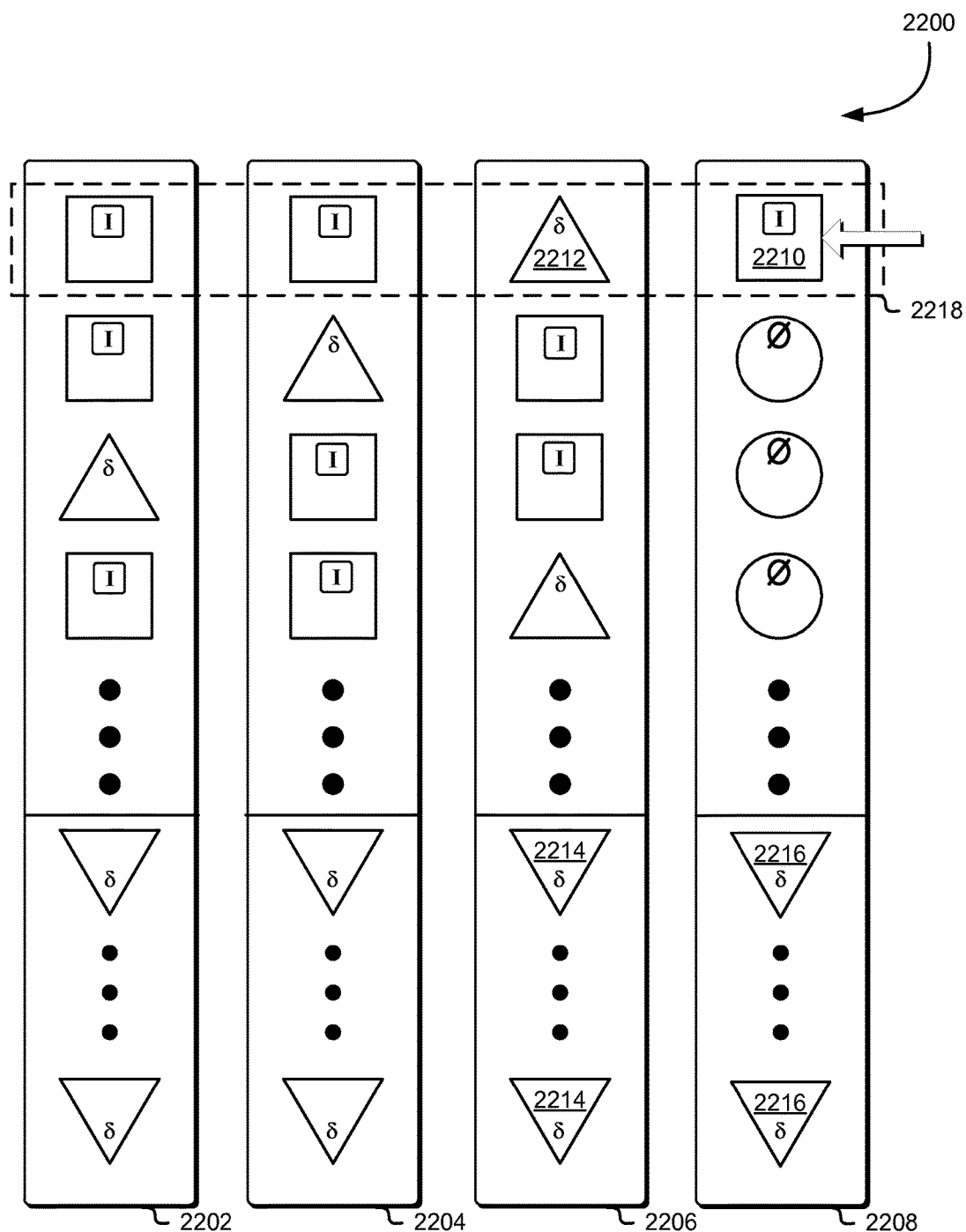
FIG. 22 illustrates an example diagram showing the addition of data to a grid encoded data storage system in accordance with an embodiment.

FIG. 22 illustrates an example diagram 2200 showing the addition of data to a grid encoded data storage system as described in connection with FIG. 1 and in accordance with an embodiment. In the example illustrated in FIG. 22, a fourth datacenter 2208 has been added to a first datacenter 2202, a second datacenter 2204, and a third datacenter 2206, such as described herein in connection with FIG. 21. In the example illustrated in FIG. 22, each of the four datacenters corresponds to a vertical bundle (e.g., each of the datacenters is a vertical bundle of shards, with shards and vertically-derived shards). A null shard in the fourth datacenter 2208 may be converted to a data shard 2210 and data may be stored in the data shard 2210 as indicated by the arrow.

As a result of the change to the data shard 2210, the horizontally-derived shard 2212 may be updated and/or regenerated, the vertically-derived shards 2216 of the data shard 2210 may be updated and/or regenerated, and the vertically-derived shards 2214 of the horizontally-derived shard 2212 may be updated and/or regenerated. In some embodiments, all of the horizontally-derived shards and/or all of the vertically-derived shards will be discarded. For example, tapes that are associated with the vertically-derived shards may be erased and returned to a blank tape store or disks that are associated with the vertically-derived shards may be re-initialized made available for other storage. Additionally, grid metadata associated with the vertically-derived shards may be updated to indicate the old storage device has been discarded. A full repair of the grid may be performed using the new horizontal bundle redundancy encoding techniques and the same vertical bundle redundancy encoding techniques as were used to generate the grid before the addition of the fourth datacenter 2208. In some embodiments, the full repair is made to a separate grid with a separate set of grid metadata and then, when the repair is complete, the separate grid is substituted for the damaged grid.

Figure 23:
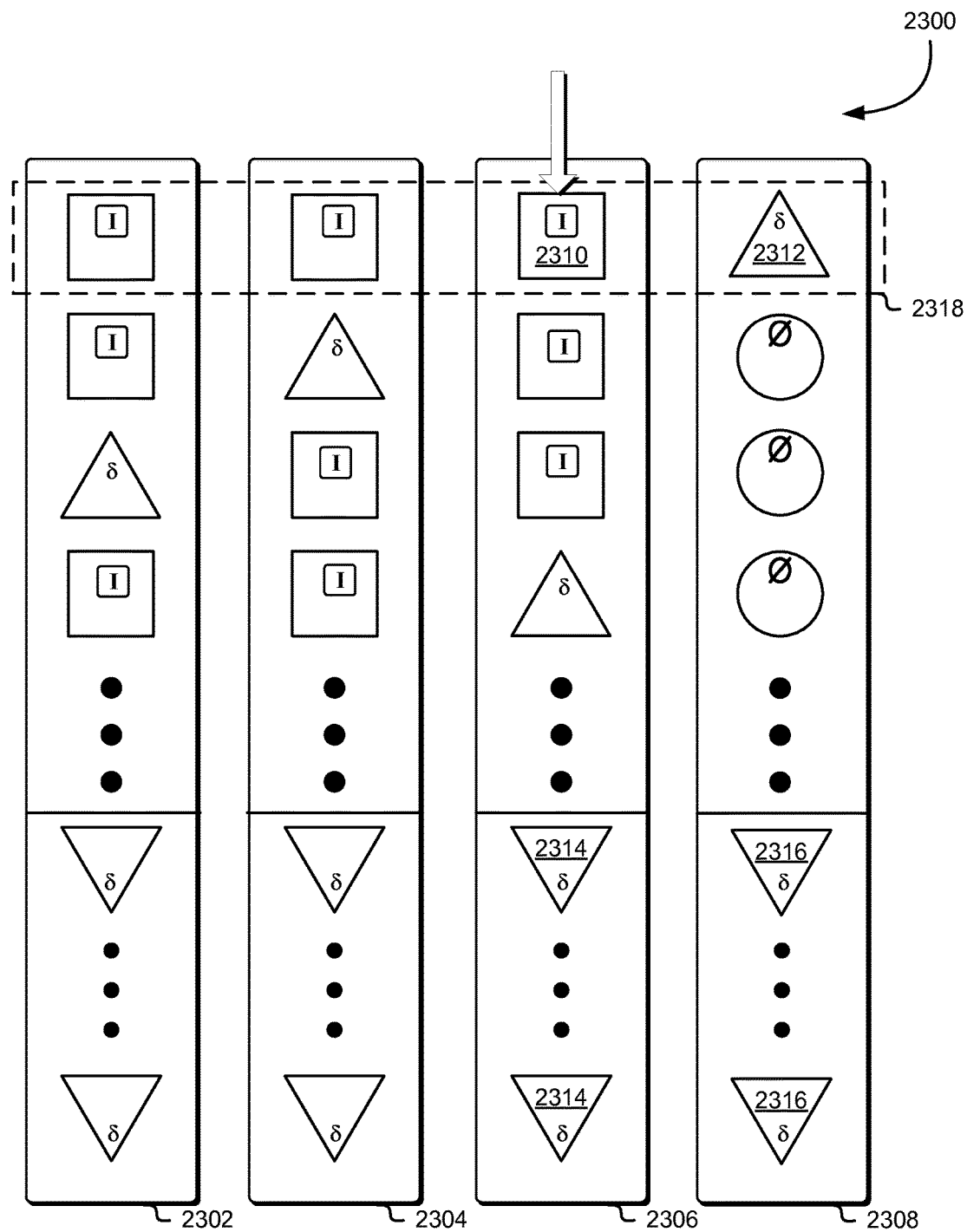
FIG. 23 illustrates an example diagram showing the addition of data to a grid encoded data storage system in accordance with an embodiment.

FIG. 23 illustrates an example diagram 2300 showing the addition of data to a grid encoded data storage system as described in connection with FIG. 1 and in accordance with an embodiment. In the example illustrated in FIG. 23, a fourth datacenter 2308 has been added to a first datacenter 2302, a second datacenter 2304, and a third datacenter 2306 as described herein in connection with FIG. 21. In the example illustrated in FIG. 23, rather than adding data to the null shard, the data is added to a shard that was a horizontally-derived shard, converting the shard to a data shard 2310 (e.g., by discarding the horizontally-derived shard and replacing it with a data shard) as indicated by the arrow. The null shard in the fourth datacenter 2308 may then be converted to a horizontally-derived shard and updated, and the vertically-derived shards 2314 and 2316 may be updated as described herein.

The decision to convert the null shard in the fourth datacenter 2308 to a horizontally-derived shard 2312 rather than to convert the null shard to a data shard may be made based at least in part on balancing the horizontally-derived shards and/or may be based at least in part on other aspects of the grid including, for example, the location of the datacenter containing the null shard, the location of the datacenter containing the horizontally-derived shard, or other such grid aspects. For example, as described above, balancing shards (e.g., distributing data shards and/or derived shards across datacenters) may improve the redundancy and durability of a grid of shards, thereby making the grid of shards more tolerant of datacenter loss. Balancing shards may also improve the efficiency of a grid of shards because, for example, data shards may be slower to access than derived shards and balancing may provide for better bandwidth and/or throughput during repair operations.

Figure 24:
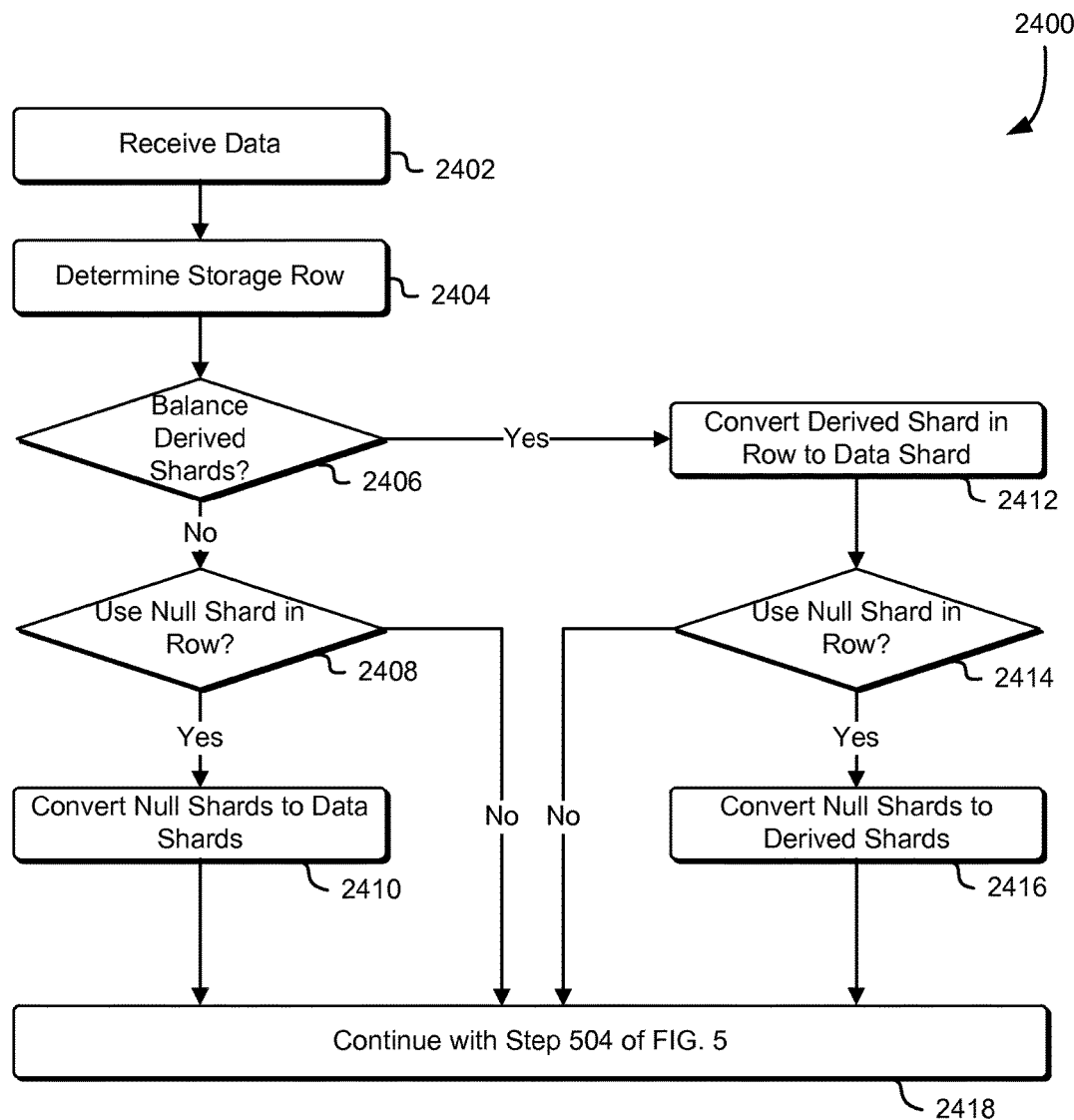
FIG. 24 illustrates an example process for adding data to a grid encoded data storage system in accordance with an embodiment.

FIG. 24 illustrates an example process 2400 for adding data to a grid encoded data storage system as described in connection with FIG. 1 and in accordance with an embodiment. A grid storage service such as the grid storage service 116 described in connection with FIG. 1 may perform the example process 2400 illustrated in FIG. 24. The grid storage service may first receive data 2402 to store in the grid of shards which includes a new datacenter of null shards as described herein in connection with FIGS. 21, 22, and 23. The grid storage service may determine where to store the data which may include a determination 2404 of the storage row. The grid storage service may next determine 2406 whether the derived shards of the storage row should be balanced and, if so, may convert 2412 one or more derived shards in the row to data shards. The grid storage service may then determine 2414 whether any null shards in the row should be used for the horizontally-derived shard. If the grid storage service does not determine 2414 to use null shards for the horizontally-derived shard, the data storage may continue 2418 updating the grid using the process described in connection with FIG. 5 (i.e., starting with the step to select 504 a data shard where the data may be stored). If the grid storage service does determine 2414 to use null shards for the horizontally-derived shard, the data storage may first convert 2416 one or more null shards to horizontally-derived shards and then continue 2418 updating the grid using the process described in connection with FIG. 5 (i.e., starting with the step to select 504 a data shard where the data may be stored).

If the grid storage service determines not to balance the derived shards of the storage row, the grid storage service may determine 2408 whether any null shards in the row should be used to store the data. If the grid storage service does not determine 2408 to use null shards to store the data, the data storage may continue 2418 updating the grid using the process described in connection with FIG. 5 (i.e., starting with the step to select 504 a data shard where the data may be stored). If the grid storage service does determine 2408 to use null shards to store the data, the data storage may first convert 2410 one or more null shards to data shards and then continue 2418 updating the grid using the process described in connection with FIG. 5 (i.e., starting with the step to select 504 a data shard where the data may be stored).

Figure 25:
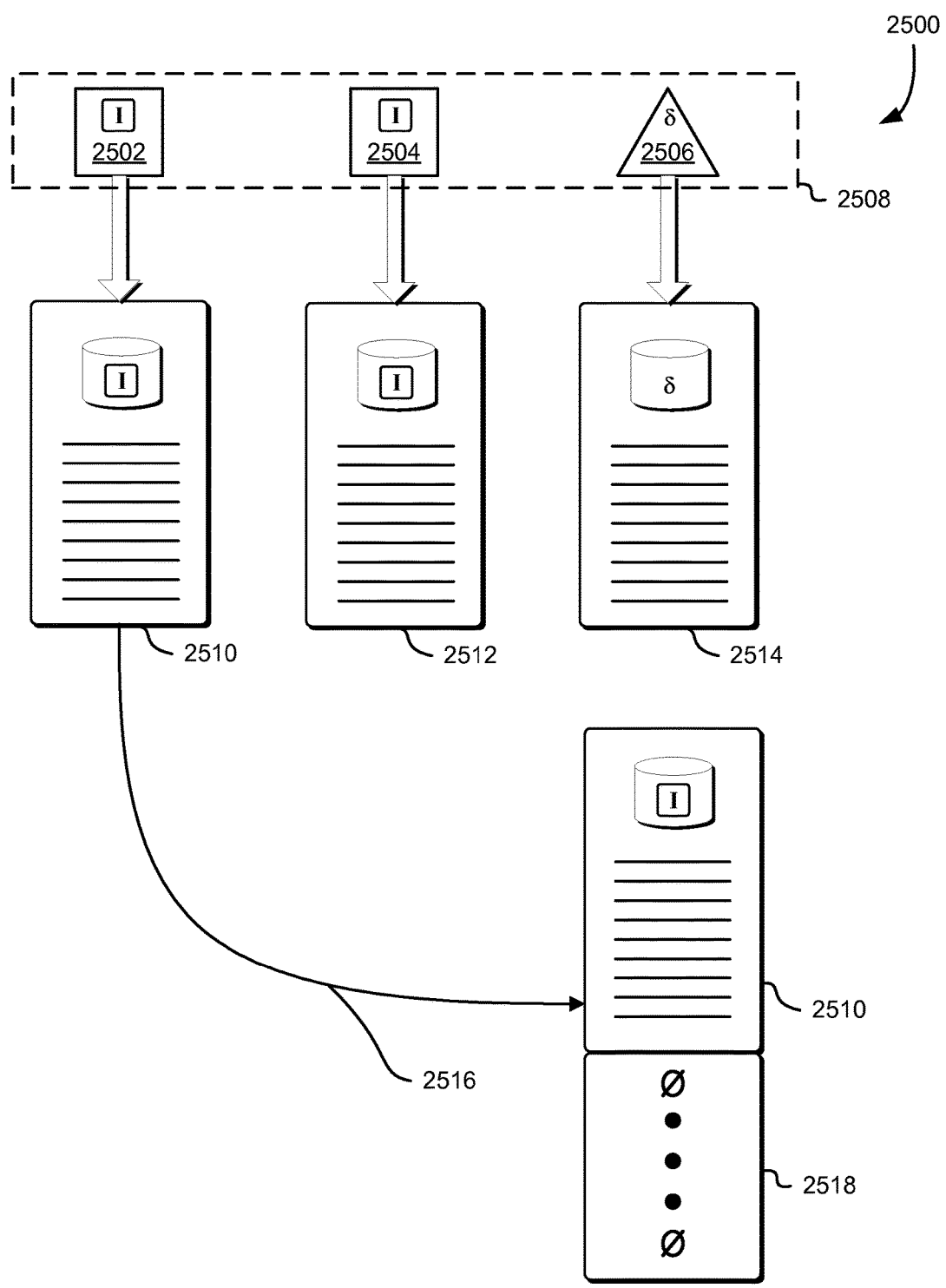
FIG. 25 illustrates an example diagram where the size of a storage volume of a grid encoded data storage system is increased in accordance with an embodiment.

FIG. 25 illustrates an example diagram 2500 where of a storage volume of a grid encoded data storage system as described in connection with FIG. 1 is increased in accordance with an embodiment. A first shard 2502 may have a corresponding first data storage device 2510. A second shard 2504 may have a corresponding second data storage device 2512. A third shard 2506 may have a corresponding third data storage device 2514. Each of these storage devices may have a first storage capacity (also referred to herein as "storage size" or, more simply, as "size"). The three shards may form a bundle 2508 as described herein. In the example illustrated in FIG. 25, the size of the first storage device 2510 is virtually increased 2516 by adding a set 2518 of zero values (or null values) as described above. The storage capacity of the storage device 2510 (i.e., the maximum data amount that may be stored on the shard) may be not physically increased (i.e., may not be replaced with a storage device with a larger storage capacity) and thus, the set 2518 of zero values may not actually be stored on the storage device 2610.

In an embodiment, space is allocated to store the set 2518 of zeros, but the set 2518 of zeroes are not actually be written to the storage device. Instead, a location where the set 2518 of zeroes begins (e.g., an offset from the beginning of the storage device) can be stored in grid metadata. In such an embodiment, data can be written to the storage device at the offset without initializing it to zeroes (i.e., the storage device can contain whatever it contained previously) and the redundancy code calculations associated with the storage device can be based on virtual set of zeroes stored in the grid metadata until such time as data is actually written to the storage device. It should be noted that, as described above, the zero values may be added to the shard without impacting the grid encoding. Thus, the virtual increase can be made while maintaining the grid of shards (i.e., by preserving the one or more mathematical properties associated with the grid of shards).

In some embodiment, the storage size of a storage device is increased by adding a set of data values to the storage device (i.e., padding the storage device as described above). The set of data values may be, for example, a set of zero values where the set of zero values are zero values for one or more fields associated with the redundancy codes associated with the grid encoding scheme as described herein. In some embodiments, all redundancy codes of the grid encoding scheme associated with a grid of shards have the same field (i.e., they are each defined over the same field). In such embodiments, the zero values for the redundancy codes of the grid encoding scheme are the same zero values because the fields for the redundancy codes are the same field (i.e., because the zero value for a field is defined for the field as one of mathematical properties of the field that must be maintained).

Figure 26:
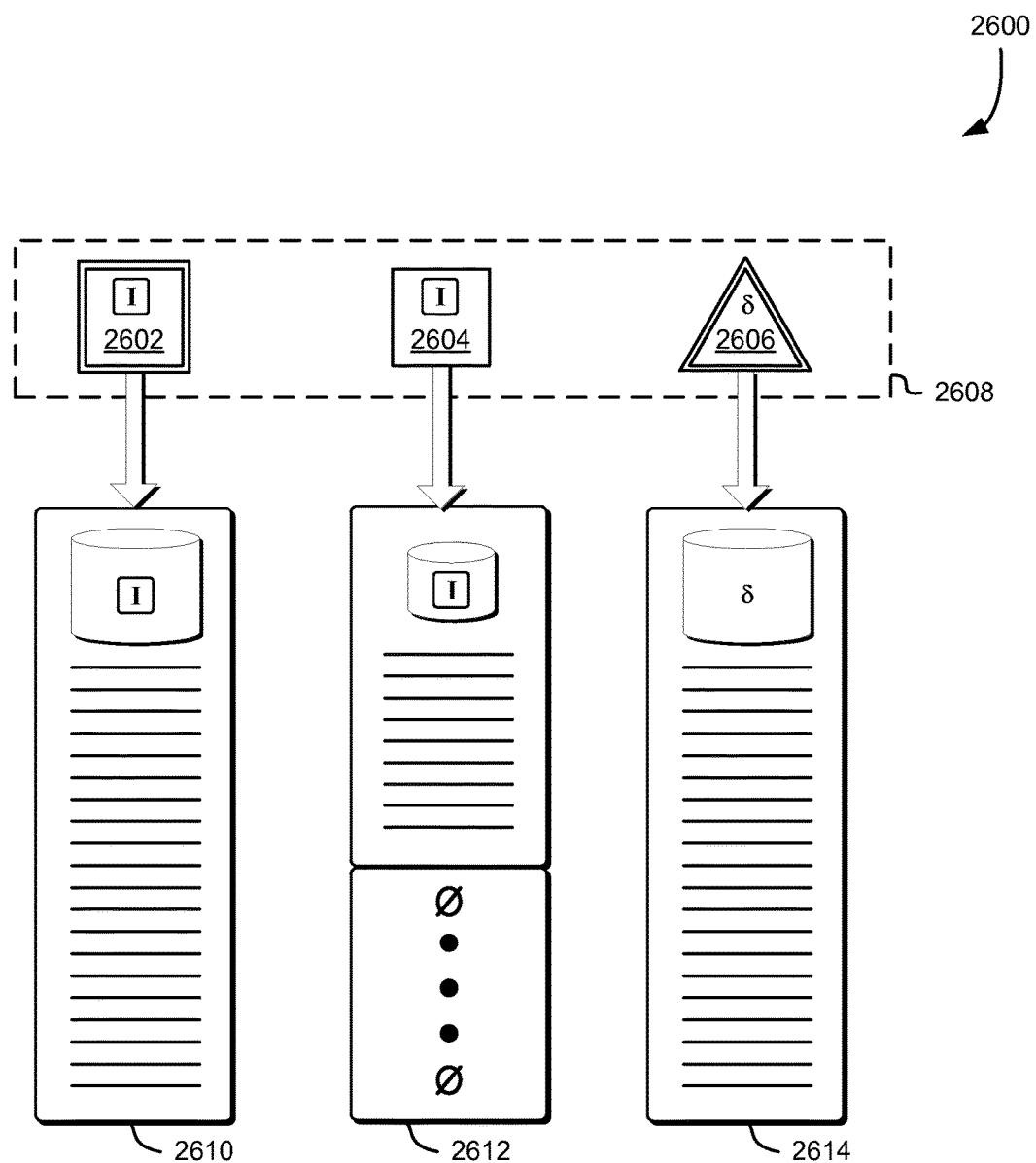
FIG. 26 illustrates an example diagram where the size is increased of a storage volume of a grid encoded data storage system in accordance with an embodiment.

FIG. 26 illustrates an example diagram 2600 where the size is increased of a storage volume of a grid encoded data storage system as described in connection with FIG. 1 and in accordance with an embodiment. In the example illustrated in FIG. 26, two storage devices have been replaced with replacement storage devices with an increased storage capacity (also referred to herein as a "larger storage device" or as a storage device with a "larger size") and a third storage device has been virtually increased with a set of zero values as described in connection with FIG. 25. A shard may also be increased using some other predetermined data value rather than a zero value such as, for example, a sentinel data value or some other predetermined data value. It is important to note that, as used herein, references to a storage device with a "larger size" or one that is "larger" do not refer to the physical dimensions of the storage device, but to the storage capacity of the storage device.

In the example illustrated in FIG. 26, a first storage device corresponding to a first shard 2602 has been replaced with a larger storage device 2610 (also referred to herein as a "replacement storage device"). The first shard 2602 with the larger storage device 2610 is illustrated in FIG. 26 with a double outline. Because of the increase of the size of the storage device associated with the first shard 2602, other shards in the same bundle (e.g., bundle 2608) may also need to have their size increased. In the example illustrated in FIG. 26, a second storage device corresponding to a second shard 2606 (in this case, the second shard 2606 is a derived shard of the bundle 2608) has been replaced with a larger storage device 2614. The second shard 2606 with the larger storage device 2614 is also illustrated in FIG. 26 with a double outline. However, the third storage device 2612, corresponding to the third shard 2604, has not had its storage capacity increased (i.e., has not been replaced with a larger storage device) and has, instead, had its size virtually increased with a set of zero values as described in connection with FIG. 25. In an embodiment, the third storage device 2612, corresponding to the third shard 2604 can be replaced with a larger storage device without allocating a storage partition on the larger storage device. In such an embodiment, the third storage device 2612, corresponding to the third shard 2604 would still appear to the grid as a storage device of the smaller capacity. The third shard 2604 that has not had its storage capacity increased is illustrated with a single outline.

Figure 27:
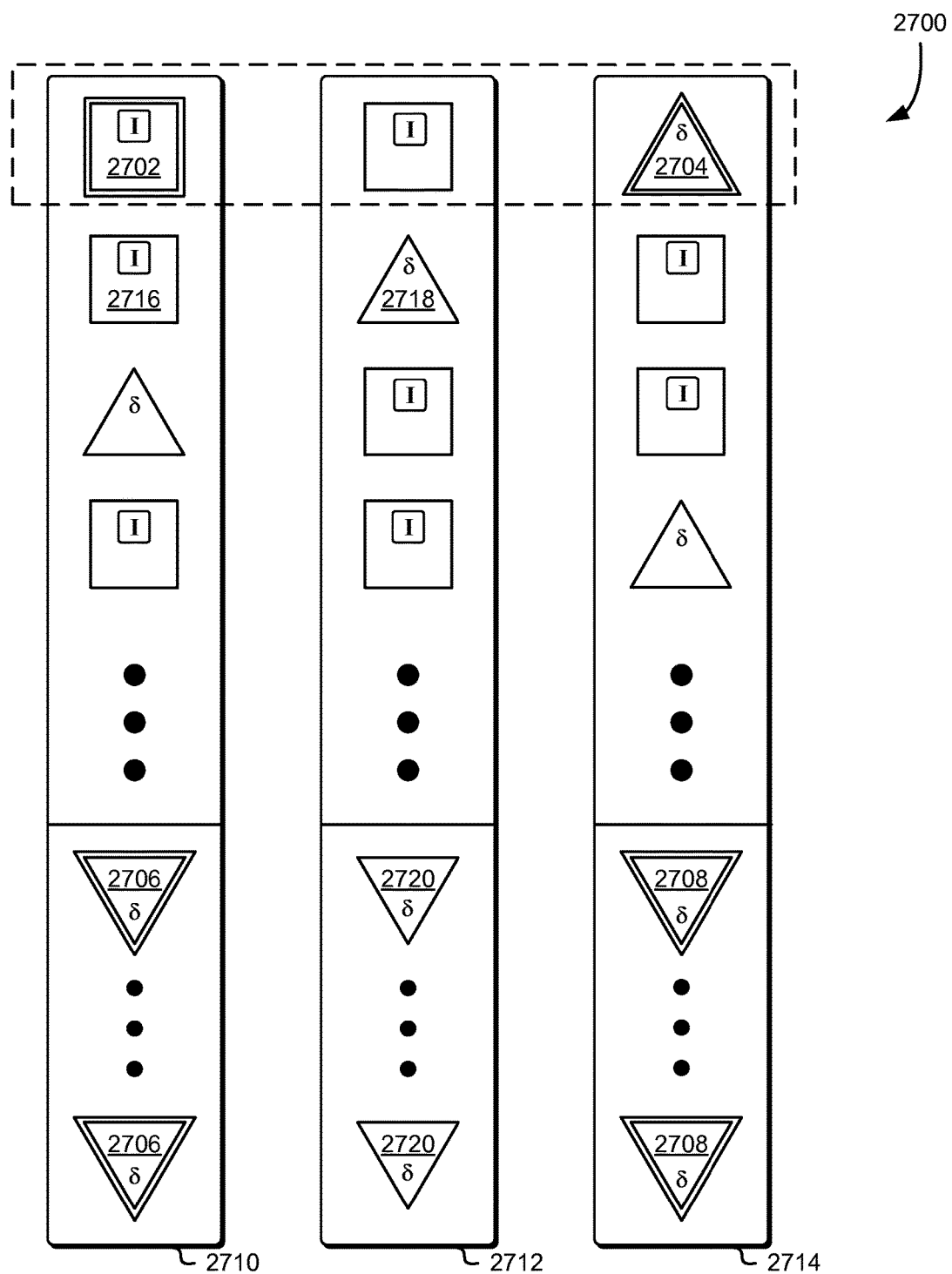
FIG. 27 illustrates an example diagram where data may be stored in a data volume of increased size in a grid encoded data storage system in accordance with an embodiment.

FIG. 27 illustrates an example diagram 2700 where data may be stored in a data volume of increased size in a grid encoded data storage system as described in connection with FIG. 1 and in accordance with an embodiment. The example illustrated in FIG. 27 extends the examples illustrated in FIGS. 25 and 26 to a two-dimensional grid. In the example illustrated in FIG. 27, a data storage device associated with a data shard 2702 has been replaced with a larger data storage device as indicated by the double outline of the data shard 2702. A data storage device associated with the horizontally-derived shard 2704 of the horizontal bundle indicated by the dashed line has also been replaced with a larger data storage device as indicated by the double outline of the horizontally-derived shard 2704. In an embodiment, the larger data storage devices associated with the data shard 2702 and the horizontally-derived shard 2704 are the same size. In another embodiment, the larger data storage devices associated with the data shard 2702 and the horizontally-derived shard 2704 have at least as much storage capacity as a defined minimum storage capacity for larger storage capacity storage devices (i.e., if the defined minimum storage capacity is, for example, 4 TB (terabytes), then each of the larger data storage devices is at least 4 TB).

Additionally, one or more vertically-derived shards 2706 of a vertical bundle corresponding to a first datacenter 2710 that contains the data shard 2702 may have their corresponding data storage devices replaced with larger data storage devices as indicated by the double outline of the one or more vertically-derived shards 2706 and one or more vertically-derived shards 2708 of a vertical bundle corresponding to a third datacenter 2714 that contains the horizontally-derived shard may have their corresponding data storage devices replaced with larger data storage devices as indicated by the double outline of the one or more vertically-derived shards 2708.

It may not be required to increase the size of the data storage devices of the other shards in the first datacenter 2710, the third datacenter 2714, or a second datacenter 2712, although the redundancy encoding scheme of the grid may require virtually increasing the storage capacity of those data storage devices. It should be noted that, just as with the conversion of null shards to non-null shards described above, storage devices in grid-encoded data storage systems can be incrementally replaced with storage devices with larger capacities incrementally. That is, while the first update of the data shard 2702 to a larger capacity storage device requires updating one or more horizontally-derived shards (e.g., horizontally-derived shard 2704) to a larger capacity storage device as well as the updating of a plurality of vertically-derived shards (e.g., vertically-derived shards 2706 and vertically-derived shards 2708) to larger capacity storage devices, subsequent updates to other shards require fewer updates to derived shards. For example, a subsequent update of the data storage device corresponding to data shard 2716 to a larger capacity would not require updating the data storage device corresponding to the vertically-derived shards 2706 because they were previously updated and would, instead only require the updating of the storage devices corresponding to horizontally-derived shard 2718 and vertically-derived shards 2720.

Figure 28:
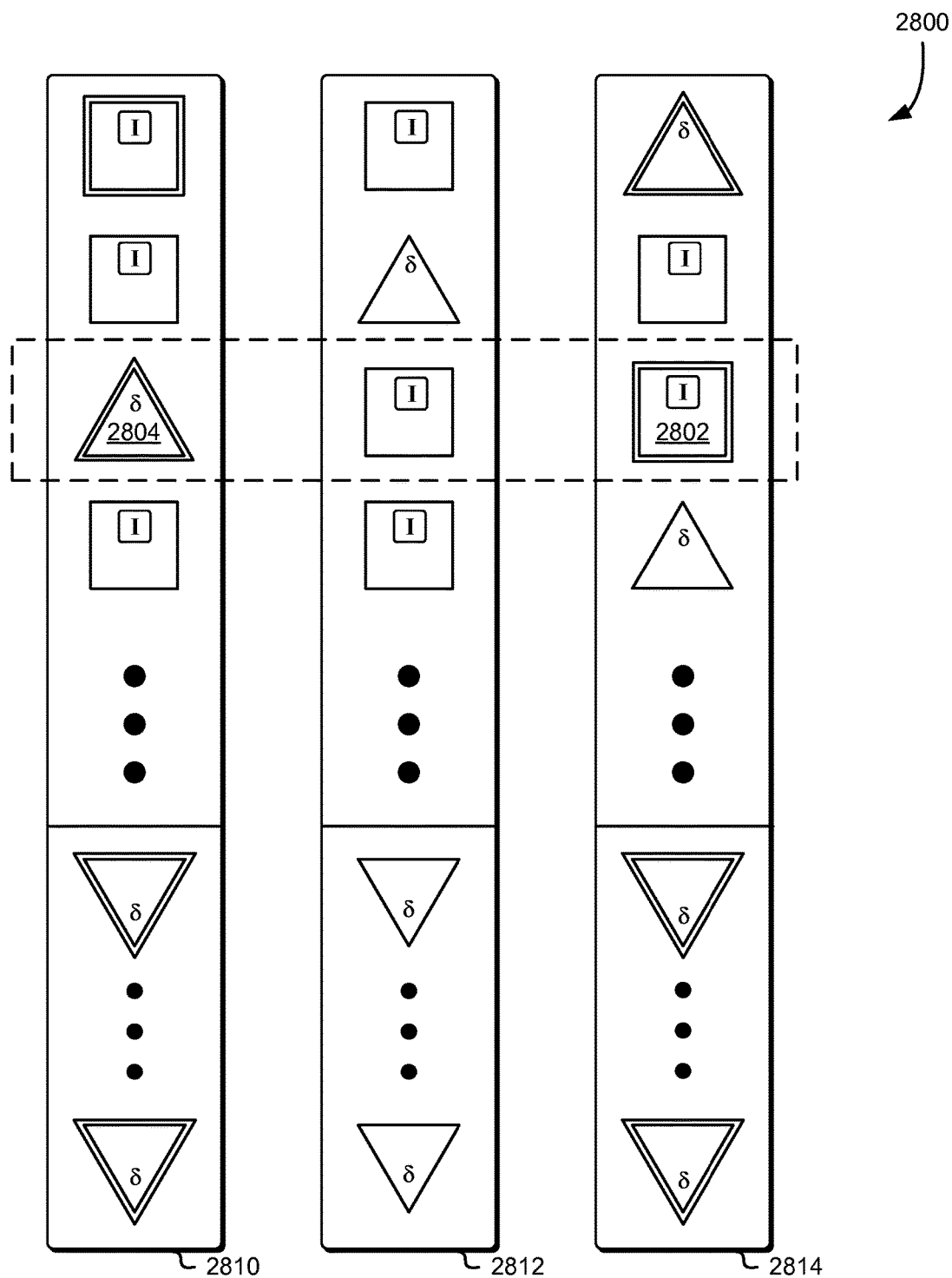
FIG. 28 illustrates an example diagram where data may be stored in a data volume of increased size in a grid encoded data storage system in accordance with an embodiment.

FIG. 28 illustrates an example diagram 2800 where data may be stored in a data volume of increased size in a grid encoded data storage system as described in connection with FIG. 1 and in accordance with an embodiment. FIG. 28 shows an example of a subsequent update (i.e., an update after the first update) to the data storage devices in a grid of shards as was described in connection with FIG. 27. In the example illustrated in FIG. 28, a data storage device corresponding to a data shard 2802 is updated with a larger capacity storage device (as indicated by the double outline of the data shard 2802). As a result of this update, a data storage device corresponding to a horizontally-derived shard 2804 in the same horizontal bundle (as indicated by the dashed box) may also be updated to a larger capacity storage device (again, as indicated by the double outline of the horizontally-derived shard).

However, none of the vertically-derived shards in the bundle corresponding to datacenter 2810 may need to be updated as they may have been updated on a previous update (e.g., when the data shard 2802 was updated). Additionally, none of the vertically-derived shards in the bundle corresponding to datacenter 2814 may need to be updated because they also may have been updated on a previous update. Note that, in the example illustrated in FIG. 28, the data storage devices corresponding to the vertically-derived shards of datacenter 2812 have not been updated to larger capacity storage devices as none of the shards in datacenter 2812 have been updated with larger capacity storage devices.

Figure 29:
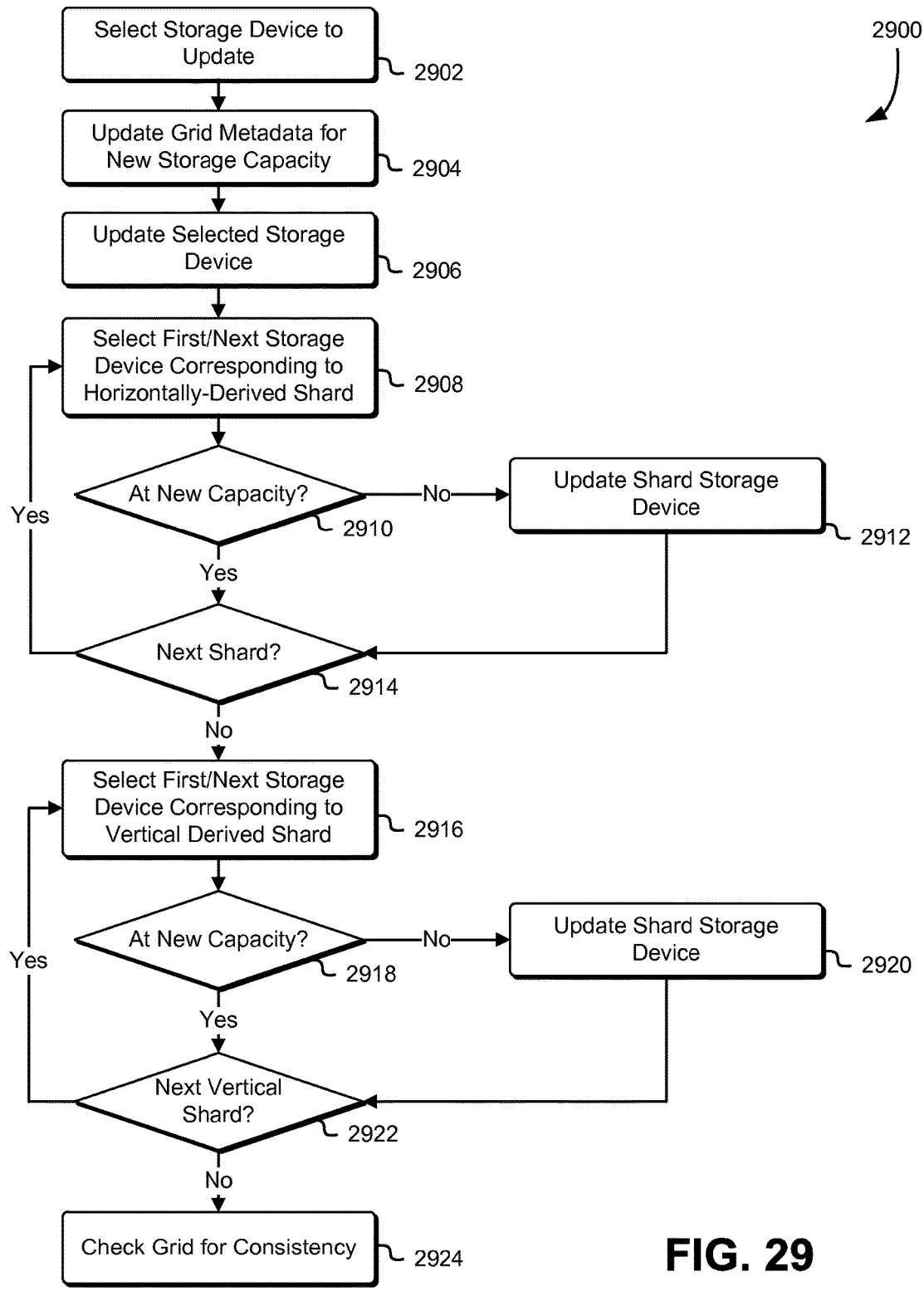
FIG. 29 illustrates an example process for updating storage devices in a grid encoded data storage system in accordance with an embodiment.

FIG. 29 illustrates an example process 2900 for updating storage devices in a grid encoded data storage system as described in connection with FIG. 1 and in accordance with an embodiment. A grid storage service such as the grid storage service 116 described in connection with FIG. 1 may perform the example process 2900 illustrated in FIG. 29. A grid storage service may select 2902 a storage device to update. If it is the first such update of the grid, the grid storage service may next update 2904 the grid metadata to indicate the new storage capacity for each shard of the grid and/or to indicate which shards of the grid of shards have been updated with larger capacity storage devices and which shards of the grid of shards have been virtually updated as described in connection with FIG. 25.

The grid storage service may then update 2906 the selected storage device and begin the process of updating any other storage devices as required. The data storage may begin the process of updating any other storage devices as required by selecting 2908 a storage device corresponding to a horizontally-derived shard, based on the horizontal bundle of the shard associated with the storage device selected to update (i.e., the storage device selected to update 2906). If the storage device corresponding to the horizontally-derived shard already is not at the new capacity 2910, the storage device corresponding to the horizontally-derived shard may be updated 2912 to a storage device with new capacity. The grid storage service may then continue selecting storage devices corresponding to horizontally-derived shards while there are still horizontally-derived shards 2914.

The data storage may continue the process of updating any other storage devices as required by selecting 2916 a storage device corresponding to a vertically-derived shard. The storage device may be a storage device corresponding to one of the one or more vertically-derived shard based on a vertical bundle of a data shard (i.e., the storage device selected to update 2906) or may be a storage device corresponding to one of the one or more vertically-derived shard based on a vertical bundle of a horizontally-derived shard. If the storage device corresponding to the vertically-derived shard already is not at the new capacity 2918, the storage device corresponding to the vertically-derived shard may be updated 2920 to a storage device with new capacity. The grid storage service may then continue selecting storage devices corresponding to vertically-derived shards while there are still vertically-derived shards 2922 and, when all have been updated, may perform one or more operations to check the grid for consistency 2924.

Figure 30:
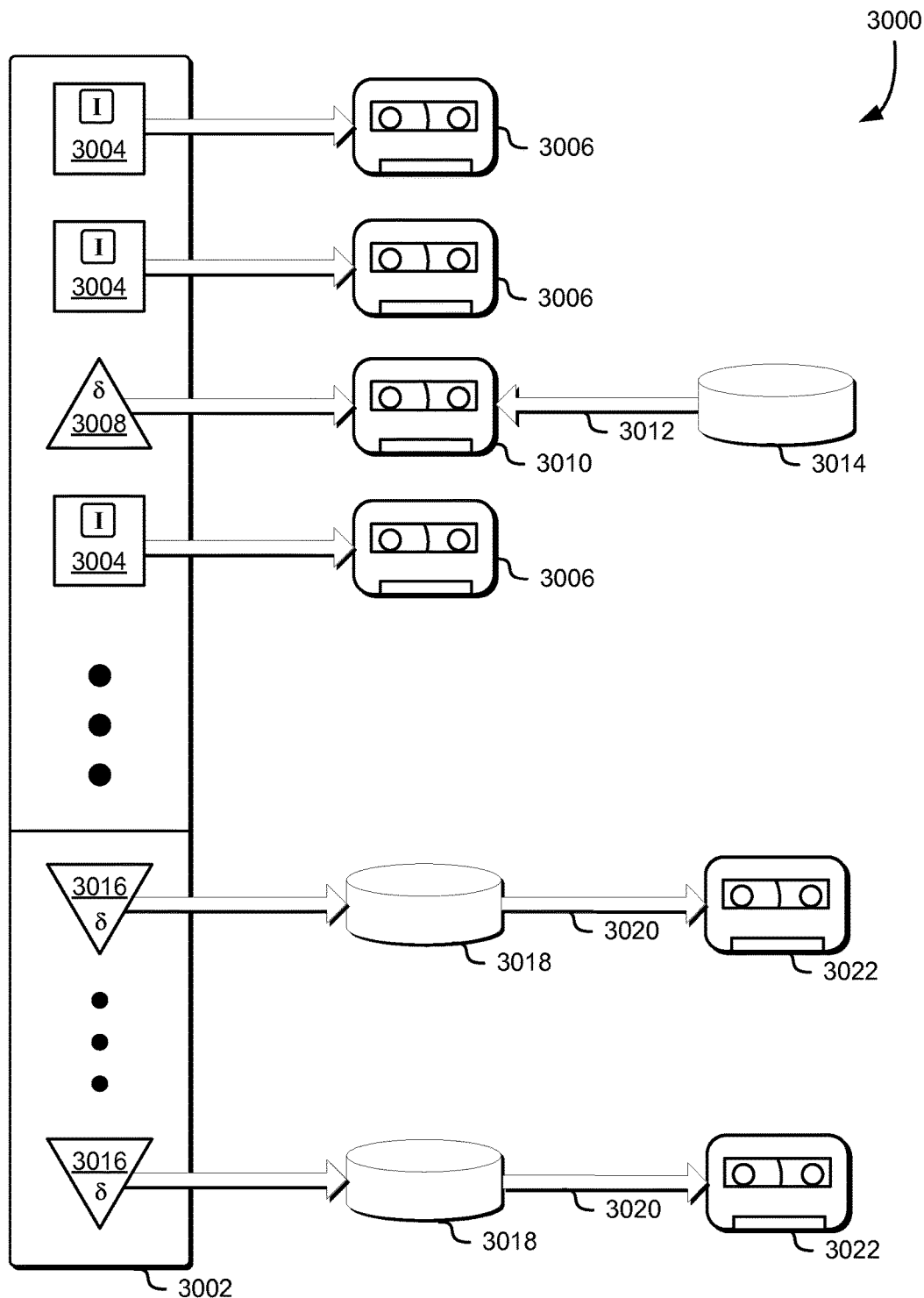
FIG. 30 illustrates an example diagram where data is stored in heterogeneous storage devices of a grid encoded data storage system in accordance with an embodiment.

FIG. 30 illustrates an example diagram 3000 where data is stored in heterogeneous storage devices of a grid encoded data storage system as described in connection with FIG. 1 and in accordance with an embodiment. In the example illustrated in FIG. 30, the tapes (such as the storage device 3006) represent slow devices or media (also referred to herein as "cold" devices or media) while the disks such as disk 3012 represent fast devices or media (also referred to herein as "hot" devices or media). Slow media, as used herein, is media where access may be slow or may require accessing a physical storage device (e.g., a magnetic tape) by retrieving it from an archival location. Fast media, as used herein, is media where access may be more immediate. Both the slow media and the fast media may be a variety of different types including, but not limited to, magnetic tapes, magnetic disks, optical disks, memory resistors, flash drives, flash memory, computer memory, or other types of storage devices and/or their associated media. In an embodiment, the slow media and the fast media illustrated in FIG. 30 are the same type (e.g., both may be disks, both may be tapes, or both may be some other type of storage device or media).

In the example illustrated in FIG. 30, a vertical bundle corresponding to a datacenter 3002 has a heterogeneous set of storage devices associated with the shards in the vertical bundle. The data shards 3004 in the vertical bundle have corresponding storage devices 3006 that are slow (e.g., magnetic tapes). The horizontally-derived shard 3008 in the vertical bundle also has a corresponding storage device 3006 that is slow. Conversely, the vertically-derived shards 3016 of the vertical bundle have corresponding storage devices that are fast (e.g., magnetic disks). In an embodiment, the vertically-derived shards are stored on fast media because, for example, they are frequently accessed during grid update operations. In another embodiment, the vertically-derived shards are stored on slow media and migrated to fast media during increased grid update operations such as, for example, when repairing the grid as described herein. The determination to migrate a grid from slow media to fast media may be based at least in part on a volatility metric of the shard that may, for example, be a measurement of the number of changes to the shard per unit time (e.g., seconds, minutes, hours, days, etc.).

In the example illustrated in FIG. 30, shards may be migrated between different media types (i.e., may have different media and/or media types associated with them) as needed. For example, when regenerating a derived shard such as the horizontally-derived shard 3008, the shard may be derived from shards in the same horizontal bundle and, during deriving, may be stored on fast media 3014. After the deriving is complete, the horizontally-derived shard may be written back to the slow media 3010. Similarly, the vertically-derived shards 3016 may be stored on fast media 3018 during, for example, grid repair operations and then may be returned 3020 to slow media 3022 after the grid repair operations are complete.

Figure 31:
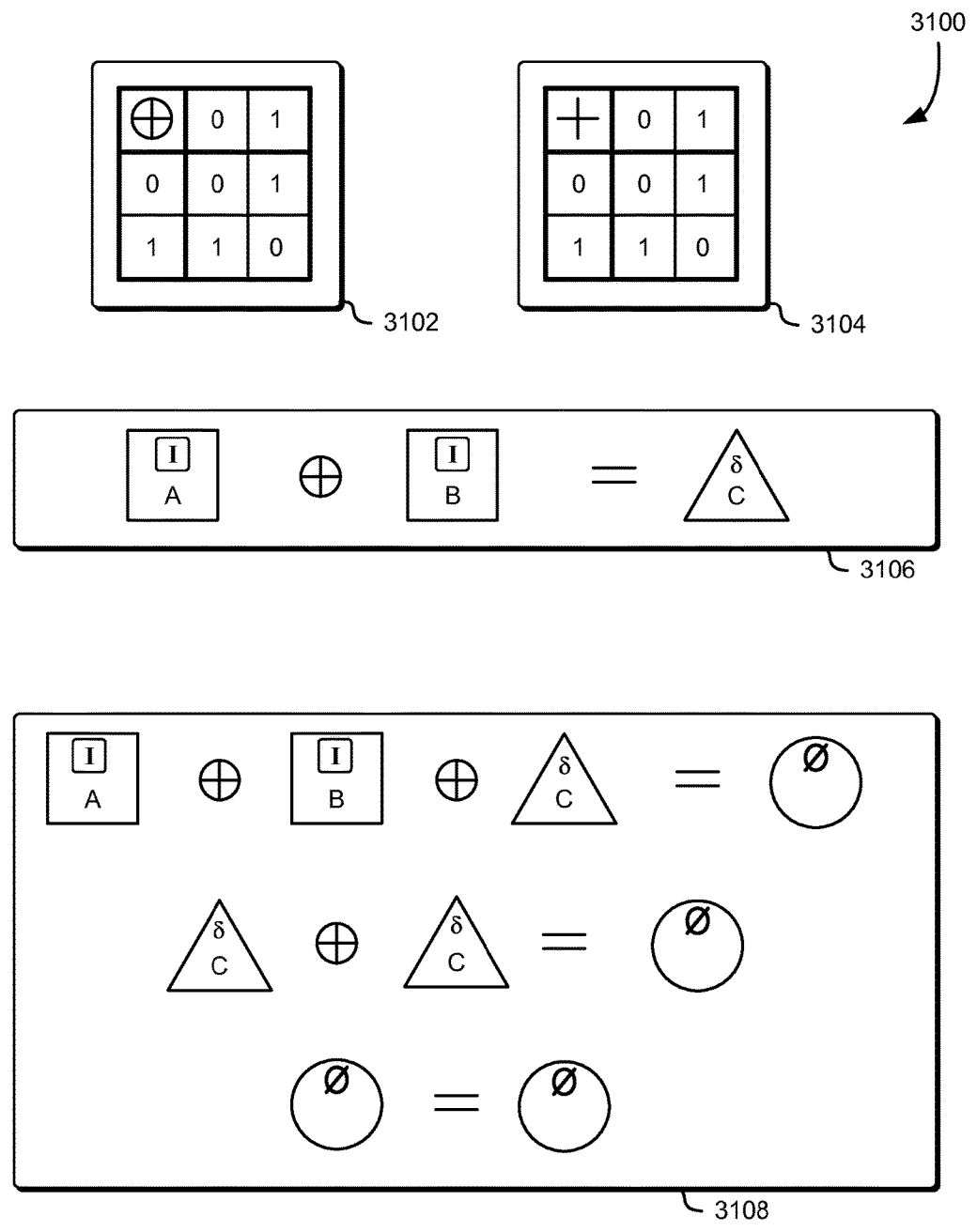

FIG. 31 illustrates an example diagram 3100 where operations are illustrated that are used to validate shards in a grid encoded data storage system as described in connection with FIG. 1 and in accordance with an embodiment. Example operation 3102, the XOR operation ("$\oplus$") is illustrated showing that $0\oplus0=0$, $0\oplus1=1$, $1\oplus0=1$, and $1\oplus1=0$. The example operation 3104 illustrates that the XOR operation is the same as addition because, in a Galois field, XOR is the same as addition when the Galois field is of characteristic 2 (a Galois field has a characteristic "p" when it has $p^n$ elements, where p is a prime number (e.g., 2) and n is a positive integer. A Galois field of characteristic 2 can be represented as a binary value, where each bit corresponds to one coefficient of the polynomial representation and, in such a field, XORing the binary values is equivalent to addition of the corresponding field elements.

Continuing with the example operation 3102 and the example operation 3104 illustrated in FIG. 31, hat $0+0=0$, that $0+1=1$, and that $1+0=1$ requires little explanation. The fact that $1+1=0$ is because, in the field described above, $1+1=2$, which is the same as saying $1+1=10$ (10 is the binary equivalent of the decimal value 2). But in this field, the addition is modulo 2 (2 is a prime number), and 2 modulo 2 is 0. Thus, the addition operation can be performed in the Galois field by XORing the binary values corresponding to the coefficients as described above.

The example operation 3106 is a reiteration of step 1906 illustrated in FIG. 19 and is used in example operation 3108 where, if a data shard "A" and a data shard "B" are used to generate a derived shard (e.g., a parity shard) "C" using an XOR calculation (or any other linear redundancy calculation), then the data shard "A"⊕the data shard "B"⊕the derived shard "C" equals a null shard. To illustrate this, consider the example illustrated above where a first simple sixteen-bit data shard (e.g., shard "A") contains "0010 1011 0110 1011" and a second simple sixteen-bit data shard (e.g., shard "B") contains "0100 1101 0100 1011." The XOR of these two simple sixteen-bit data shards is "0110 0110 0010 0000" and this value may be stored in the derived shard (e.g., shard "C"). However, as example operation 3108 illustrates, if A⊕B⊕C equals the null shard, and if A⊕B equals C, then A⊕B⊕C is the same as C⊕C (by substituting C for A⊕B. Additionally, because anything XORed with itself is zero, C⊕C also equals the null shard (as illustrated by the final line of the operation 3108).

Figure 32:
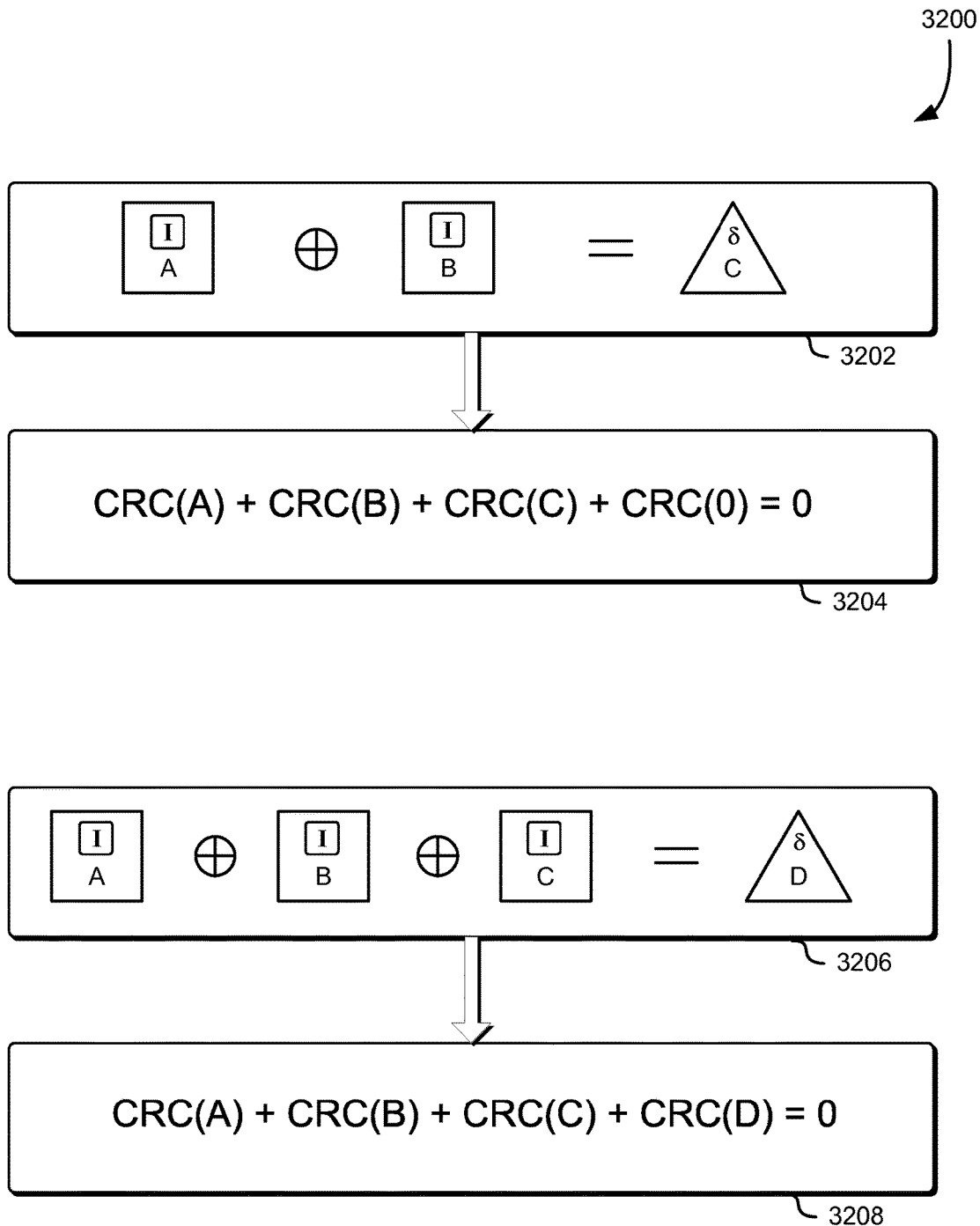
FIG. 32 illustrates an example diagram where operations are illustrated that are used to validate shards in a grid encoded data storage system in accordance with an embodiment.

FIG. 32 illustrates an example diagram 3200 where operations are illustrated that are used to validate shards in a grid encoded data storage system as described in connection with FIG. 1 and in accordance with an embodiment. The example operation 3202 is a reiteration of step 1906 illustrated in FIG. 19 and is used in the example operations illustrated in FIG. 32. For example, given a data shard "A," a cyclic redundancy check ("CRC") of "A" (denoted as "CRC(A)" in FIG. 32) can be computed that conforms to one or more mathematical principles. A CRC may also be referred to herein as a "cyclic redundancy check code" or a "CRC code" and the value obtained from applying a CRC to, for example, a shard may be referred to herein as a "cyclic redundancy check value" or a "CRC value." A cyclic redundancy check is an example of an error-detection code. A cyclic redundancy check is an error-detection code that is based on remainder calculations associated with polynomial division. A 32-bit CRC of a data shard can be calculated by first padding the data shard with 32 zero values (effectively multiplying the stream of data in the shard by $2^{32}$), and then repeatedly dividing the resulting padded data shard by a characteristic single-variable polynomial that is shifted right at each division iteration. The single value polynomial can, as described above, be represented by a binary number of the coefficients. The result of the iterative division is the CRC for the data. The CRC value can then be used to validate the data because, by repeatedly dividing the data value padded with the CRC value by the characteristic polynomial, the remainder should be zero if there are no errors in the data.

One of the mathematical properties associated with a CRC value based on even parity (e.g., a 32-bit CRC) is illustrated in example operation 3202 and example operation 3204. The example operation 3202 is a reiteration of step 1906 illustrated in FIG. 19. First, a data shard "A" and a data shard "B" are used to generate a derived shard (e.g., a parity shard) "C" using an XOR calculation (or any other linear redundancy calculation). Because of the parity, the CRC values of the shards conform to the example operation 3204 where, CRC(A)+CRC(B)+CRC(C)+CRC(0)=0 (i.e., where the "0" that is used as an input to the "CRC(0)" has the same length and/or the same number of bits as "A," "B," and "C"). The inclusion of CRC(0) is required because, in many CRC implementations, preprocessing and post-processing steps are performed such as, for example, XORing a mask into the input data, inverting the input or output, and/or prefix the data with a constant to ensure that CRC(0) is not equal to zero. Such preprocessing and post-processing is that all resulting CRC values are effectively XORed with a value that depends only on the length of the input data. In some embodiments, the value of CRC(0) is zero, and in such embodiments, the inclusion of CRC(0) may not be required.

In an embodiment, a different precomputed cyclic redundancy check value can be used instead of the CRC(0) value to ensure parity. For example, a different error-detection code may be used and a set of corresponding error-detection code values can be computed for verification as described below. In such an embodiment, a precomputed error-detection code value may be used for validation. In another embodiment, a precomputed error-detection code value may not be required. For example, the operation 3206 shows a 4:3 parity encoding which, because there are an even number of shards in the bundle, may not require the inclusion of CRC(0) (or some other precomputed error-detection code value) to conform to the even parity requirement. In an embodiment, the CRC values for the shards can be computed when the shards are updated and stored in grid metadata. It should be noted that, while the examples illustrated in FIG. 32 use horizontally-derived shards, such CRC validation calculations apply equally to vertical bundles as described below.

It should be noted that some error-detection codes may not necessarily satisfy all of the properties described herein with respect to, for example, the CRC codes described above. Such error detection codes that may not necessarily satisfy all of the properties may require additional preprocessing and/or post-processing operations to be performed in order to perform a validation of an update, repair, or other such operation associated with a grid encoding scheme. Such preprocessing and post-processing operations may include, but may not be limited to, providing additional constants for pre- or post-multiplication within the field, providing additional predetermined or calculated values (e.g., the CRC(0) value described above), or other preprocessing and/or post-processing operations.

Figure 33:
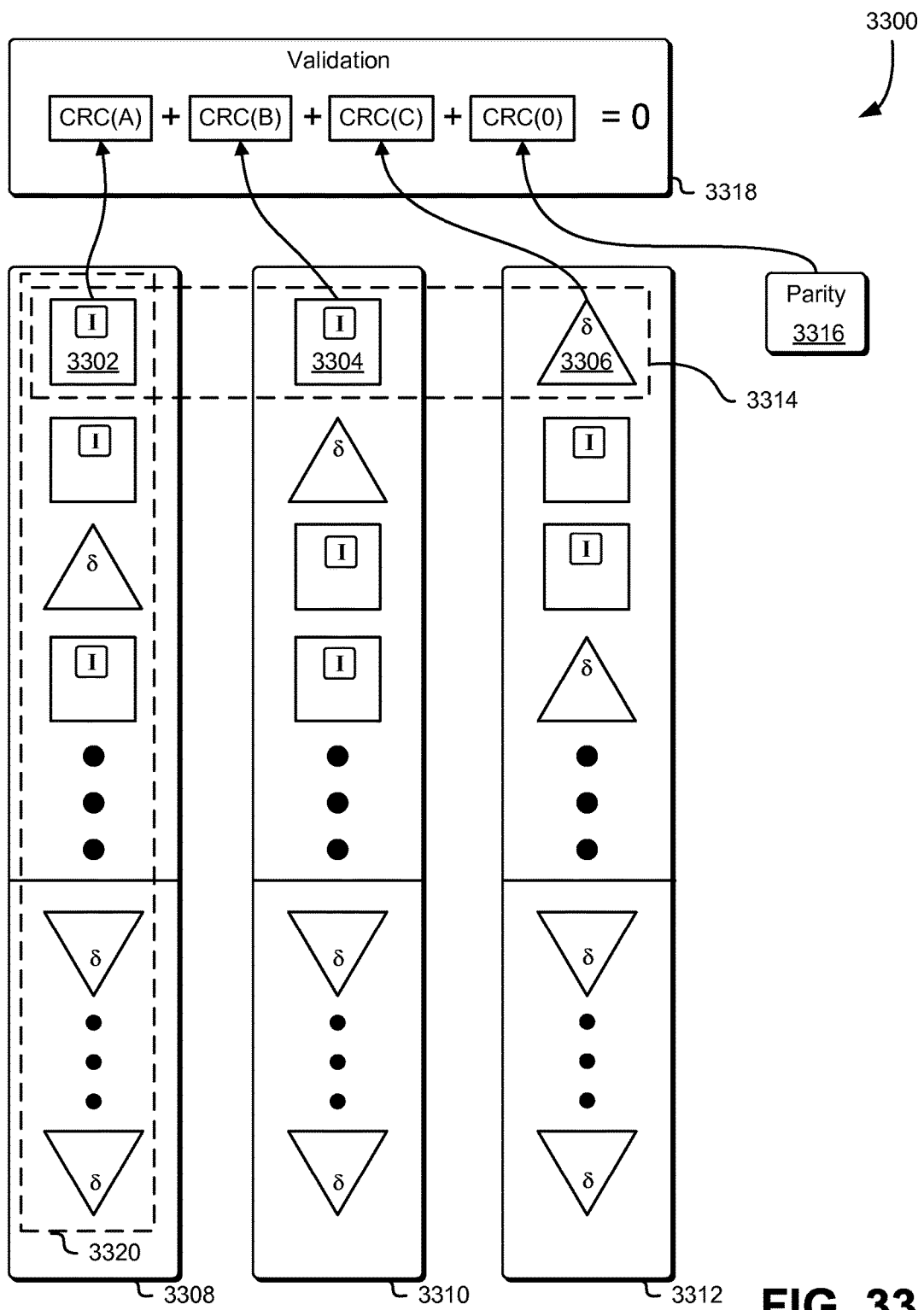
FIG. 33 illustrates an example environment where data is validated across multiple datacenters of a grid encoded data storage system in accordance with an embodiment.

FIG. 33 illustrates an example environment 3300 where data is validated across multiple datacenters of a grid encoded data storage system as described in connection with FIG. 1 and in accordance with an embodiment. A horizontal bundle 3314 with a first shard 3302 in a first datacenter 3308, a second shard 3304 in a second datacenter 3310, and a third shard 3306 in a third datacenter 3312 may be validated as described in FIG. 32. The validation 3318 adds the CRC of shard A (e.g., the first shard 3302), the CRC of shard B (e.g., the second shard 3304), the CRC of shard C (e.g., the third shard 3306), and the CRC of zero (based on the parity 3316, which in this example, is even parity). If the validation 3318 equals zero, then that row is validated.

The validation 3318 may occur as a result of an update to a shard, or a repair to a shard, or the conversion of a shard from a null shard (null shards in the grid do not invalidate the CRC calculations). For example, if data is added to the data shard 3302 then the CRC value of that shard (e.g., CRC(A)) may be updated as a result of the update to the data shard in the horizontal bundle 3314 (this updated CRC value may be designated as CRC(A') herein). Additionally, since the derived shard 3306 would be updated, the CRC value of that derived shard (e.g., CRC(C)) may also be updated (this updated CRC value may be designated as CRC(C') herein). The update to the data shard 3302 (as well as the corresponding update of the derived shard 3306) may be validated by verifying that CRC(A')+CRC(B)+CRC(C')+CRC(0)=0. If it is not verified than the update may be discarded and/or the derived shard may be derived anew. It should be noted that CRC calculations may also be performed on the vertical bundles such as, for example, the vertical bundle 3320 illustrated in FIG. 33. However, with more complicated redundancy encoding techniques (e.g., Reed-Solomon), the CRC calculations may be more complicated than simple addition. For example, if a Reed-Solomon redundancy encoding technique is used for a vertical bundle, the validation calculation may require multiplying each CRC value by a corresponding constant and/or a corresponding constant polynomial that may be based, at least in part, on the structure of the grid of shards. Such corresponding constants may also be predetermined and stored in the grid metadata associated with each shard.

Figure 34:
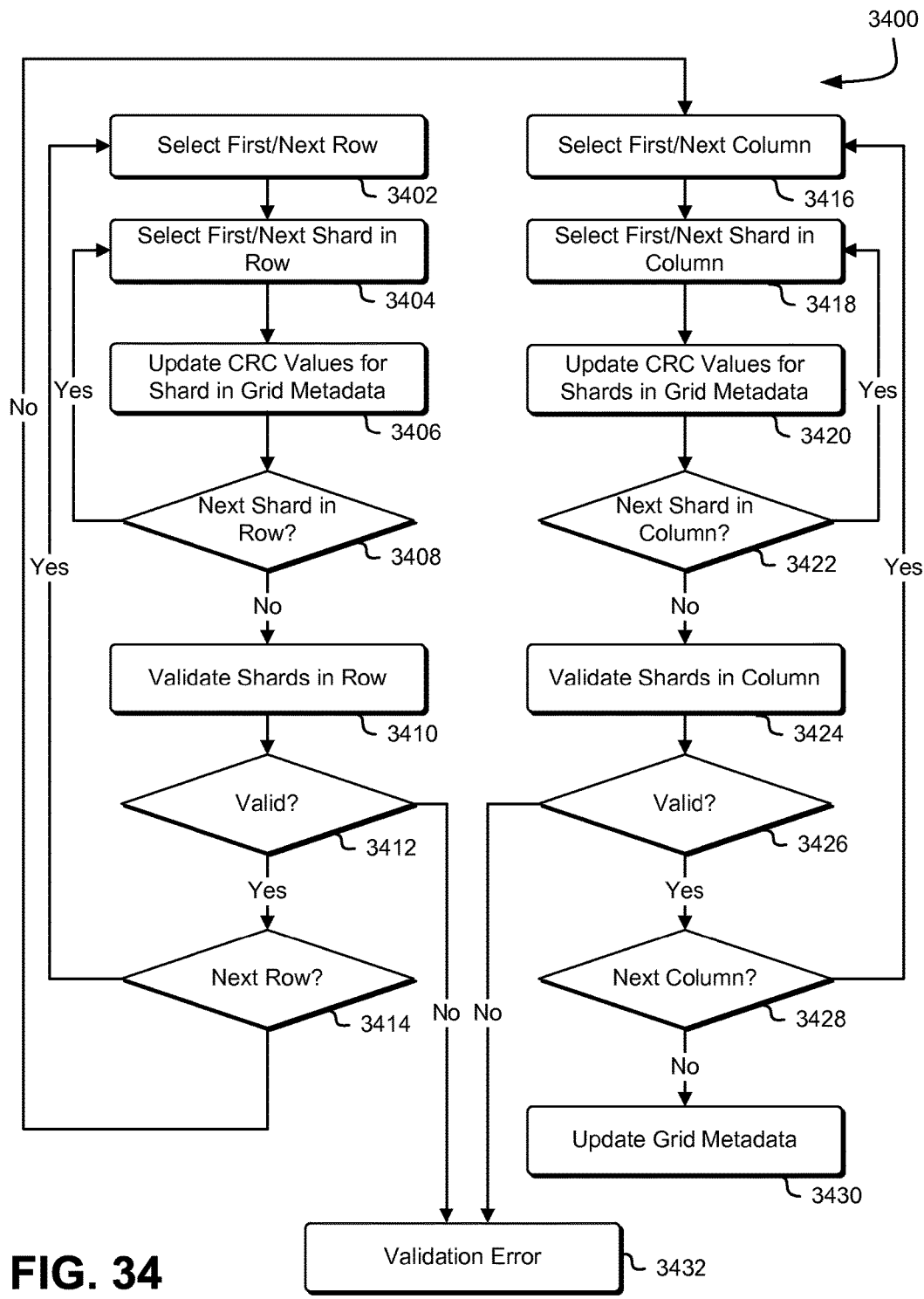
FIG. 34 illustrates an example process for validating data across multiple datacenters of a grid encoded data storage system in accordance with an embodiment.

FIG. 34 illustrates an example process 3400 for validating data across multiple datacenters of a grid encoded data storage system as described in connection with FIG. 1 and in accordance with an embodiment. A grid storage service such as the grid storage service 116 described in connection with FIG. 1 may perform the example process 3400 illustrated in FIG. 34. The example process described in connection with FIG. 34 may be performed as a result of a repair to the grid to, for example, verify the repair, or may be performed as a result of an update to the grid to, for example, verify the update, or may be performed on a regular basis (i.e., not as the result of an operation that changes the grid), or may be performed to gather metrics about the grid to, for example, present to a user, a customer, and/or a third-party.

In the example illustrated in FIG. 34, the validation is of the entire grid, and the order of the operations is that the CRC values for the rows are updated, the rows are validated, the CRC values of the columns are updated, and the columns validated. However, the order of the operations described in connection with FIG. 34 may be varied so that, for example, the CRC values for the columns may be updated and the columns validated before the CRC values for the rows are updated and the rows validated, or the CRC update operations may be performed first before the validation operations, or parts of the CRC update operations may be performed, then parts of the validations, and so on. In an embodiment, the update of the CRC values occurs during the process to, for example, repair or update the grid, and the process illustrated in FIG. 34 does not rely on validation operations. The operations illustrated in FIG. 34 may also be performed in parallel or simultaneously so that, for example, all of the update operations are performed at the same time and then all of the validation operations. In an embodiment, the CRC values for the rows are updated and the CRC values for the columns are updated before the validation is performed in parallel, using the updated CRC values. As may be contemplated, the order of operations illustrated in FIG. 34 and described in connection with FIG. 34 is merely an illustrative example, and other orders of operations including, but not limited to, those described above may be considered as within the scope of the present disclosure.

In the example illustrated in FIG. 34, the grid storage service may select 3402 a row of the grid of shards for validation and then may begin selecting 3404 shards in that row and updating 3406 the CRC values for the shards in that row. In an embodiment, the process to update the CRC values for the shards in that row includes storing the updated CRC value within grid metadata associated with the shard. In another embodiment, the process to update the CRC values for the shards in that row includes optimizations for updating the CRC value such as, for example, maintaining a flag or sentinel value indicating whether the shard has been updated since the previous CRC value was calculated, or using specialized hardware to update the CRC value, or to update the CRC value when the shard is updated and/or otherwise altered, or to update the CRC value after several alterations have been made to the shard, or using a combination of these and/or other such optimizations for updating the CRC value for the shard.

In an embodiment, the operations for updating 3406 the CRC values for the shards in the row includes updating, calculating, retrieving, and/or otherwise obtaining CRC values for other shards associated with each shard being updated. For example, the grid storage service may update the CRC values for derived shards (e.g., horizontally-derived shards or vertically-derived shards) in the same corresponding row or the same corresponding column of each shard and, in addition to storing the updated CRC value in each shard in, for example, grid metadata associated with each shard, may also store the updated CRC values for the derived shards associated with each shard in that shard. In such an embodiment, the order of operations associated with an operation (e.g., an update operation) is: update a shard, update the CRC value for the shard and store the value in grid metadata for the shard, update horizontally-derived shards in the same horizontal bundle as the shard, update the CRC values for those horizontally-derived shards and store the updated CRC values both in the grid metadata associated with the shard and in the grid metadata associated with the respective horizontally-derived shard, update vertically-derived shards in the same vertical bundle as the shard, update the CRC values for those vertically-derived shards and store the updated CRC values both in the grid metadata associated with the shard and in the grid metadata associated with the vertically-derived shards, update vertically-derived shards in the same vertical bundle as the horizontally-derived shards, and finally store the updated CRC values both in the grid metadata associated with the horizontally-derived shards and in the grid metadata associated with the vertically-derived shard.

In such an embodiment, each data shard has a CRC value for the data shard, one or more CRC values for the horizontally-derived shards, and one or more CRC values the vertically-derived shards, all of which are stored in the grid metadata associated with the shard. In such an embodiment, each horizontally-derived shard has a CRC value for the horizontally-derived shard and one or more CRC values for the vertically-derived shards. In such an embodiment, each vertically-derived shard has a CRC value for the vertically-derived shard.

In another embodiment, each shard (e.g., each data shard, each horizontally-derived shard, and each vertically-derived shard), has CRC values for every other shard associated with that shard, either in horizontal bundles or in vertical bundle stored in the grid metadata associated with that shard.

Continuing with the process illustrated in FIG. 34, the grid storage service may continue updating CRC values for the shards in the row while there are more shards in the row 3408, and then may use those CRC values to validate 3410 the shards in the row. If the shards in the row are valid 3412, the grid storage service may continue selecting rows 3414 until all rows have been validated before proceeding to validating the columns.

The grid storage service may validate the columns by next selecting 3416 a column of the grid of shards for validation and then may begin selecting 3418 shards in that column and updating 3420 the CRC values for the shards in that column. In an embodiment, the process to update the CRC values for the shards in that column includes storing the updated CRC value within grid metadata associated with the shard. In another embodiment, the process to update the CRC values for the shards in that column includes optimizations such as those described above in connection with updating the CRC values associated with the row. The process to update the CRC values for the shards in the column may also include updating related shards as described above in connection with updating the CRC values associated with the row. The grid storage service may continue updating CRC values for the shards in the column while there are more shards in the column 3422, and then may use those CRC values to validate 3424 the shards in the column. If the shards in the column are valid 3426, the grid storage service may continue selecting columns 3428 until all columns have been validated. The data storage may perform a final update to the grid metadata 3430 after all validations have been performed such as, for example, to update a flag or an indicator in each shard.

If the shards in any row are not valid 3412 and/or if the shards in any column are not valid 3426, the grid storage service may issue a validation error 3432 and may also perform one or more operations as a result of the validation error 3432 including, for example, rolling back a change (e.g., an update) that began the validation, generate an alarm, attempt a repair of the grid, attempt a repair of the CRC values in the grid metadata (e.g., by recalculating them), or a combination of these and/or other such operations.

Figure 35:
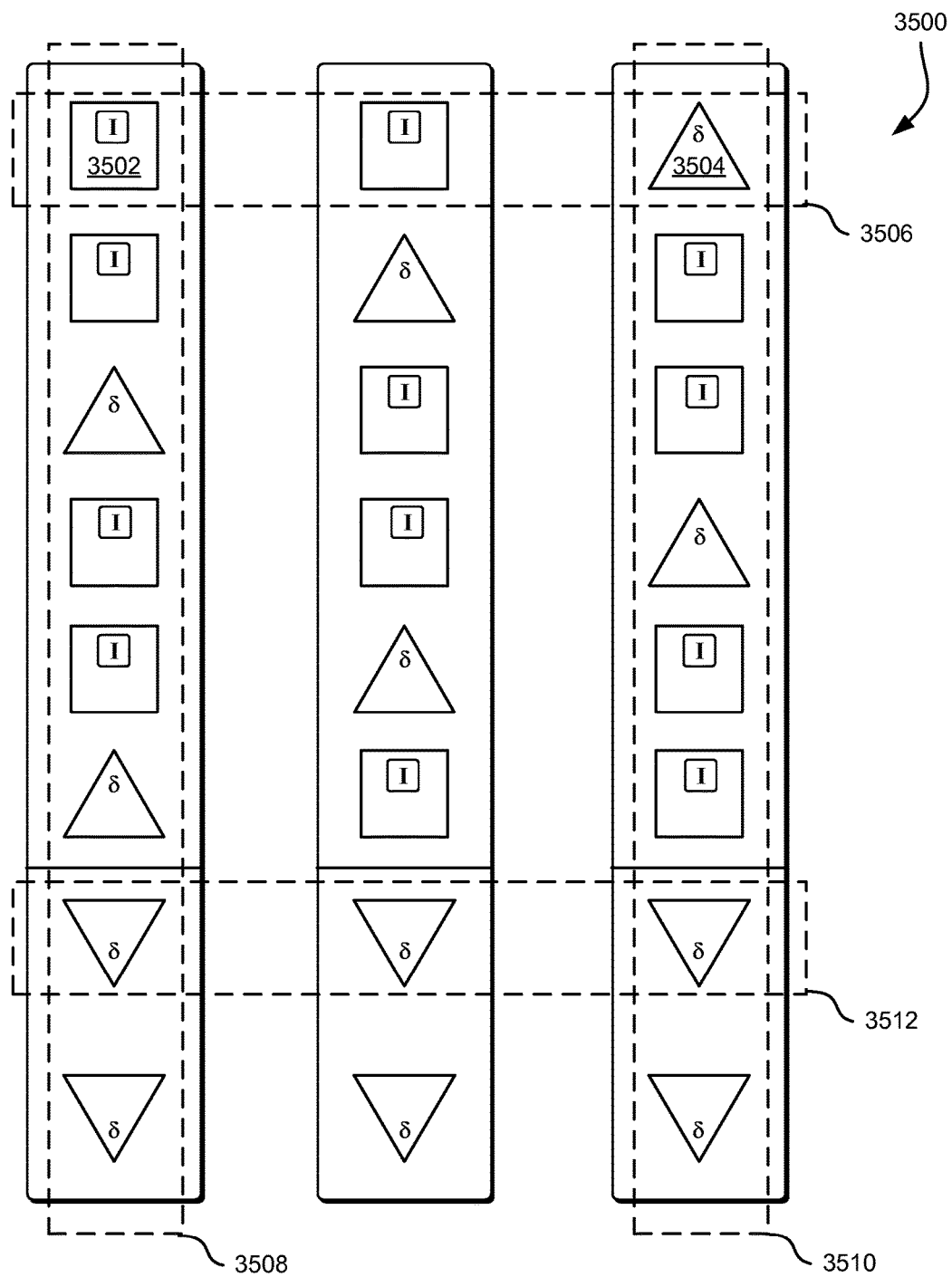
FIG. 35 illustrates an example diagram where data is validated across multiple datacenters using different methods in a grid encoded data storage system in accordance with an embodiment.

FIG. 35 illustrates an example diagram 3500 where data is validated across multiple datacenters using different methods in a grid encoded data storage system as described in connection with FIG. 1 and in accordance with an embodiment. In the example illustrated in FIG. 35, an update may have been made to data shard 3502, the horizontally-derived shard 3504 in the horizontal bundle 3506 may have been updated, and the vertically-derived shards in the horizontal bundle 3508 and the vertical bundle 3510 may also have been updated as described above. The CRC values for each of the updated shards may also be calculated and stored in grid metadata associated with the shard. Additionally, CRC values for one or more shards in the same bundle as a shard (e.g., data shards, horizontally-derived shards, and/or vertically-derived shards) may also be stored in the grid metadata associated with each shard. For example, the CRC value for horizontally-derived shard 3504 may be stored in grid metadata associated with shard 3504, but may also be stored in grid metadata associated with shard 3502 (because validation of the shard 3502 may rely on that CRC value).

Using the techniques described herein, each of the shards in the horizontal bundle 3506 may be validated based on the new CRC values of the associated shards using, for example, the parity property of the CRC values described above. Each of the shards in the horizontal bundle 3508 and/or the vertical bundle 3510 may also be validated based on the new CRC values. Additionally, based on properties of the redundancy encoding scheme used for the grid, the vertically-derived shards in the same corresponding row also form a bundle 3512 using the same redundancy code as the redundancy code used for the horizontal bundle 3508. That is, if the horizontal bundle 3508 is a 3:2 parity encoding based on a parity calculation, then the horizontal bundle 3512 is also a 3:2 parity encoding. Because of this property of a grid of shards, each shard may be verified in multiple ways (e.g., both horizontally and vertically) using the appropriate CRC values.

In the examples of validation processes illustrated in FIGS. 33 to 35, each data shard, and each horizontally-derived shard, has a corresponding CRC value (i.e., because each data shard and each horizontally-derived shard are partitions of a data set as described herein). The corresponding CRC values may be stored in grid metadata associated with the shard as described above. Also in the examples of validation processes illustrated in FIGS. 33 to 35, for each derived shard there is an additional CRC value associated with that derived shard (i.e., associated with how the CRC values are calculated for the derived shard as associated with shards in the same bundle). Additionally, each data shard has a plurality of CRC values for the derived shards associated with that data shard. So, each data shard may have a set of CRC values (which may be stored in grid metadata), each horizontally-derived shard may have at least two CRC values (which may also be stored in grid metadata), and each vertically-derived shard may have one CRC value (which may also be stored in grid metadata).

In some embodiments, the choice of which shards are derived shards for the purposes of CRC validation can be arbitrary and may not be based on the whether the shard is a derived shard for the purposes of grid encoding. For example, a data shard (for the purposes of grid encoding) may be a horizontally-derived shard or a vertically-derived shard for the purposes of CRC validation. In the examples illustrated in FIGS. 33 to 35, the data shards for grid encoding are also data shards (i.e., not derived shards) for the purposes of the CRC validation.

Figure 36:
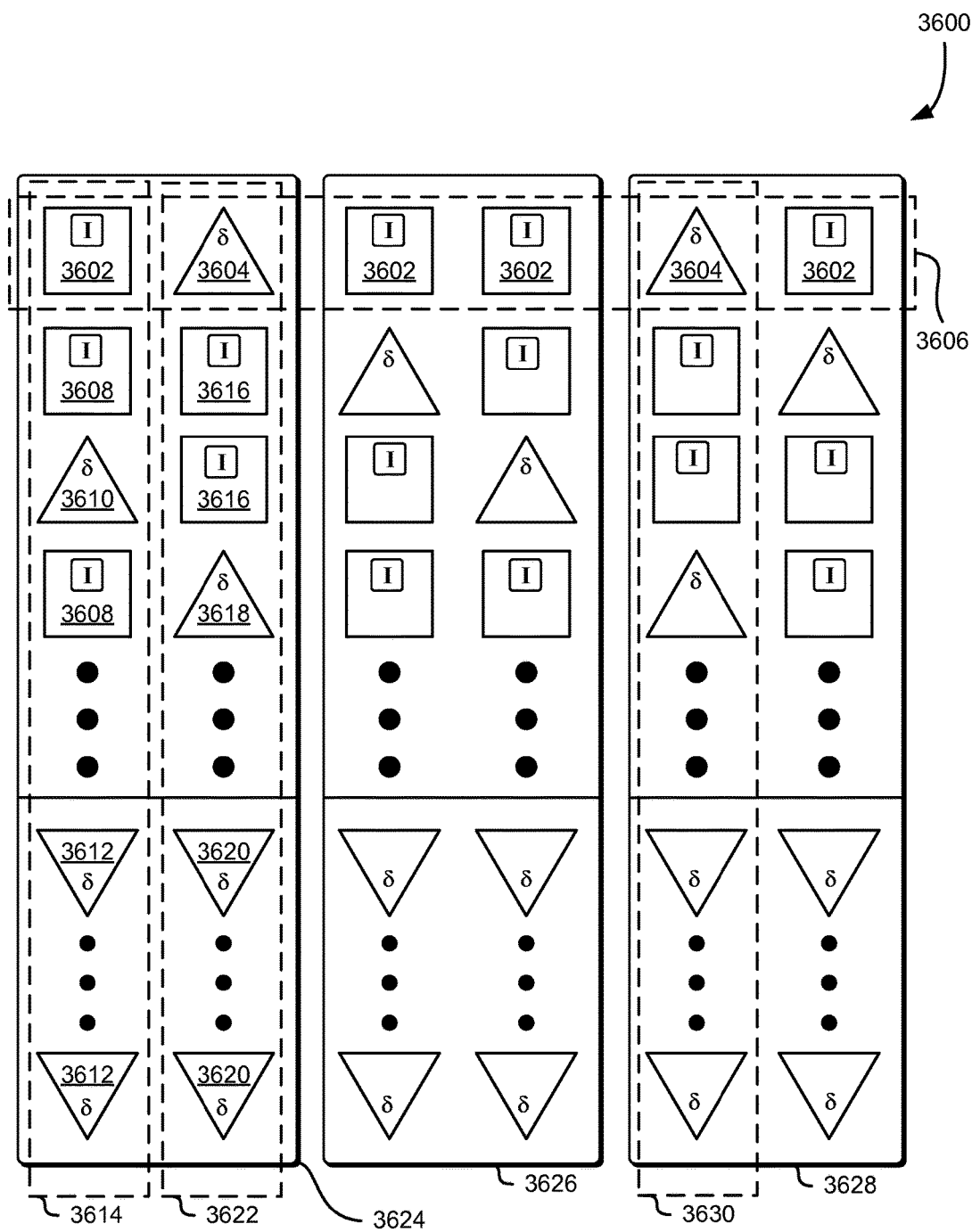
FIG. 36 illustrates an example diagram of a non-parity grid encoded data storage system in accordance with an embodiment.

FIG. 36 illustrates an example diagram 3600 of a non-parity grid encoded data storage system as described in connection with FIG. 1 and in accordance with an embodiment. In the example illustrated in FIG. 36, the horizontal bundle 3606 is a 6:4 Reed-Solomon encoded bundle (i.e., it is not parity encoded). The horizontal bundle 3606 illustrated in FIG. 36 has four data shards 3602 and two horizontally-derived shards 3604. A horizontal bundle that includes data shards may be referred to herein as a "data row." This is in contrast to a horizontal bundle that only contains derived shards (e.g., a row that contains only vertically-derived shards), which may be referred to herein as a "derived row."

In the example illustrated in FIG. 36, each datacenter has two columns but there is no relationship with the vertical bundle associated with each column. For example, the first datacenter 3624 has a first vertical bundle 3614 with data shard 3602, data shards 3608, horizontally-derived shards 3610 (associated with other horizontal bundles), and vertically-derived shards 3612. The first datacenter 3624 also has a second vertical bundle 3622 with one of the two horizontally-derived shards 3604 of horizontal bundle 3606, data shards 3616, horizontally-derived shards 3618 (associated with other horizontal bundles), and vertically-derived shards 3620. In the example illustrated in FIG. 36, the shards in the first vertical bundle 3614 are not related to the shards in the second vertical bundle 3622 except in terms of the associated horizontal bundles. So, for example, the vertically-derived shards 3620 are not based on any calculations associated with the redundancy encoding scheme associated with vertical bundle 3614. The second datacenter 3626 and the third datacenter 3628 also each include two vertical bundles.

A non-parity grid such as the non-parity grid illustrated in FIG. 36 conforms to the same principles as the other grids described herein. For example, the grid may be updated by updating a data shard, updating one or more horizontally-derived shards, updating vertically-derived shards associated with the data shard or shards, and updating vertically-derived shards associated with the updated horizontally-derived shards. In the example illustrated in FIG. 36, an update to the data shard 3602 in the horizontal bundle 3606 that is also in the first datacenter 3624 may cause an update to the two horizontally-derived shards 3604 in the horizontal bundle 3606 and may also cause an update to the vertically-derived shards 3612 in the vertical bundle 3614. The update to the first of the horizontally-derived shards 3604 in vertical bundle 3622 may also cause an update to the vertically-derived shards 3620 in vertical bundle 3622. The update to the second of the horizontally-derived shards 3604 may also cause an update to the vertically-derived shards in the vertical bundle 3630. Other operations including, but not limited to, repair, padding, updating storage devices, and validating can be performed with grids that do not have horizontal parity encoding such as the grid illustrated in FIG. 36.

Figure 37:
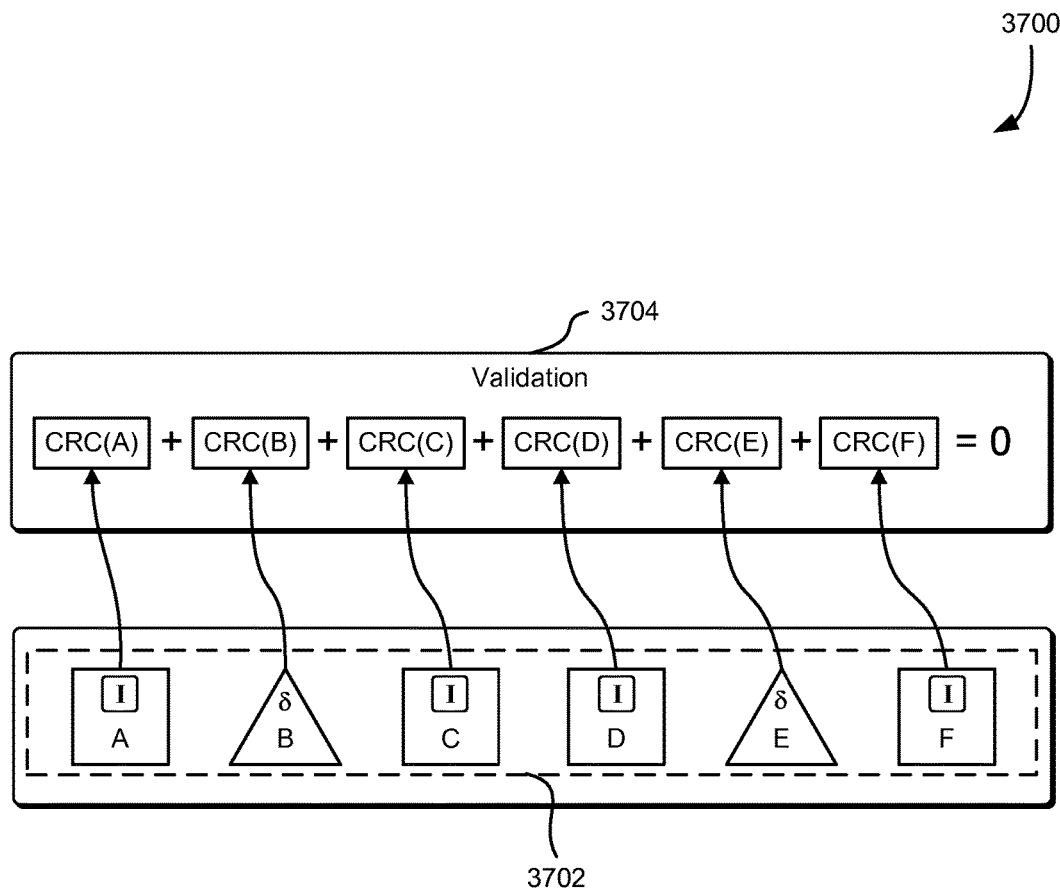
FIG. 37 illustrates an example diagram where data of a non-parity grid encoded data storage system is validated in accordance with an embodiment.

FIG. 37 illustrates an example diagram 3700 where data of a non-parity grid encoded data storage system is validated as described in connection with FIG. 1 and in accordance with an embodiment. In the example illustrated in FIG. 37, a simple parity code is illustrated that utilizes the principles of even parity to validate the CRC values. The shards in the horizontal bundle 3702 can be validated 3704 by adding the CRC values and comparing the sum to zero as described above. It should be noted that the example illustrated in FIG. 37 is a simplification. For example, if the redundancy encoding scheme associated with the horizontal bundle 3702 is a 6:4 Reed-Solomon code, the validation may require a multiplication of each of the CRC values by a constant value and/or a constant polynomial for verification. In the example illustrated in FIG. 37, each of the constants is one.

Figure 38:
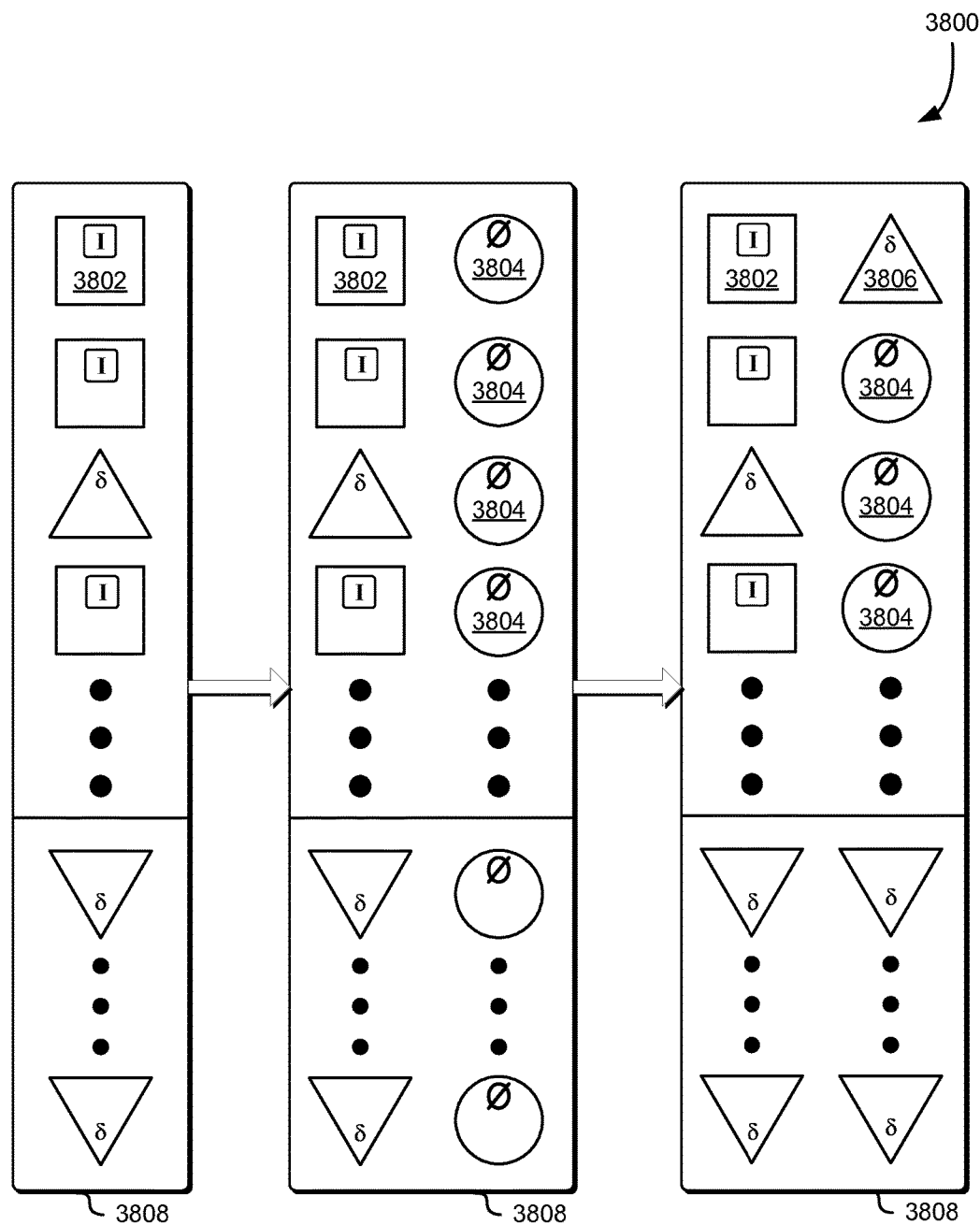
FIG. 38 illustrates an example diagram where data is rebundled in a non-parity grid encoded data storage system in accordance with an embodiment.

FIG. 38 illustrates an example diagram 3800 where data is rebundled in a non-parity grid encoded data storage system as described in connection with FIG. 1 and in accordance with an embodiment. The example illustrated in FIG. 38 illustrates the rebundling of a single datacenter (and a single vertical bundle) to two vertical bundles in a single datacenter. Initially a datacenter 3808 may have a single vertical bundle with data shards such as data shard 3802, horizontally-derived shards (e.g., associated with horizontal bundles), and vertically-derived shards. As a first step in rebundling, a second vertical bundle of null shards 3804 is added to the datacenter 3808. It should be noted that, prior to adding the vertical bundle of null shards to each datacenter, an appropriate new horizontal redundancy encoding scheme must be determined and, in some embodiments, all of the horizontally-derived shards in the grid must be discarded. The horizontally-derived shards may need to be discarded because they were derived based on the prior horizontal redundancy encoding scheme (e.g., 3:2 parity) and that horizontal redundancy encoding scheme may no longer be valid.

After the second vertical bundle of null shards 3804 is added to the datacenter 3808, the null shards in the new vertical bundle may be updated as described above. For example, the first null shard may be converted to a horizontally-derived shard 3806 and updated using the new horizontal redundancy encoding scheme. In some embodiments, the horizontally-derived shards can be at least retained if, for example, the new horizontal redundancy encoding scheme is mathematically equivalent to the previous horizontal redundancy encoding scheme. For example, if the previous horizontal redundancy encoding scheme was 3:2 parity, and the new horizontal redundancy encoding scheme is 4:3 parity, then the addition of a column of null shards may make the 4:3 parity with a null shard in each row mathematically equivalent to 3:2 parity.

In another example of rebundling, a first grid of shards may be rebundled by generating a second grid from the first grid and using shards from the first grid in the second grid (e.g., by providing links or "aliases" of the data storage devices associated with shards of the first grid to the second grid. In contrast to the rebundling described above, the rebundling in this example does not occur "in place" in the first grid of shards. First, a horizontal redundancy encoding scheme is chosen for the second grid of shards. Then, second grid of shards can be created and, one or more data shards from the first grid of shards may be instantiated in the second grid of shards (also referred to herein as "aliasing" the data shards in the first grid of shards). The aliased data shards may be the same shards in both grids, although they may have different row and column indices.

After the data shards from the first grid of shards are aliased in the second grid of shards, additional data shards may be added to the second grid of shards (e.g., empty shards or null shards) and then the second grid of shards may be completed by deriving one or more horizontally-derived shards based on the horizontal redundancy encoding scheme of the second grid of shards, deriving one or more vertically-derived shards based on the vertical redundancy encoding scheme of the second grid of shards (which can, in some embodiments, be the same as the vertical redundancy encoding scheme of the first grid of shards), and finally by replacing the first grid of shards with the second grid of shards (i.e., by removing access by the first grid of shards to the data shards). It should be noted that, although the second grid of shards may have no derived shards, the grid may be completed by performing the equivalent of a complete repair of the grid of shards (i.e., regenerating all derived shards).

In some embodiments, if the horizontal redundancy encoding scheme of the first grid of shards is correctly chosen, then one or more of the horizontally-derived shards of the first grid of shards can also be aliased to the second grid of shards. For example, a parity code of the first grid of shards based on a 3:2 parity encoding may allow the aliasing of horizontally-derived shards into the second grid of shards if the second grid of shards is, for example, a 4:3 parity encoding because, if the new shard in the bundle in the second grid of shards is a null shard, then the parity calculation of the horizontally-derived shard may still be valid (e.g., because as described above, A⊕B is equal to A⊕B⊕0). In such embodiments, one or more vertically-derived shards of the first grid can also be aliased to the second grid of shards because, if the vertical redundancy encoding scheme if the first grid of shards is the same as the vertical redundancy encoding scheme of the second grid of shards, then the vertically-derived shards of all aliased shards may be the same.

Figure 39:
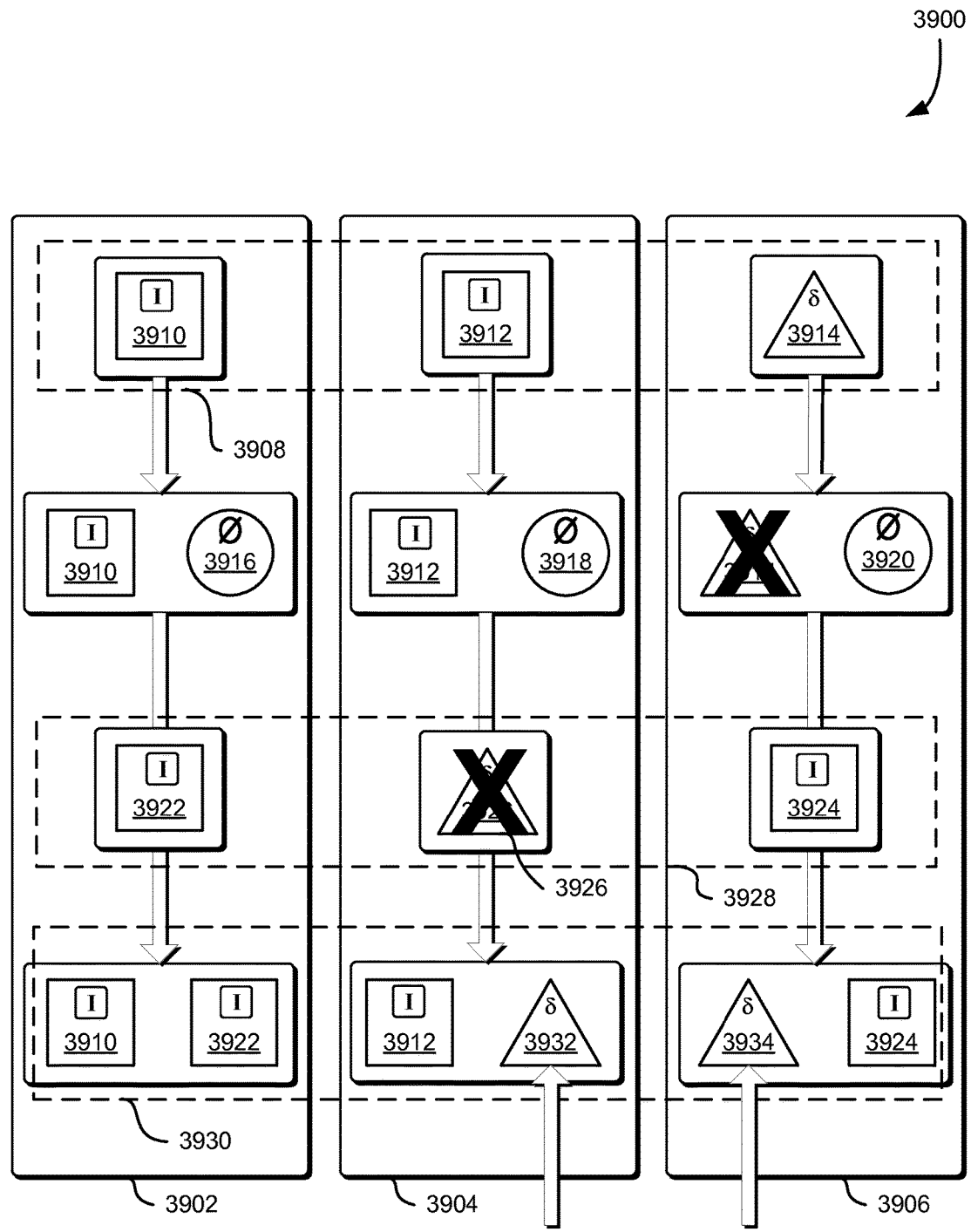
FIG. 39 illustrates an example diagram where data is rebundled in a non-parity grid encoded data storage system in accordance with an embodiment.

FIG. 39 illustrates an example diagram 3900 where data is rebundled in a non-parity grid encoded data storage system as described in connection with FIG. 1 and in accordance with an embodiment. In the example illustrated in FIG. 39, rebundling of a single row (i.e., a single horizontal bundle) is illustrated. A data shard 3910 in a first datacenter 3902, a data shard 3912 in a second datacenter 3904, and a horizontally-derived shard 3914 in a third datacenter 3906 form a horizontal bundle 3908 with, for example, a 3:2 parity redundancy encoding scheme as described herein.

In the first step of the rebundling process illustrated in FIG. 39, a null shard 3916 is added to the first datacenter 3902, a null shard 3918 is added to the second datacenter 3904, and a null shard 3920 is added to the third datacenter 3906. Because the number of shards in the horizontal bundle has increased, the 3:2 parity redundancy encoding scheme may no longer be valid and thus, the derived shard 3914 may be discarded. The derived shard 3914 may be replaced with a null shard or may be replaced with an empty (e.g., not derived) derived shard. In some embodiments, the data storage device associated with the derived shard 3914 is reused for the replacement shard. In some embodiments, the data storage device associated with the derived shard 3914 is replaced with a new data storage device.

In the example illustrated in FIG. 39, shards from different horizontal bundle 3928 are being combined with shards from the horizontal bundle 3908. So, for example, a data shard 3922 of the different horizontal bundle 3928 is added to the first datacenter 3902, replacing the null shard 3916. The data in the data shard 3922 may be copied to the null shard 3916 after the null shard is converted to a data shard if, for example, the data shard 3922 was previously stored in a storage location that is not accessible from the first datacenter 3902. The data shard 3922 may also be added to the grid without copying any data by, for example, associating the null shard 3916 with the data storage device of the data shard 3922 or by, for example, replacing the null shard 3916 with the data shard 3922.

Similarly, a data shard 3924 of the different horizontal bundle 3928 is added to the third datacenter 3906, replacing the null shard 3920. The data in the data shard 3924 may be copied to the null shard 3920 after the null shard is converted to a data shard if, for example, the data shard 3924 was previously stored in a storage location that is not accessible from the third datacenter 3906. The data shard 3924 may also be added to the grid without copying any data by, for example, associating the null shard 3920 with the data storage device of the data shard 3924 or by, for example, replacing the null shard 3920 with the data shard 3924. Just as with the derived shard 3914 of the horizontal bundle 3908, the derived shard 3926 of the different horizontal bundle 3928 may be discarded due to the new horizontal redundancy encoding scheme associated with the grid.

Finally, a new derived shard 3932 may be derived and a new derived shard 3934 may be derived as indicated by the arrows. The deriving of the new derived shards may be based on, for example, a 6:4 Reed-Solomon horizontal redundancy encoding scheme. The horizontal bundle 3930 may then include the data shard 3910 and the data shard 3922 in the first datacenter 3902, the data shard 3912 and the derived shard 3932 in the second datacenter 3904, and the derived shard 3934 and the data shard 3924 in the third datacenter 3906. As described above, each pair of shards in each datacenter may be part of a different vertical bundle in the grid, that is, the vertically-derived shards of the data shard 3910 in the first datacenter 3902 may have no relation to the vertically-derived shards of the data shard 3922 in the first datacenter 3902 other than that the vertically-derived shards also may form elements of horizontal bundles.

Figure 40:
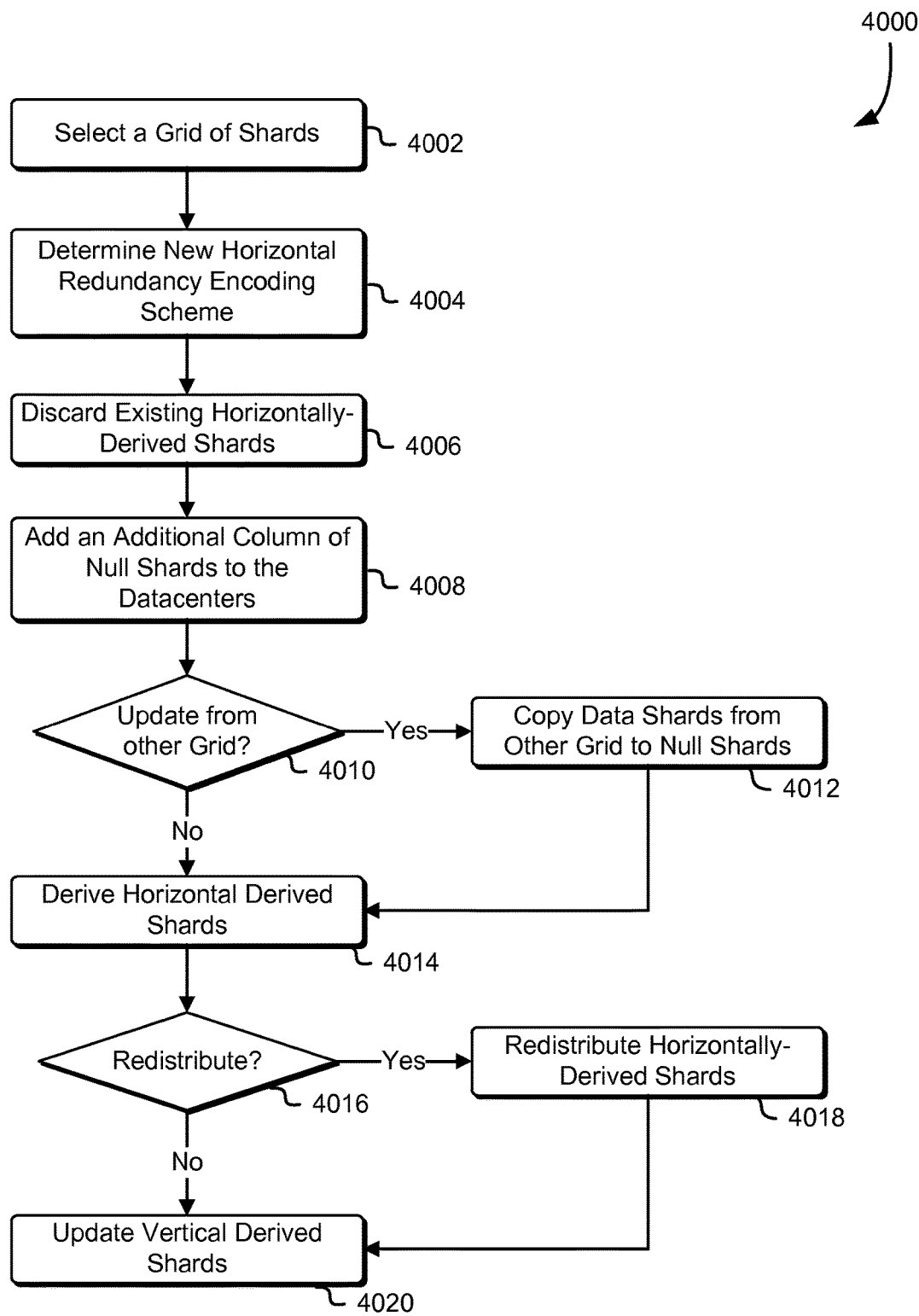
FIG. 40 illustrates an example process for rebundling data in a non-parity grid encoded data storage system in accordance with an embodiment.

FIG. 40 illustrates an example process 4000 for rebundling data in a non-parity grid encoded data storage system as described in connection with FIG. 1 and in accordance with an embodiment. A grid storage service such as the grid storage service 116 described in connection with FIG. 1 may perform the example process 4000 illustrated in FIG. 40. In the example process illustrated in FIG. 40, the grid storage service first selects a grid of shards 4002 with a first horizontal redundancy encoding scheme (e.g., a 3:2 parity redundancy encoding scheme). The grid storage service may then determine 4004 a new horizontal redundancy encoding scheme and based at least in part on that new horizontal redundancy encoding scheme, may discard 4006 any existing horizontally-derived shards.

The grid storage service may next add 4008 an additional column of null shards to one or more datacenters, based on the new horizontal redundancy encoding scheme. For example, if the first horizontal redundancy encoding scheme is a 3:2 parity redundancy encoding scheme with three datacenters, and the new horizontal redundancy encoding scheme is a 4:3 parity redundancy encoding scheme, then the grid storage service may add 4008 a column of null shards to one of the three datacenters. Conversely, if the first horizontal redundancy encoding scheme is a 3:2 parity redundancy encoding scheme with three datacenters, and the new horizontal redundancy encoding scheme is a 6:4 Reed-Solomon redundancy encoding scheme, then the grid storage service may add 4008 a column of null shards to each of the three datacenters. In some embodiments, the number of columns per datacenter is not balanced so that, for example, if the first horizontal redundancy encoding scheme is a 3:2 parity redundancy encoding scheme with three datacenters, and the new horizontal redundancy encoding scheme is a 6:4 Reed-Solomon redundancy encoding scheme, then the grid storage service may add 4008 three columns of null shards to one of the datacenters or may add 4008 two columns of null shard to one datacenter and one column of null shards to another datacenter.

The grid storage service may next determine 4010 whether to update the rebundled grid with data from another grid. For example, the rebundling may be rebundling two 3:2 grids to a single 6:4 grid. In that example, the data shards from the second 3:2 grid may be added to the first 3:2 grid by copying 4012 the contents of the data shards in the second grid to the null shards in the first grid as described above (i.e., the shards may be copied into new data shards corresponding to the null shards, or the data of the data shards may be copied into new data shards corresponding to the null shards, or the data shards may replace the null shards). Also as described above, the horizontally-derived shards in the other grid may be discarded if, for example, they are not mathematically equivalent to derived shards in the rebundled grid. In some embodiments, some or all of the derived shards from the grids are retained and/or reused.

The grid storage service may then derive 4014 the horizontally-derived shards of the new horizontal bundle corresponding to each row based on the new horizontal redundancy encoding scheme. In some embodiments, the grid storage service may convert one or more null shards to derived shards before deriving the horizontally-derived shards of the new horizontal bundle corresponding to each row based on the new horizontal redundancy encoding scheme.

The grid storage service may then determine 4016 whether the derived shards should be redistributed if, for example, the derived shards must be balanced (i.e., equally distributed) among datacenters as described above. If so, the grid storage service may redistribute 4018 the horizontally-derived shards. In some embodiments, the grid storage service can determine 4016 whether to redistribute the horizontally-derived shards before deriving the horizontally-derived shards so that, for example, the deriving is not performed more than once (i.e., once before redistributing and once after redistributing). Finally, the update 4020 the vertically-derived shards of the grid based on the changes to the rows as described above.

Figure 41:
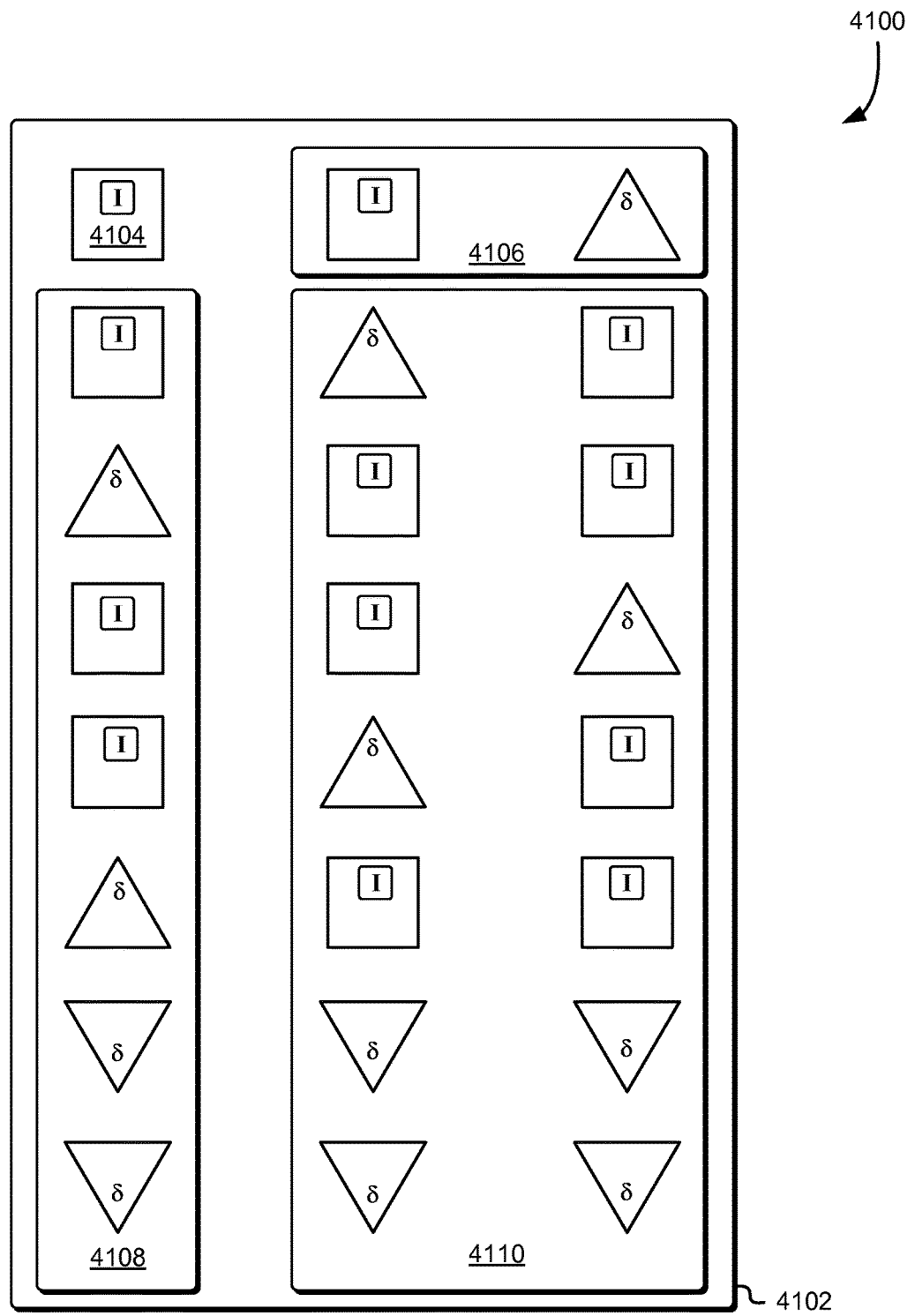
FIG. 41 illustrates an example diagram where data sets are partitioned using a grid encoded data storage system in accordance with an embodiment.

FIG. 41 illustrates an example diagram 4100 where data sets are partitioned using a grid encoded data storage system as described in connection with FIG. 1 and in accordance with an embodiment. The example illustrated in FIG. 41 shows a partitioning of the grid that can be used to derive the data in the data shard 4104. As used herein, a partitioning of a grid is a set of disjoint sets of shards of the grid. Each of the disjoint sets is referred to herein as a partition. So using a set containing {A, B, C, D, E, F}, a partitioning of the set may be {{A, B}, {C, D}, {E, F}} with the first partition being {A, B}, the second partition being {C, D}, and a third partition being {E, F}. There is no requirement that the partitions be equally sized so, for example, another partitioning of the set {A, B, C, D, E, F} is {{A}, {B, C, D, E, F}}. Another valid partitioning of the set {A, B, C, D, E, F} is the single partition {{A, B, C, D, E, F}}. As used herein, a partitioning of a set includes every element of the set and each element of the set is included in exactly one partition. So {{A, B}, {D, E, F}} is not a valid partitioning of the set {A, B, C, D, E, F} because element "C" is missing and {{A, B, C, D}, {D, E, F}} is also not a valid partitioning of the set {A, B, C, D, E, F} because element "D" is repeated twice. Stated a different way, the union of the partitions in a partitioning of a set is identical to the set, and the intersection of each of the pairs of partitions of a partitioning of a set is the empty set.

In the example illustrated in FIG. 41, the grid of shards 4102 is partitioned with partitioning having a first partition containing only a first shard 4104, a second partition 4106 containing a set of shards that have the same corresponding row as the first shard 4104, but have a different column than the first shard 4104, a third partition 4108 containing a set of shards that have the same corresponding column as the first shard 4104, but have a different row than the first shard 4104, and a fourth partition 4110 containing a set of shards that have a different row than the first shard 4104 and a different column than the first shard 4104.

One aspect of the partitioning of a grid of shards is that each of the partitions associated with a particular shard (e.g., the first shard 4104) is a copy of the shard in that the data in the shard can be reproduced using only the shards in the partition. For example, the data in the first shard 4104 is stored in the first shard, which is the first copy of the data in the shard. Additionally, the data in the first shard 4104 can be reproduced from the shards in the second partition 4106 using, for example, the horizontal redundancy encoding scheme associated with the horizontal bundle containing the first shard 4104 and the shards in the second partition 4106. The data in the first shard 4104 can also be reproduced from the shards in the third partition 4108 using, for example, the vertical redundancy encoding scheme associated with the vertical bundle containing the first shard 4104 and the shards in the third partition 4108.

Finally, the data in the first shard 4104 can be reproduced from the shards in the fourth partition 4110 because the shards in the fourth partition can be used to reproduce the shards in the third partition 4108 using the horizontal redundancy encoding scheme associated with the grid and, as described above, the first shard 4104 can be reproduced from the shards in the third partition 4108 using the vertical redundancy encoding scheme associated with the vertical bundle containing the first shard 4104 and the shards in the third partition 4108. Similarly, the shards in the fourth partition can be used to reproduce the shards in the second partition 4106 using the vertical redundancy encoding scheme associated with the grid and, as described above, the first shard 4104 can be reproduced from the shards in the second partition 4106 using the horizontal redundancy encoding scheme associated with the horizontal bundle containing the first shard 4104 and the shards in the second partition 4106.

It should be noted that, because the shards in each vertical bundle may be located in different datacenters as described above, and because those datacenters may be geographically distributed, the partitioning of a grid of shards, which is an inherent property of the grid, also provides redundancy (and, in some embodiments, geographical redundancy) for the data stored in the grid of shards. For example, if a first datacenter is located in North America, a second datacenter is located in South America, and a third datacenter is located in Europe, a grid of shards provides geographical redundancy of the data stored in a grid of shards distributed across the three datacenters. Including the first shard 4104, there are four partitions of the grid of shards, corresponding to four copies of the data in the first shard 4104.

Figure 42:
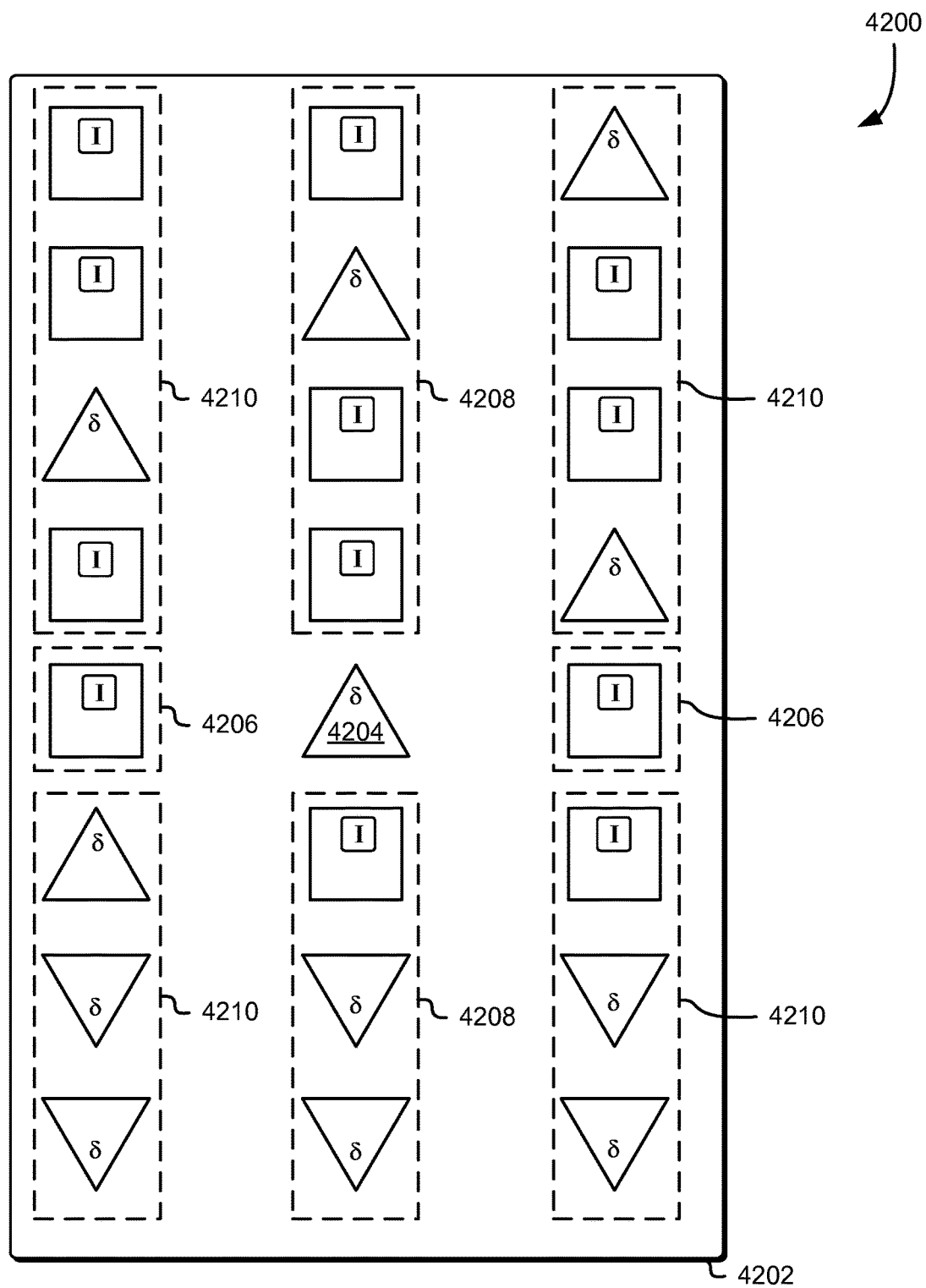
FIG. 42 illustrates an example diagram where data sets are partitioned using a grid encoded data storage system in accordance with an embodiment.

FIG. 42 illustrates an example diagram 4200 where data sets are partitioned using a grid encoded data storage system as described in connection with FIG. 1 and in accordance with an embodiment. The example illustrated in FIG. 42 shows a partitioning of the grid of shards 4202 that is based on a different shard (in this case, a horizontally-derived shard 4204). In the example illustrated in FIG. 42, the partitions are illustrated with dashed lines, which are not intended to illustrate horizontal bundles or vertical bundles as illustrated above. The example illustrated in FIG. 42 illustrates a partitioning of a subset of the grid of shards 4202 that does not include the horizontally-derived shard 4204. That is the partitioning of the grid of shards 4202 that does not include the horizontally-derived shard 4204 has three partitions and thus has three copies of the horizontally-derived shard 4204.

The first partition of the partitioning of the subset of the grid of shards 4202 that does not include the horizontally-derived shard 4204 has a first partition 4206 containing a set of shards that have the same corresponding row as the horizontally-derived shard 4204, but have a different column than the horizontally-derived shard 4204, a second partition 4208 containing a set of shards that have the same corresponding column as the horizontally-derived shard 4204, but have a different row than the horizontally-derived shard 4204, and a third partition 4210 containing a set of shards that have a different row than the horizontally-derived shard 4204, and a different column than the horizontally-derived shard 4204. Each of the partitions of the partitioning of the subset of the grid of shards 4202 that does not include the horizontally-derived shard 4204 can be used to reproduce the horizontally-derived shard 4204 as described above in connection with FIG. 41. For example, the shards in the first partition 4206 can be used to reproduce the horizontally-derived shard 4204 using a horizontal redundancy encoding scheme associated with the grid of shards, the shards in the second partition 4208 can be used to reproduce the horizontally-derived shard 4204 using a vertical redundancy encoding scheme associated with the grid of shards 4202. Finally, the shards in the third partition 4210 can be used to reproduce the shards in the first partition 4206 using the vertical redundancy encoding scheme associated with the grid of shards 4202 and can also be used to reproduce the shards in the second partition 4208 using the horizontal redundancy encoding scheme associated with the grid of shards 4202.

Figure 43:
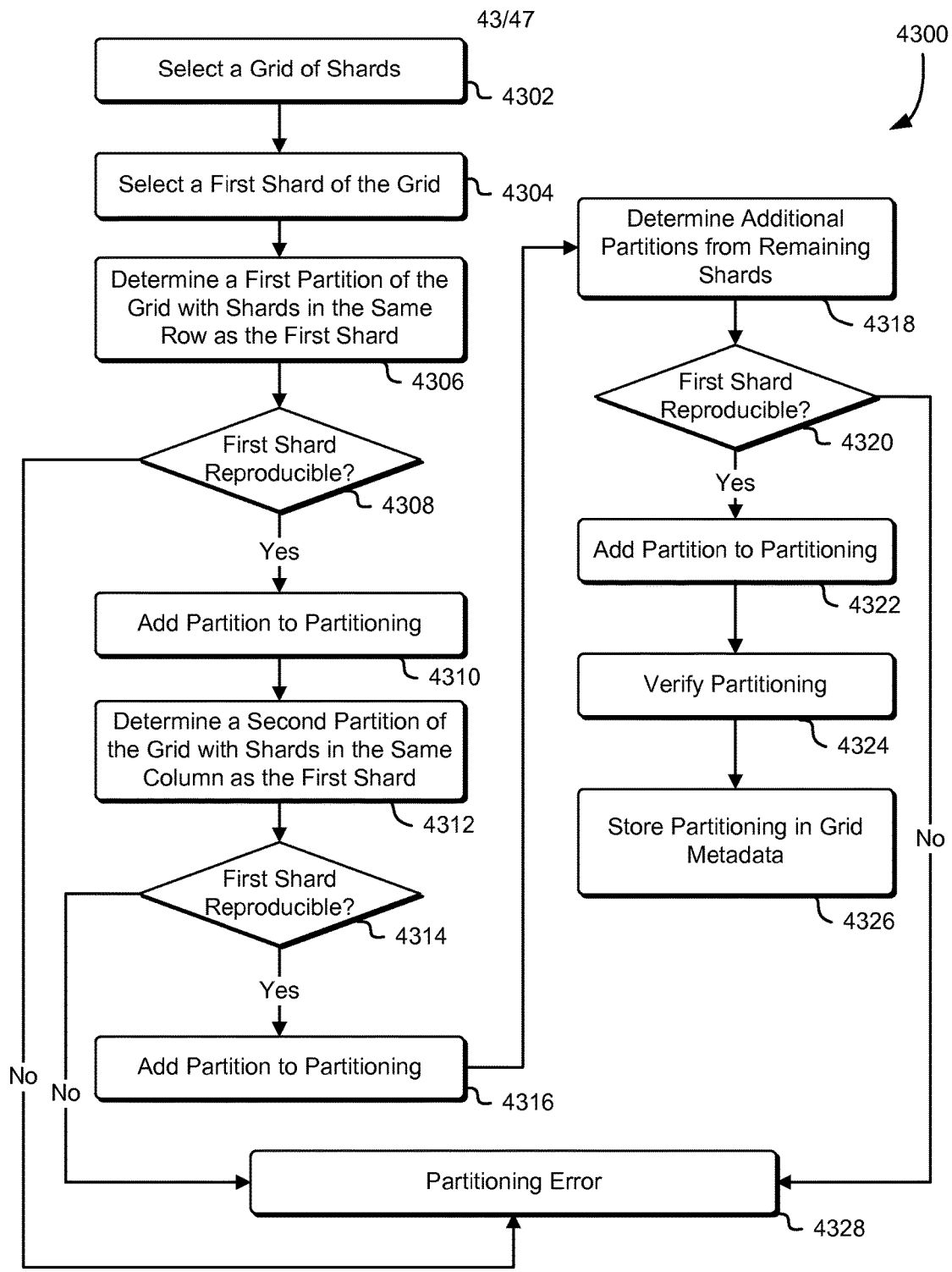
FIG. 43 illustrates an example process for partitioning data sets using a grid encoded data storage system in accordance with an embodiment.

FIG. 43 illustrates an example process 4300 for partitioning data sets using a grid encoded data storage system as described in connection with FIG. 1 and in accordance with an embodiment. A grid storage service such as the grid storage service 116 described in connection with FIG. 1 may perform the example process 4300 illustrated in FIG. 43. A grid storage service may first select 4302 a grid of shards and may select 4304 a first shard of the grid of shards. The grid storage service may then determine 4306 a first partition of the grid of shards that contains one or more shards with the same corresponding row as the first shard, but does not include the first shard. The first partition may be determined such that the shards in the first partition may be used to regenerate the first shard based on, for example, a horizontal redundancy encoding scheme associated with the grid of shards. In an embodiment, the horizontal redundancy encoding scheme associated with the grid of shards will allow a plurality of first partitions such that the shards in each of the first partitions may be used to regenerate the first shard based on the horizontal redundancy encoding scheme associated with the grid of shards (i.e., if the horizontal redundancy encoding scheme associated with the grid of shards has multiple derived shards and one or more of the derived shards are redundant). If the first shard is reproducible 4308 from the partition, then the grid storage service may add 4310 the partition to the partitioning of the grid of shards and may also mark each of the shards in the first partition or partitions as already used in the partitioning for the first shard.

The grid storage service may then determine 4312 a second partition of the grid of shards that contains one or more shards with the same column as the first shard, but does not include the first shard. The second partition may be determined such that the shards in the second partition may be used to regenerate the first shard based on, for example, a vertical redundancy encoding scheme associated with the grid of shards. As with the horizontal redundancy encoding scheme, the vertical horizontal redundancy encoding scheme may allow a plurality of second partitions such that the shards in the second partitions may be used to regenerate the first shard based on the vertical redundancy encoding scheme associated with the grid of shards. If the first shard is reproducible 4314 from the partition, then the grid storage service may add 4316 the partition to the partitioning of the grid of shards and may also mark each of the shards in the second partition or partitions as already used in the partitioning for the first shard.

The grid storage service may then determine 4318 one or more additional partitions of the grid of shards from the shards not previously marked. The additional partitions may be determined such that the shards in the additional partitions may be used to regenerate the first shard based on either the horizontal redundancy encoding scheme associated with the grid of shards, the vertical redundancy encoding scheme associated with the grid of shards, or a combination of the horizontal and vertical redundancy encoding schemes. If the first shard is reproducible 4320 from the additional partition, then the grid storage service may add 4322 the additional partition to the partitioning of the grid of shards and may also mark each of the shards in the additional partition or partitions as already used in the partitioning for the first shard.

The grid storage service may then verify 4324 the partitioning by ensuring that each shard is in exactly one partition and each pair of partitions in the partitioning is disjoint. The grid storage service may then store 4326 the partitioning data in the grid metadata associated with the first shard and, in some embodiments, select the next shard of the grid of shards. If the grid storage service is not able to reproduce the first shard from each of the partitions, the grid storage service may generate a partitioning error that may, for example, cause the grid to be regenerated and/or reorganized so that the grid may be successfully partitioned.

Figure 44:
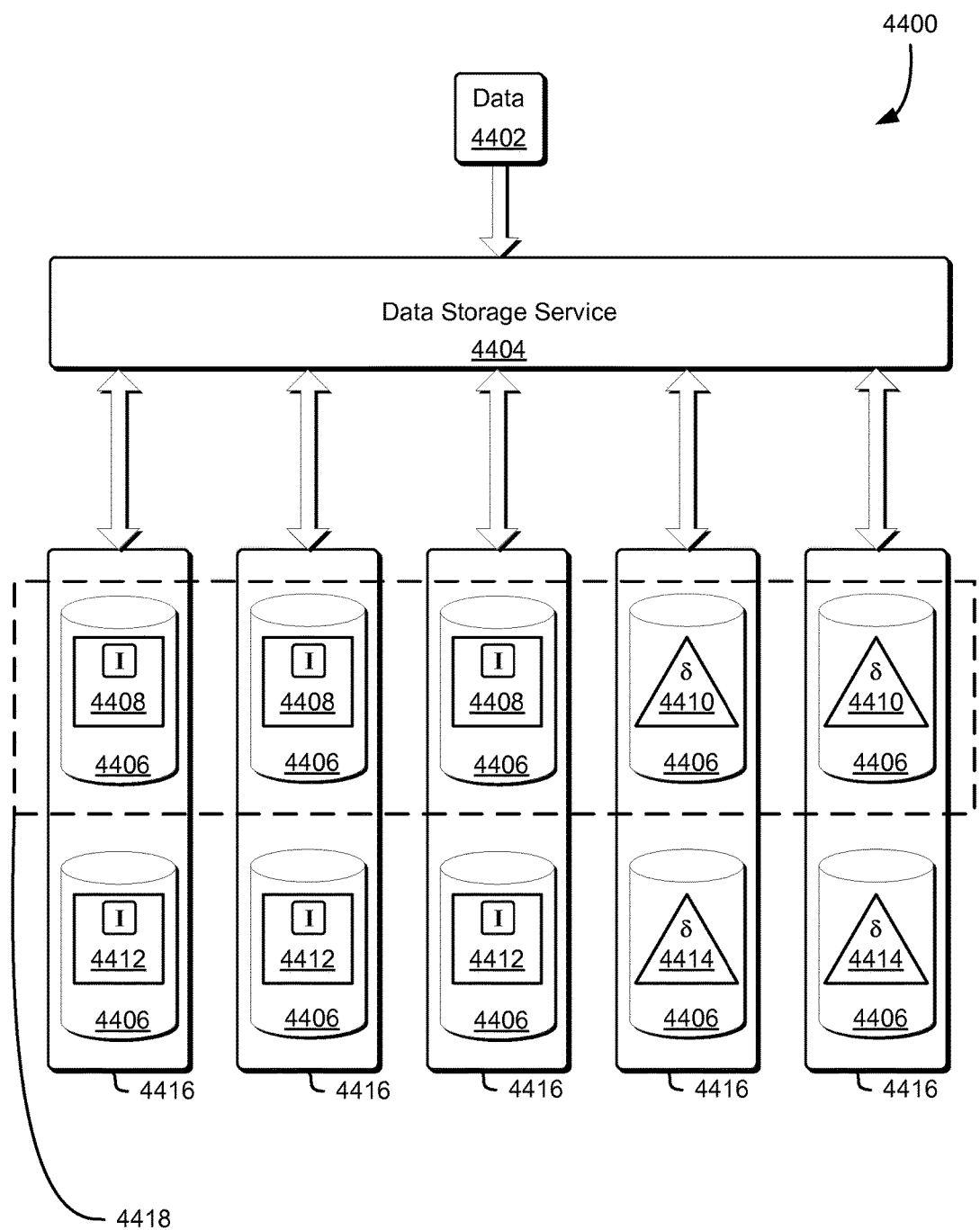
FIG. 44 illustrates an example environment where data may be stored in a grid encoded data storage system in accordance with an embodiment.

FIG. 44 illustrates an environment 4400 where data may be stored in a redundancy coded data storage system as described in connection with FIG. 1 and in accordance with an embodiment. The redundancy encoding technique illustrated in FIG. 44 is an example of a bundle encoding technique wherein one or more identity shards (also referred to herein as "data shards") may be bundled with one or more derived shards in a single group or dimension. Additional details of bundle encoding techniques are described in U.S. patent application Ser. No. 14/741,409, entitled "ADAPTIVE DATA LOSS MITIGATION FOR REDUNDANCY CODING SYSTEMS", which is incorporated by reference herein.

Data 4402 may be sent to a data storage system 4404 for redundant storage. The data 4402 may be provided by any entity capable of transacting data with a data storage system, such as over a network (including the Internet). Examples include physical computing systems (e.g., servers, desktop computers, laptop computers, thin clients, and handheld devices such as smartphones and tablets), virtual computing systems (e.g., as may be provided by the computing resource service provider using one or more resources associated therewith), services (e.g., such as those connecting to the data storage system 4404 via application programming interface calls, web service calls, or other programmatic methods), and the like.

The data storage system 4404 may be any computing resource or collection of such resources capable of processing data for storage, and interfacing with one or more resources to cause the storage of the processed data. Examples include physical computing systems (e.g., servers, desktop computers, laptop computers, thin clients, and handheld devices such as smartphones and tablets), virtual computing systems (e.g., as may be provided by the computing resource service provider using one or more resources associated therewith), services (e.g., such as those connecting to the data storage system 4404 via application programming interface calls, web service calls, or other programmatic methods), and the like. In some embodiments, the resources of the data storage system 4404 and the data storage system 4404 are resources of the one or more resources of a computing resource service provider, such as that described in further detail below. In some embodiments, the data storage system 4404 and/or the computing resource service provider provide one or more archival storage services and/or grid storage services, such as those described herein, through which a client entity may provide data such as the data 4402 for storage in the data storage system 4404.

Data such as the data 4402 (which may also be referred to herein as an "archive") may include any quantity of data in any format. For example, the data 4402 may be a single file, or may include several files. The data 4402 may also be encrypted by, for example, a component of the data storage system 4404 after the receipt of the data 4402 in response to a request made by a customer of the data storage system 4404 and/or by a customer of computing resource service provider.

The data storage system 4404 may sort one or more identity shards according to one or more criteria (and in the case where a plurality of criteria is used for the sort, such criteria may be sorted against sequentially and in any order appropriate for the implementation). Such criteria may be attributes common to some or all of the archives, and may include the identity of the customer, the time of upload and/or receipt (by the data storage system 4404), archive size, expected volume and/or shard boundaries relative to the boundaries of the archives (e.g., so as to minimize the number of archives breaking across shards and/or volumes), and the like. As mentioned, such sorting may be performed so as to minimize the number of volumes on which any given archive is stored. Such techniques may be used, for example, to optimize storage in an embodiment where the overhead of retrieving data from multiple volumes is greater than the benefit of parallelizing the retrieval from the multiple volumes. Information regarding the sort order may be persisted, for example, by the data storage system 4404, for use in techniques described in further detail herein.

As previously discussed, in some embodiments, one or more indices are generated in connection with, for example, the order in which the archives are to be stored, as determined in connection with the sorting mentioned immediately above. The index may be a single index or may be a multipart index, and may be of any appropriate architecture and may be generated according to any appropriate method. For example, the index may be a bitmap index, dense index, sparse index, or a reverse index. Embodiments where multiple indices are used may also implement different types of indices according to the properties of the identity shard to be stored via the data storage system 4404. For example, a data storage system 4404 may generate a dense index for archives over a specified size (as the size of the index itself may be small relative to the number of archives stored on a given volume), and may also generate a sparse index for archives under that specified size (as the ratio of index size to archive size increases).

The data storage system 4404 is connected to or includes one or more volumes 4406 on which archives or identity shards may be stored. The generated indices for the archives may also be stored on the one or more volumes 4406. The volumes 4406 may be any container, whether logical or physical, capable of storing or addressing data stored therein. In some embodiments, the volumes 4406 map on a one-to-one basis with the data storage devices on which they reside (and, in some embodiments, may actually be the data storage devices themselves). In some embodiments, the size and/or quantity of the volumes 4406 are independent of the capacity of the data storage devices on which they reside (e.g., a set of volumes may each be of a fixed size such that a second set of volumes may reside on the same data storage devices as the first set). The data storage devices may include any resource or collection of resources, such as those of a computing resource service provider, that are capable of storing data, and may be physical, virtual, or some combination of the two.

As previously described, one or more indices may be generated for each volume of the plurality of volumes 4406, and may reflect the archives stored on the respective volume to which it applies. In an embodiment where sparse indices are used, a sparse index for a given volume may point to a subset of archives stored or to be stored on that volume, such as those archives which may be determined to be stored on the volume based on the sort techniques mentioned previously. The subset of volumes to be indexed in the sparse index may be selected on any appropriate basis and for any appropriate interval. For example, the sparse index may identify the archives to be located at every x blocks or bytes of the volume (e.g., independently of the boundaries and/or quantity of the archives themselves). As another example, the sparse index may identify every nth archive to be stored on the volume. As may be contemplated, the indices (whether sparse or otherwise), may be determined prior to actually storing the archives on the respective volumes. In some embodiments, a space is reserved on the volumes so as to generate and/or write the appropriate indices after the archives have been written to the volumes 4406.

In some embodiments, the sparse indices are used in connection with information relating to the sort order of the archives so as to locate archives without necessitating the use of dense indices, for example, those that account for every archive on a given volume. Such sort order-related information may reside on the volumes 4406 or, in some embodiments, on an entity separate from the volumes 4406, such as in a data store or other resource of a computing resource service provider. Similarly, the indices may be stored on the same volumes 4406 to which they apply, or, in some embodiments, separately from such volumes 4406.

The archives may be stored, bit for bit (e.g., the "original data" of the archives), on a subset of the plurality of volumes 4406. Also as mentioned, appropriate indices may also be stored on the applicable subset of the plurality of volumes 4406. The original data of the archives is stored as a plurality of shards across a plurality of volumes, the quantity of which (either shards or volumes, which in some cases may have a one to one relationship) may be predetermined according to various factors, including the number of total shards that may be used to reconstruct the original data using a redundancy encoding. In some embodiments, the number of volumes used to store the original data of the archives is the quantity of shards that may be used to reconstruct the original data from a plurality of shards generated by a redundancy code from the original data. As an example, FIG. 44 illustrates five volumes, three of which contain original data archives 4408 and two of which contain derived data 4410, such as redundancy encoded data. In the illustrated example, the redundancy code used may require any three shards to regenerate original data, and therefore, a quantity of three volumes may be used to write the original data (even prior to any application of the redundancy code).

The volumes 4406 bearing the original data archives 4408 may each contain or be considered as shards unto themselves. In embodiments where the sort order-related information and/or the indices are stored on the applicable volumes 4406, they may be included with the original data of the archives and stored therewith as shards, as previously mentioned. In the illustrated example, the original data archives 4408 are stored as three shards (which may include the respective indices) on three associated volumes 4406. In some embodiments, the original data archives 4408 (and, in embodiments where the indices are stored on the volumes, the indices) are processed by an entity associated with, for example, the archival storage service, using a redundancy code, such as an erasure code, so as to generate the remaining shards, which contain encoded information rather than the original data of the original data archives. The original data archives 4408 may be processed using the redundancy code at any time after being sorted, such as prior to being stored on the volumes, contemporaneously with such storage, or after such storage.

Such encoded information may be any mathematically computed information derived from the original data, and depends on the specific redundancy code applied. As mentioned, the redundancy code may include erasure codes (such as online codes, Luby transform codes, raptor codes, parity codes, Reed-Solomon codes, Cauchy codes, Erasure Resilient Systematic Codes, regenerating codes, or maximum distance separable codes) or other forward error correction codes. In some embodiments, the redundancy code implements a generator matrix that implements mathematical functions to generate multiple encoded objects correlated with the original data to which the redundancy code is applied. In some of such embodiments, an identity matrix is used, wherein no mathematical functions are applied and the original data (and, if applicable, the indices) are allowed to pass straight through. In such embodiments, the volumes bearing the original data (and the indices) may also correspond to objects encoded from that original data by the identity matrix rows of the generator matrix of the applied redundancy code, while volumes bearing derived data correspond to other rows of the generator matrix. In the example illustrated in FIG. 44, the five volumes 4406 include three volumes that have shards (e.g., identity shards) corresponding to the original data of the original data archives 4408, while two have encoded shards corresponding to the derived data 4410 (also referred to herein as "derived shards"). As illustrated in FIG. 44, the three original data archives 4408, and the two encoded shards corresponding to the derived data 4410 form a bundle 4418 (denoted by the dashed line). In this example, the applied redundancy code may result in the data being stored in a "3:5" scheme, wherein any three shards of the five stored shards are required to regenerate the original data, regardless of whether the selected three shards contain the original data or the derived data.

In some embodiments, if one of the volumes 4406 or a shard stored thereon is detected as corrupt, missing, or otherwise unavailable, a new shard is generated using the redundancy code applied to generate the shard(s) in the first instance. The new shard may be stored on the same volume or a different volume, depending, for example, on whether the shard is unavailable for a reason other than the failure of the volume. The new shard may be generated by, for example, the data storage system 4404, by using a quantity of the remaining shards that may be used to regenerate the original data (and the index, if applicable) stored across all volumes, regenerating that original data, and either replacing the portion of the original data corresponding to that which was unavailable (in the case that the unavailable shard contains original data), or reapplying the redundancy code so as to provide derived data for the new shard.

As previously discussed, in some embodiments, the new shard is a replication of the unavailable shard, such as may be the case if the unavailable shard includes original data of the archive(s). In some embodiments, the new shard is selected from a set of potential shards as generated by, for example, a generator matrix associated with the redundancy code, so as to differ in content from the unavailable shard (such as may be the case if the unavailable shard was a shard generated from the redundancy code, and therefore contains no original data of the archives). As discussed throughout this disclosure, the shards and/or volumes may be grouped and/or layered.

In some embodiments, retrieval of an archive stored in accordance with the techniques described herein is requested by a client entity under control of a customer of the computing resource service provider and/or the archival storage service provided therefrom, as described in further detail throughout this disclosure. In response to the request, the data storage system 4404 may locate, based on information regarding the sort order of the archives as stored on the volumes 4406, the specific volume on which the archive is located. Thereafter, the index or indices may be used to locate the specific archive, whereupon it may be read from the volume and provided to a requesting client entity. In embodiments where sparse indices are employed, the sort order information is used to locate the nearest location (or archive) that is sequentially prior to the requested archive, whereupon the volume is sequentially read from that location or archive until the requested archive is found. In embodiments where multiple types of indices are employed, the data storage system 4404 may initially determine which of the indices includes the most efficient location information for the requested archive based on assessing the criteria used to deploy the multiple types of indices in the first instance. For example, if archives under a specific size are indexed in a sparse index and archives equal to or over that size are indexed in a parallel dense index, the data storage system 4404 may first determine the size of the requested archive, and if the requested archive is larger than or equal to the aforementioned size boundary, the dense index may be used so as to more quickly obtain the precise location of the requested archive.

In some embodiments, the volumes 4406 are grouped such that each given volume has one or more cohorts 4416. In such embodiments, a volume set (e.g., all of the illustrated volumes 4406) may be implemented such that incoming archives to be stored on the volumes are apportioned to one or more failure-decorrelated subsets of the volume set. The failure-decorrelated subsets may be some combination of the volumes 4406 of the volume subset, where the quantity of volumes correlates to a number of shards required for the implemented redundancy code. In the illustrated example, the overall volume set may comprise two failure-decorrelated subsets (volumes in a horizontal row) where a given constituent volume is paired with a cohort (e.g., the cohort 4416). In some embodiments, the incoming archives are apportioned to one or more of the cohorts in the failure-decorrelated subset according to, for example, a predetermined sequence, based on one or more attributes of the incoming archives, and the like.

The illustrated example shows, for clarity, a pair-wise cohort scheme, though other schemes are contemplated as within scope of this disclosure, some of which are outlined in greater detail herein. In the illustrated example, some of the volumes of the volume set store original data of incoming archives (e.g., original data archives 4408 and or original data archives 4412), while others store derived data (e.g., derived data 4410 and derived data 4414). The data storage system 4404 may implement a number of failure-decorrelated subsets to which to store the incoming archives, and in the pair-wise scheme illustrated, the volumes used for a given archive may differ based on some arbitrary or predetermined pattern. As illustrated, some archives may be apportioned to volumes of a given cohort that are assigned to one pattern, or failure-decorrelated subset as shown by original data archives 4408 and derived data 4410, while others are apportioned to volumes in a different pattern as shown by original data archives 4412 and derived data 4414. The patterns, as mentioned, may be arbitrary, predefined, and/or in some cases, sensitive to attributes of the incoming data. Patterns may also not be used at all, and the member volumes of a given failure-decorrelated subset may be selected randomly from a pool of volumes in the volume set.

Figure 45:
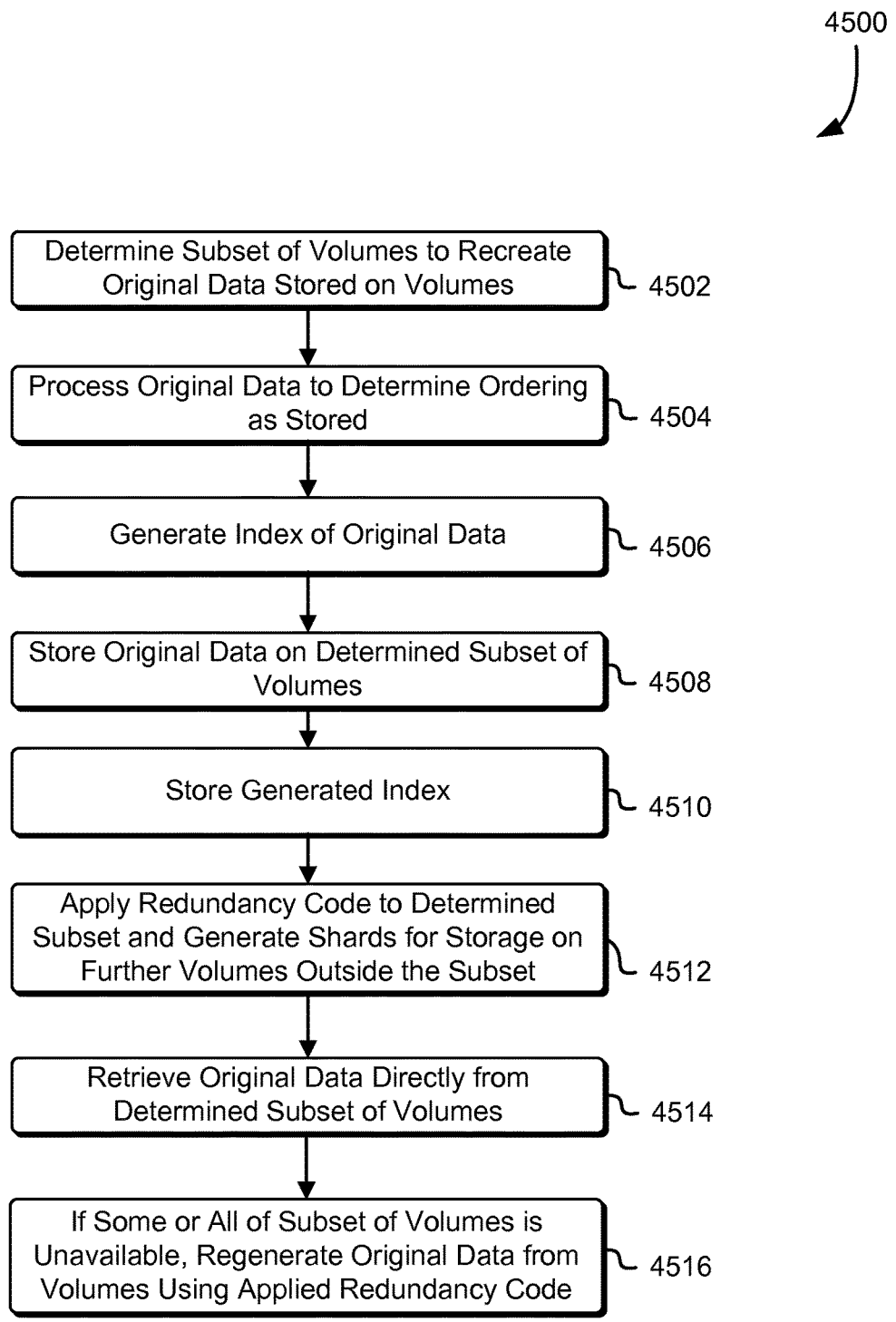
FIG. 45 illustrates an example process for processing, indexing, storing, and retrieving data of a grid encoded data storage system in accordance with an embodiment.

FIG. 45 illustrates an example process 4500 for applying redundancy encoding techniques to data stored in durable storage as described herein in connection with FIG. 1 and in accordance with an embodiment. The example process 4500 illustrated in FIG. 45 illustrates the processing, indexing, storing, and retrieving of data stored on a data storage system. The data may be retrieved from preliminary storage as described herein. The example process 4500 illustrated in FIG. 45 may be used in conjunction with a grid encoding technique such as the grid encoding techniques described herein, in conjunction with a bundle encoding technique such as that described in connection with FIG. 44, or with some other redundancy encoding technique. A grid storage service such as the grid storage service 116 described in connection with FIG. 1 may perform the example process 4500 illustrated in FIG. 45.

At step 4502, a resource of a data storage system, such as that implementing a redundancy code to store archives, determines which subset (e.g., quantity) of a plurality of volumes that may be used to recreate the original data to be stored, based on, for example, a redundancy code to be applied to the archives. For example, in accordance with the techniques described above in connection with FIG. 44, such information may be derived from predetermining the parameters of an erasure code with a specified ratio of shards that may be used to regenerate the original data from which they derive to the total number of shards generated from the application of the erasure code.

At step 4504, original data, such as original data of archives received from customers of, for example, a data storage system or a computing resource service provider as described in further detail herein, is sorted by, for example, the data storage system or associated entity. For example, the sort order may be implemented on one or more attributes of the incoming data.

At step 4506, one or more indices, such as sparse indices, are generated by, for example, the data storage system, for the original data. For example, there may be more than one index for a given volume, and such parallel indices may be of different types depending on the nature of the archives and/or original data being stored.

At step 4508, the original data is stored, for example, by the data storage system, on the subset of volumes determined in connection with step 4502, and in the order determined in step 4504. Additionally, at step 4510, the index generated in step 4506 is stored, for example, by the data storage system, on an appropriate entity. For example, the index may be stored as part of a shard on which the original data is stored, or, in some embodiments, may be stored on a separate resource from that which persists the volume.

At step 4512, the redundancy code is applied, for example, by the data storage system, to the determined subset of volumes (e.g., shards, as previously described herein), and additional shards containing data derived from the application of the redundancy code are stored on a predetermined quantity of volumes outside the subset determined in connection with step 4502. For example, the ratio of volumes (e.g., shards as previously described herein) storing the original data to the overall quantity of volumes (including those storing the derived data generated in this step 4512) may be prescribed by the recovery/encoding ratio of the redundancy code applied herein.

At step 4514, in normal operation, requested data may be retrieved, for example, by the data storage system, directly from the subset of volumes storing the original data, without necessitating retrieval and further processing (e.g., by the redundancy code) from the volumes storing the derived data generated in step 4512. However, at step 4516, if any of the volumes are determined, for example, by the data storage system, to be unavailable, a replacement shard may be generated by the data storage system by reconstructing the original data from a quorum of the remaining shards, and re-encoding using the redundancy code to generate the replacement shard. The replacement shard may be the same or may be different from the shard detected as unavailable.

Figure 46:
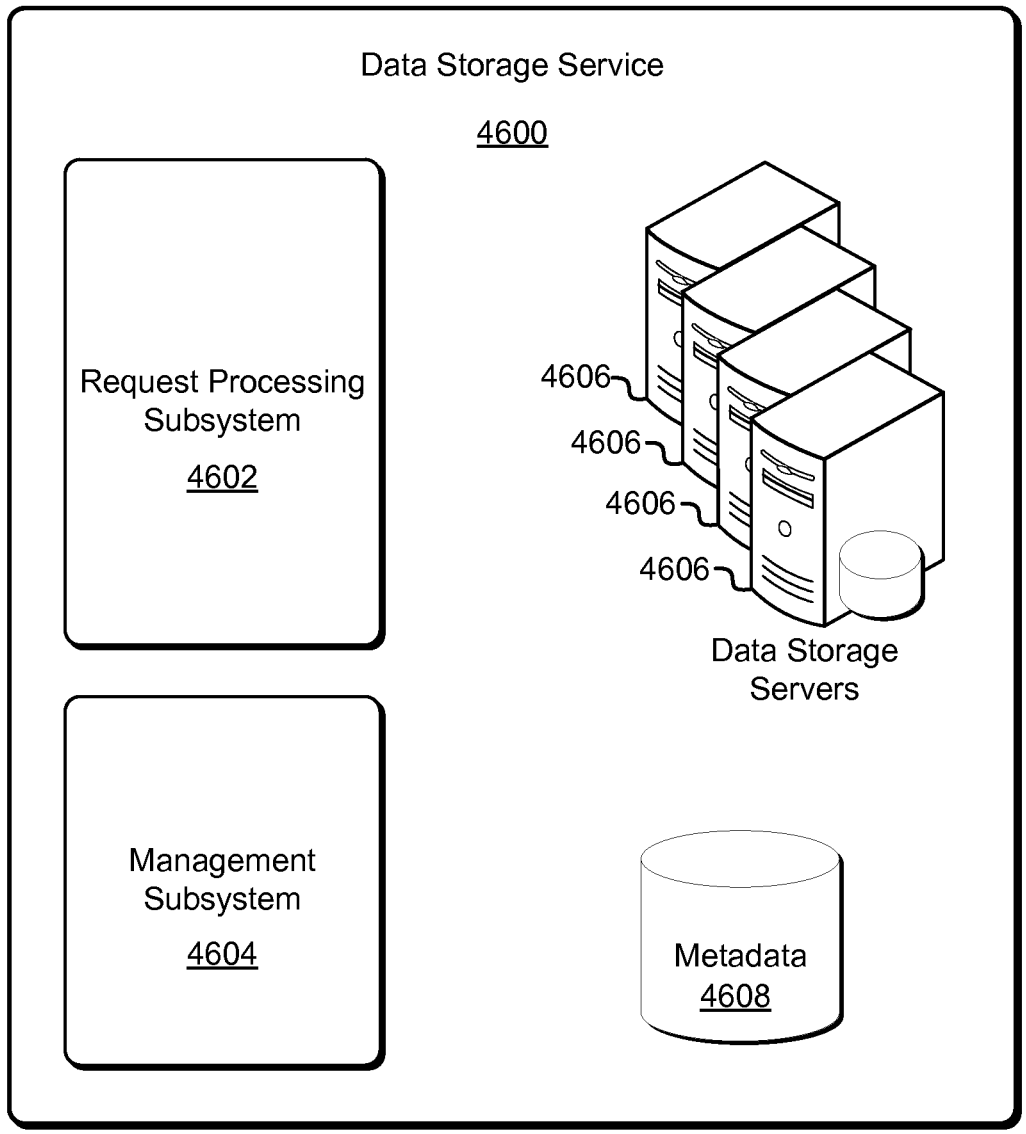
FIG. 46 illustrates an example of a data storage service in accordance with an embodiment.

FIG. 46 illustrates an example of a data storage service 4600 as described in connection with FIG. 46 and in accordance with an embodiment. The data storage service 4600 may be a service of a computing resource provider used to operate an on-demand data storage service such as described herein in connection with FIG. 46. As illustrated in FIG. 46, the data storage service 4600 includes various subsystems such as a request processing subsystem 4602 and a management subsystem 4604. The data storage service 4600 may also include a plurality of data storage servers 4606 and metadata storage 4608, which may store metadata about various data objects stored among the data storage servers 4606 as described. In an embodiment, the request processing subsystem 4602 is a collection of computing resources, such as webservers and application servers, collectively configured to process requests submitted to the data storage service 4600. The request processing subsystem 4602, for example, may include one or more webservers that provide a web service interface to enable customers of the data storage service 4600 to submit requests to be processed by the data storage service 4600. The request processing subsystem 4602 may include computers systems configured to make various determinations in connection with the processing of requests, such as whether policy allows fulfillment of a request, whether requests are authentic (e.g., electronically signed using a suitable cryptographic key) and otherwise.

Components of the request processing subsystem may interact with other components of the data storage service 4600 (e.g., through network communications). For example, some requests submitted to the request processing subsystem 4602 may involve the management of computing resources which may include data objects stored by the data storage servers 4606. The request processing subsystem 4602, for example, may receive and process requests to modify computing resources. For instance, in some examples, data objects are logically organized into logical data containers. Data objects associated with a logical data container may, for example, be said to be in the logical data container. Requests to the data processing subsystem 4602 may include requests for creating logical data containers, deleting logical data containers, providing an inventory of a logical data container, providing or updating access control policy with respect to one or more logical data containers and the like.

The requests may be processed by the management subsystem 4604 upon receipt by the request processing subsystem 4602. If applicable, various requests processed by the request processing subsystem 4602 and/or management subsystem 4604, may result in the management subsystem 4604 updating metadata associated with data objects and logical data containers stored in the metadata store 4608. Other requests that may be processed by the request processing subsystem 4602 include requests to perform operations in connection with data objects. The requests, for example, may include requests to upload data objects to the data storage service 4600, to download data objects from the data storage service 4600, to delete data objects stored by the data storage service 4600 and/or other operations that may be performed.

Requests processed by the request processing subsystem 4602 that involve operations on data objects (upload, download, delete, e.g.) may include interaction between the request processing subsystem 4602 and one or more data storage servers 4606. The data storage servers 4606 may be computer system communicatively coupled with one or more storage devices for the persistent of data objects. For example, in order to process a request to upload a data object, the request processing subsystem may transmit data to a data storage server 4606 for persistent storage. It is noted, however, that in some embodiments, client (e.g., customer) computer systems may transmit data directly to the data storage servers 4606 instead of through severs in the request processing subsystem.

In some embodiments, the request processing subsystem 4602 transmits data to multiple data storage servers 4606 for the purposes of redundantly storing the data to allow the retrieval of data in the event of failure of an individual data storage server 4606 and/or associated data storage device.

For example, in some embodiments, the request processing subsystem uses a redundancy encoding scheme such as erasure coding to deconstruct a data object into multiple parts that are stored among the data storage servers 4606. The parts may be configured such that if access to a certain number of parts is lost, the data object may nevertheless be reconstructible from the remaining parts that remain accessible.

To enable efficient transfer of data between the request processing subsystem 4602 and the data storage servers 4606 and/or generally to enable quick processing of requests, the request processing subsystem 4602 may include one or more databases that enable the location of data among the data storage servers 4606. For example, the request processing subsystem 4602 may operate a key value store that serves to associate identifiers of data objects with locations among the data storage servers 4606 for accessing data of the data objects.

Figure 47:
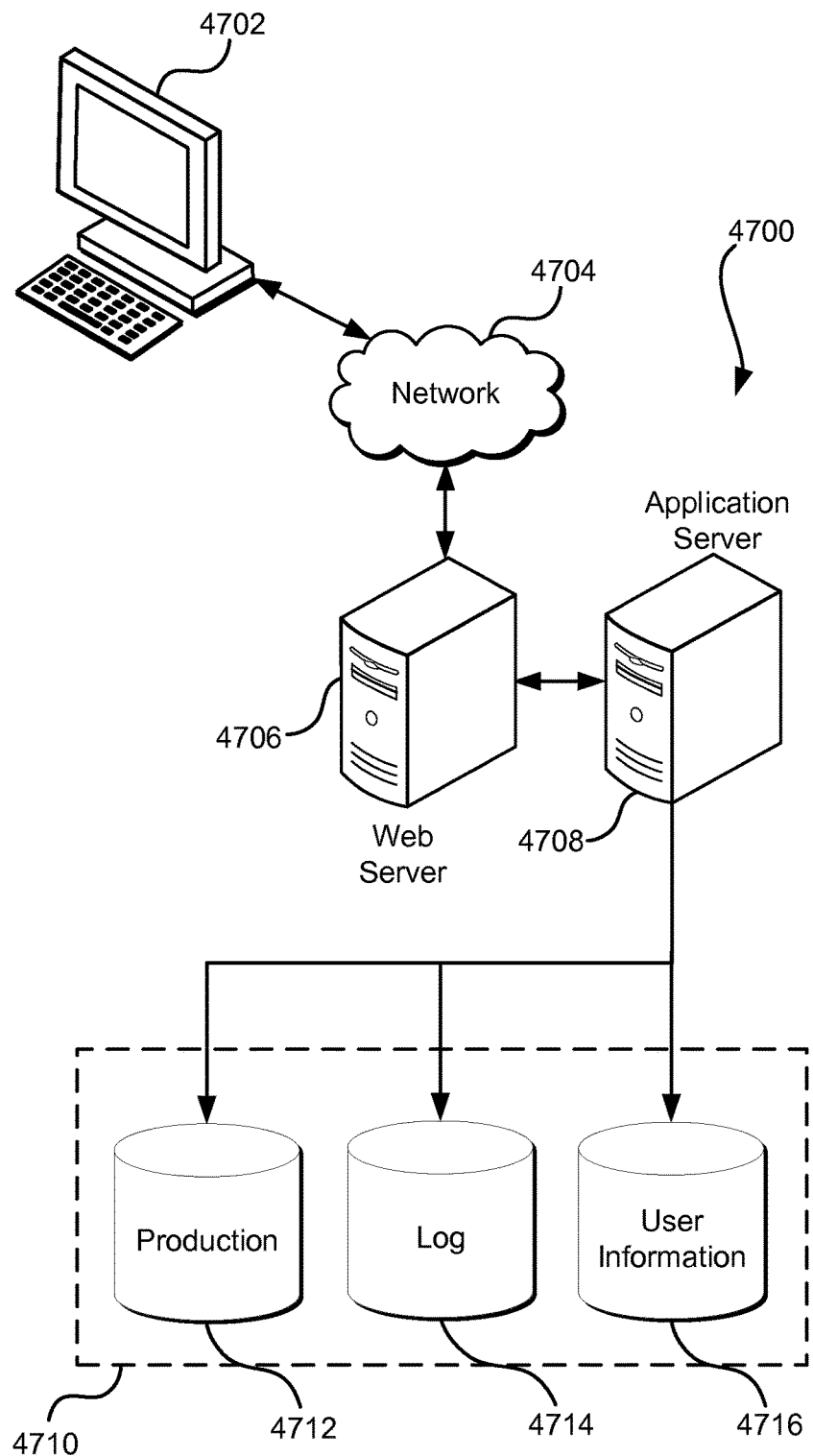
FIG. 47 illustrates an environment in which various embodiments can be implemented.

FIG. 47 illustrates aspects of an example environment 4700 for implementing aspects in accordance with various embodiments. As will be appreciated, although a web-based environment is used for purposes of explanation, different environments may be used, as appropriate, to implement various embodiments. The environment includes an electronic client device 4702, which can include any appropriate device operable to send and/or receive requests, messages, or information over an appropriate network 4704 and, in some embodiments, convey information back to a user of the device. Examples of such client devices include personal computers, cell phones, handheld messaging devices, laptop computers, tablet computers, set-top boxes, personal data assistants, embedded computer systems, electronic book readers, and the like. The network can include any appropriate network, including an intranet, the Internet, a cellular network, a local area network, a satellite network or any other such network and/or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a web server 4706 for receiving requests and serving content in response thereto, although for other networks an alternative device serving a similar purpose could be used as would be apparent to one of ordinary skill in the art.

The illustrative environment includes at least one application server 4708 and a data store 4710. It should be understood that there can be several application servers, layers or other elements, processes or components, which may be chained or otherwise configured, which can interact to perform tasks such as tasks to obtain data from an appropriate data store and/or to process the obtained data. Servers, as used herein, may be implemented in various ways, such as hardware devices or virtual computer systems. In some contexts, servers may refer to a programming module being executed on a computer system. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, but not limited to, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS") or another appropriate client-side structured language. Content transferred to a client device may be processed by the client device to provide the content in one or more forms including, but not limited to, forms that are perceptible to the user audibly, visually and/or through other senses including touch, taste, and/or smell. The handling of all requests and responses, as well as the delivery of content between the client device 4702 and the application server 4708, can be handled by the web server using PHP: Hypertext Preprocessor ("PHP"), Python, Ruby, Perl, Java, HTML, XML, or another appropriate server-side structured language in this example. It should be understood that the web and application servers are not required and are merely example components, as structured code discussed herein can be executed on any appropriate device or host machine as discussed elsewhere herein. Further, operations described herein as being performed by a single device may, unless otherwise clear from context, be performed collectively by multiple devices, which may form a distributed and/or virtual system.

The data store 4710 can include several separate data tables, databases, data documents, dynamic data storage schemes and/or other data storage mechanisms and media for storing data relating to a particular aspect of the present disclosure. For example, the data store illustrated may include mechanisms for storing production data 4712 and user information 4716, which can be used to serve content for the production side. The data store also is shown to include a mechanism for storing log data 4714, which can be used for reporting, analysis, or other such purposes. It should be understood that there can be many other aspects that may need to be stored in the data store, such as page image information and access rights information, which can be stored in any of the mechanisms listed herein as appropriate or in additional mechanisms in the data store 4710. The data store 4710 is operable, through logic associated therewith, to receive instructions from the application server 4708 and obtain, update or otherwise process data in response thereto. The application server 4708 may provide static, dynamic, or a combination of static and dynamic data in response to the received instructions. Dynamic data, such as data used in web logs (blogs), shopping applications, news services and other such applications may be generated by server-side structured languages as described herein or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 4702. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 47. Thus, the depiction of the system 4700 in FIG. 47 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network, and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method, comprising:
   generating a grid of shards, the grid of shards forming a partitioned data set, the grid of shards being indexed by row and column, the grid of shards comprising a set of data shards, a set of derived shards, and a set of shards containing a predetermined data value, the set of derived shards comprising a set of horizontally-derived shards and a set of vertically-derived shards, wherein:
   the partitioned data set includes one or more shards containing one or more portions of the data set and one or more shards generated by applying an erasure code to the one or more shards containing the one or more portions of the data set; and
   each shard of the grid of shards has a corresponding row and corresponding column and is configured such that:
   the shard is reproducible from other shards associated with the row and reproducible from other shards associated with the column;
   if the shard is a horizontally-derived shard of the set of horizontally-derived shards, the shard is derived based at least in part on a set of data shards associated with the row; and if the shard is a vertically-derived shard of the set of vertically-derived shards, the shard is derived based at least in part on a set of shards associated with the column; and storing a data object using the grid of shards by at least:

storing a copy of the data object in a storage device corresponding to a first shard of the grid of shards to produce an updated first shard, the updated first shard having a first corresponding row and a first corresponding column;

updating a second shard of the grid of shards based at least in part on a first set of shards of the grid of shards, the first set of shards including the updated first shard and one or more shards of the set of shards containing the predetermined data value, each shard of the first set of shards having a same corresponding row as the second shard;

updating a third shard of the grid of shards based at least in part on a second set of shards of the grid of shards, the second set of shards including the updated first shard and one or more shards of the set of shards containing the predetermined data value, each shard of the second set of shards having a same corresponding column as the third shard; and updating a fourth shard of the grid of shards based at least in part on a third set of shards of the grid of shards, the third set of shards including the updated second shard and one or more shards of the set of shards containing the predetermined data value, each shard of the third set of shards having the same corresponding column as the fourth shard.

2. The computer-implemented method of claim 1, wherein each shard of the set of shards containing the predetermined data value is a virtual shard specifying the predetermined data value without storing the predetermined data value in a data storage device.

3. The computer-implemented method of claim 1, wherein:

each data shard of the grid of shards is pre-initialized to the predetermined data value;

each horizontally-derived shard of the grid of shards is pre-initialized to a first derived value, the first derived value derived based at least in part on applying a first linear redundancy code to one or more shards of the grid of shards;

each horizontally-derived shard is a virtual shard specifying the first derived value without storing the first derived value in a data storage device;

each vertically-derived shard of the grid of shards is pre-initialized to a second derived value, the second derived value derived based at least in part on applying a second linear redundancy code to one or more shards of the grid of shards; and each vertically-derived shard is a virtual shard specifying the first derived value without storing the first derived value in a data storage device.

4. The computer-implemented method of claim 1, wherein the predetermined data value is zero.

5. The computer-implemented method of claim 1, wherein each shard of the grid of shards has a corresponding set of grid metadata, the set of grid metadata at least specifying the predetermined data value.

6. A system, comprising at least one computing device that implements one or more services, wherein the one or more services:

generate a grid of shards, the grid of shards at least indexed by a first index, the grid of shards including a plurality of virtual shards, each virtual shard of the plurality of virtual shards having at least a corresponding first index, each virtual shard of the plurality of virtual shards configured to represent a shard of the grid of shards without storage of shard data in a data storage device; and store a data object in the grid of shards by at least:

storing a copy of the data object in a storage device corresponding to a first shard of the grid of shards to produce an updated first shard, the updated first shard having at least a first corresponding first index; and updating a second shard of the grid of shards based at least in part on a first set of shards of the grid of shards, the first set of shards including the updated first shard and one or more first virtual shards, each shard of the first set of shards having a same corresponding first index as the second shard.

7. The system of claim 6, wherein the one or more services that update the first shard:

select the first shard from the plurality of virtual shards;

convert the first shard to a non-virtual shard; and store at least a portion of the data object in the non-virtual shard.

8. The system of claim 6, wherein the one or more services that update the second shard:

select the second shard from the plurality of virtual shards;

convert the second shard to a non-virtual shard; and update the non-virtual shard based at least in part on applying a redundancy code to a subset of the first set of shards.

9. The system of claim 6, wherein the grid of shards includes a second set of shards that is a bundle-encoded set of shards, the second set of shards including the first set of shards and the second shard, the bundle-encoded set of shards based at least in part on a first redundancy code.

10. The system of claim 6, wherein:

the grid of shards is further indexed by a second index;

each shard of the plurality of virtual shards has a corresponding second index; and the first shard of the grid of shards has a first corresponding second index.

11. The system of claim 10, wherein the one or more services:

update a third shard of the grid of shards based at least in part on a second set of shards of the grid of shards, the second set of shards including the updated first shard and one or more second virtual shards, each shard of the second set of shards having a same corresponding second index as the third shard; and update a fourth shard of the grid of shards based at least in part on a third set of shards of the grid of shards, the third set of shards including the second shard and one or more third virtual shards, each shard of the third set of shards having the same corresponding second index as the fourth shard.

12. The system of claim 11, wherein the one or more services that update the third shard:

select the third shard from the plurality of virtual shards;

convert the third shard to a non-virtual shard; and update the non-virtual shard based at least in part on applying a redundancy code to a subset of the second set of shards.

13. The system of claim 11, wherein the one or more services that update the fourth shard:
- select the fourth shard from the plurality of virtual shards;
- convert the fourth shard to a non-virtual shard; and
- update the non-virtual shard based at least in part on applying a redundancy code to a subset of the third set of shards.

14. A non-transitory computer-readable storage medium having stored thereon executable instructions that, as a result of execution by one or more processors of a computer system, cause the computer system to at least:
- generate a grid of shards, each shard of the grid of shards indexed by a corresponding set of indices, each set of indices having a predetermined number of indices, the set of indices at least including a first index, the grid of shards including a plurality of virtual shards, each virtual shard of the plurality of virtual shards configured to represent a shard of the grid of shards without storage of shard data on a storage device; and
- store a data object in the grid of shards by at least:
  - storing a copy of the data object in a storage device corresponding to a first shard of the grid of shards to produce an updated first shard, the updated first shard having at least a first corresponding first index; and
  - updating a second shard of the grid of shards based at least in part on a first set of shards of the grid of shards, the first set of shards including the updated first shard and one or more virtual shards, each shard of the first set of shards having a same corresponding first index as the second shard.

15. The non-transitory computer-readable storage medium of claim 14, wherein the instructions further comprise instructions that, as a result of execution by the one or more processors, cause the computer system to update a set of shards of the grid of shards, the set of shards selected based at least in part on the corresponding set of indices of the updated first shard and the corresponding set of indices of the second shard.

16. The non-transitory computer-readable storage medium of claim 14, wherein each shard of the grid of shards is reproducible from other shards associated with a selected index of the set of indices using a selected redundancy code of a set of redundancy codes.

17. The non-transitory computer-readable storage medium of claim 16, wherein each shard of the grid of shards has a corresponding set of grid metadata, the set of grid metadata at least including a set of constants associated with the set of redundancy codes and usable with the set of redundancy codes to reproduce the shard.

18. The non-transitory computer-readable storage medium of claim 17, wherein the set of grid metadata includes a second set of constants associated with a cyclic redundancy check usable to validate the grid of shards.

19. The non-transitory computer-readable storage medium of claim 14, wherein each virtual shard of the plurality of virtual shards is a null shard.

20. The non-transitory computer-readable storage medium of claim 14, wherein each virtual shard of the plurality of virtual shards is a virtual data shard specifying a predetermined data value that can be determined without storing the predetermined data value in a data storage device.

* * * * *